(12) United States Patent
Ling et al.

(10) Patent No.: US 12,120,884 B2
(45) Date of Patent: Oct. 15, 2024

(54) SEMICONDUCTOR DEVICE AND METHOD OF MANUFACTURING THE SAME

(71) Applicant: Taiwan Semiconductor Manufacturing Company, Ltd., Hsinchu (TW)

(72) Inventors: Chia-Yu Ling, Hsinchu (TW); Katherine H. Chiang, New Taipei (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/472,187

(22) Filed: Sep. 21, 2023

(65) Prior Publication Data

US 2024/0015979 A1    Jan. 11, 2024

Related U.S. Application Data

(62) Division of application No. 17/460,294, filed on Aug. 29, 2021, now Pat. No. 11,818,894.

(51) Int. Cl.
*H01L 29/66* (2006.01)
*H01L 29/78* (2006.01)
*H10B 51/10* (2023.01)
*H10B 51/20* (2023.01)

(52) U.S. Cl.
CPC ......... *H10B 51/20* (2023.02); *H01L 29/6684* (2013.01); *H01L 29/78391* (2014.09); *H10B 51/10* (2023.02)

(58) Field of Classification Search
CPC ..... H10B 51/20; H10B 51/10; H01L 29/6684; H01L 29/78391; H01L 29/40111
USPC .............................................. 257/295; 438/3
See application file for complete search history.

(56) References Cited

U.S. PATENT DOCUMENTS

| | | | | |
|---|---|---|---|---|
| 10,868,042 | B1* | 12/2020 | Zhang | H01L 29/40111 |
| 2004/0058493 | A1* | 3/2004 | Demange | H10B 69/00 |
| | | | | 257/E21.664 |
| 2008/0265235 | A1* | 10/2008 | Kamigaichi | H10B 63/30 |
| | | | | 257/E47.001 |
| 2010/0181610 | A1* | 7/2010 | Kim | H10B 43/27 |
| | | | | 257/314 |
| 2016/0322368 | A1* | 11/2016 | Sun | H10B 51/20 |
| 2017/0154894 | A1* | 6/2017 | Yoshimizu | H10B 43/27 |
| 2017/0301684 | A1* | 10/2017 | Park | H10B 43/27 |
| 2019/0295626 | A1* | 9/2019 | Ikeda | G11C 11/404 |
| 2020/0026990 | A1* | 1/2020 | Lue | H01L 27/0207 |
| 2020/0105773 | A1* | 4/2020 | Morris | G11C 5/025 |
| 2020/0343252 | A1* | 10/2020 | Lai | H10B 43/35 |
| 2021/0036019 | A1* | 2/2021 | Sharangpani | H10B 51/20 |
| 2022/0037362 | A1* | 2/2022 | Lin | H10B 51/20 |

\* cited by examiner

*Primary Examiner* — Sheikh Maruf
(74) *Attorney, Agent, or Firm* — JCIPRNET

(57) ABSTRACT

A method of manufacturing a memory cell includes the following steps. A channel material is formed to contact a source line and a bit line. A ferroelectric (FE) material is formed to contact the channel material. A word line is formed to contact the FE material. The FE material is disposed between the channel material and the word line. The word line includes a bulk layer. The bulk layer includes a first metal layer and a second metal layer. The second metal layer is sandwiched between the first metal layer and the FE material.

20 Claims, 58 Drawing Sheets

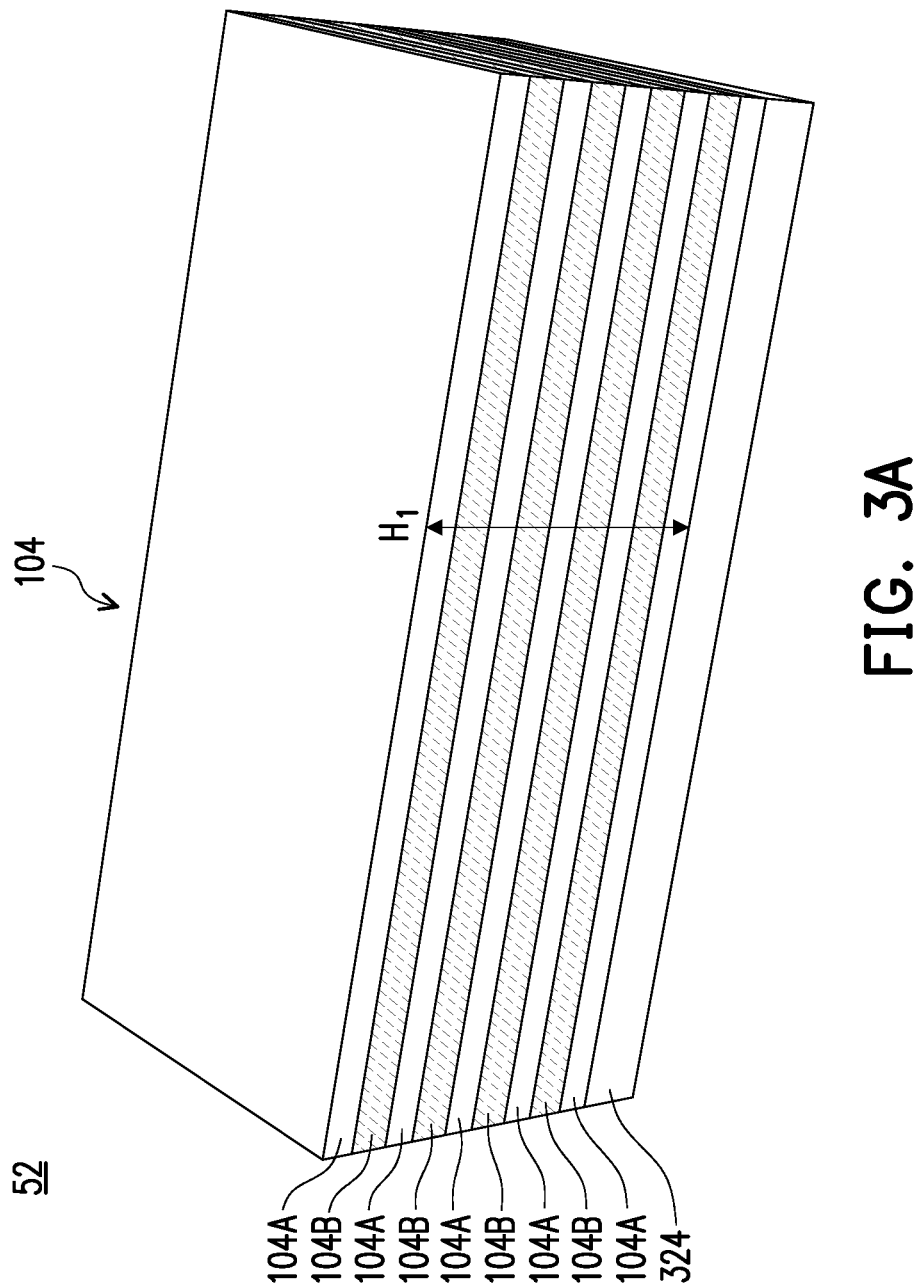

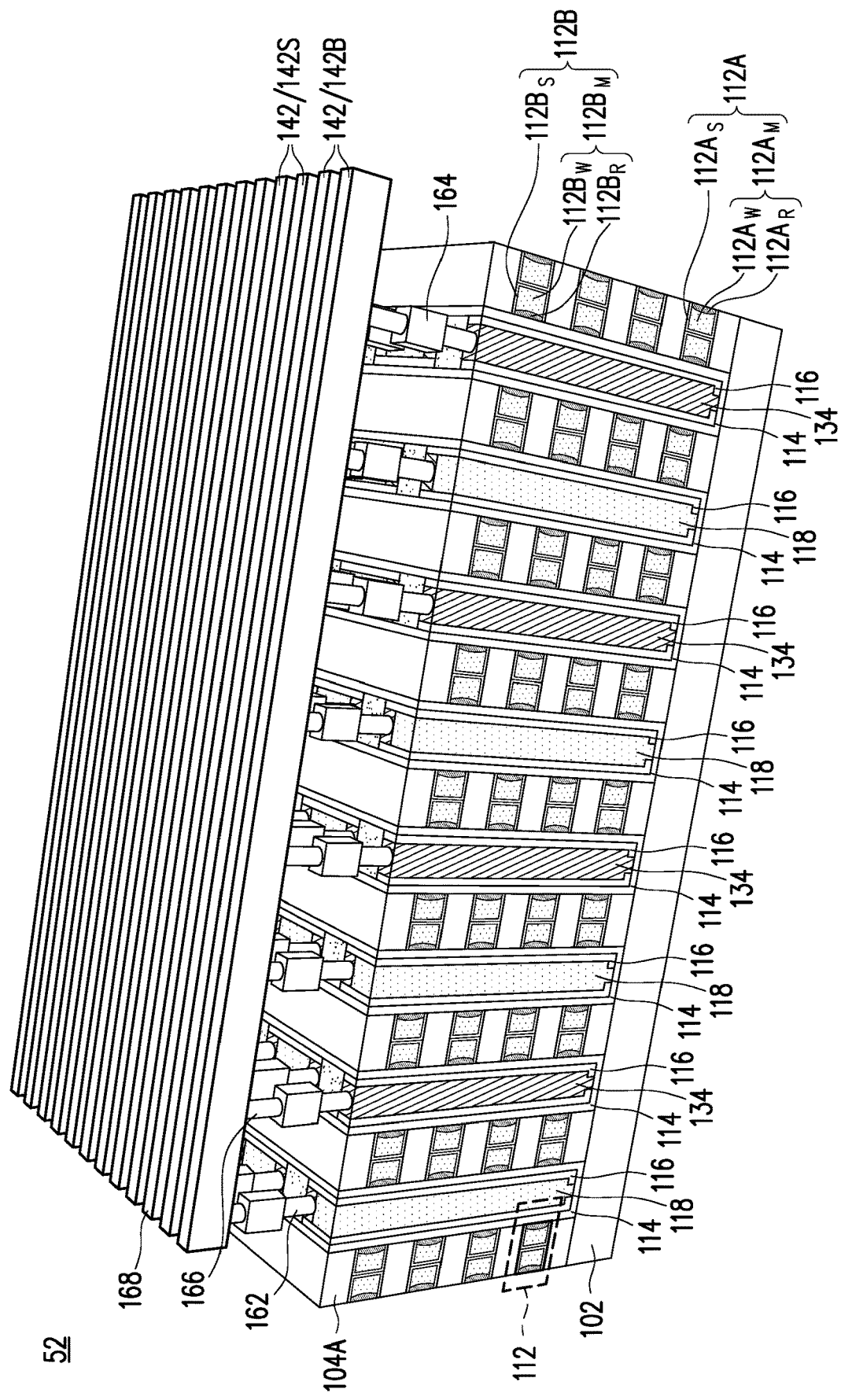

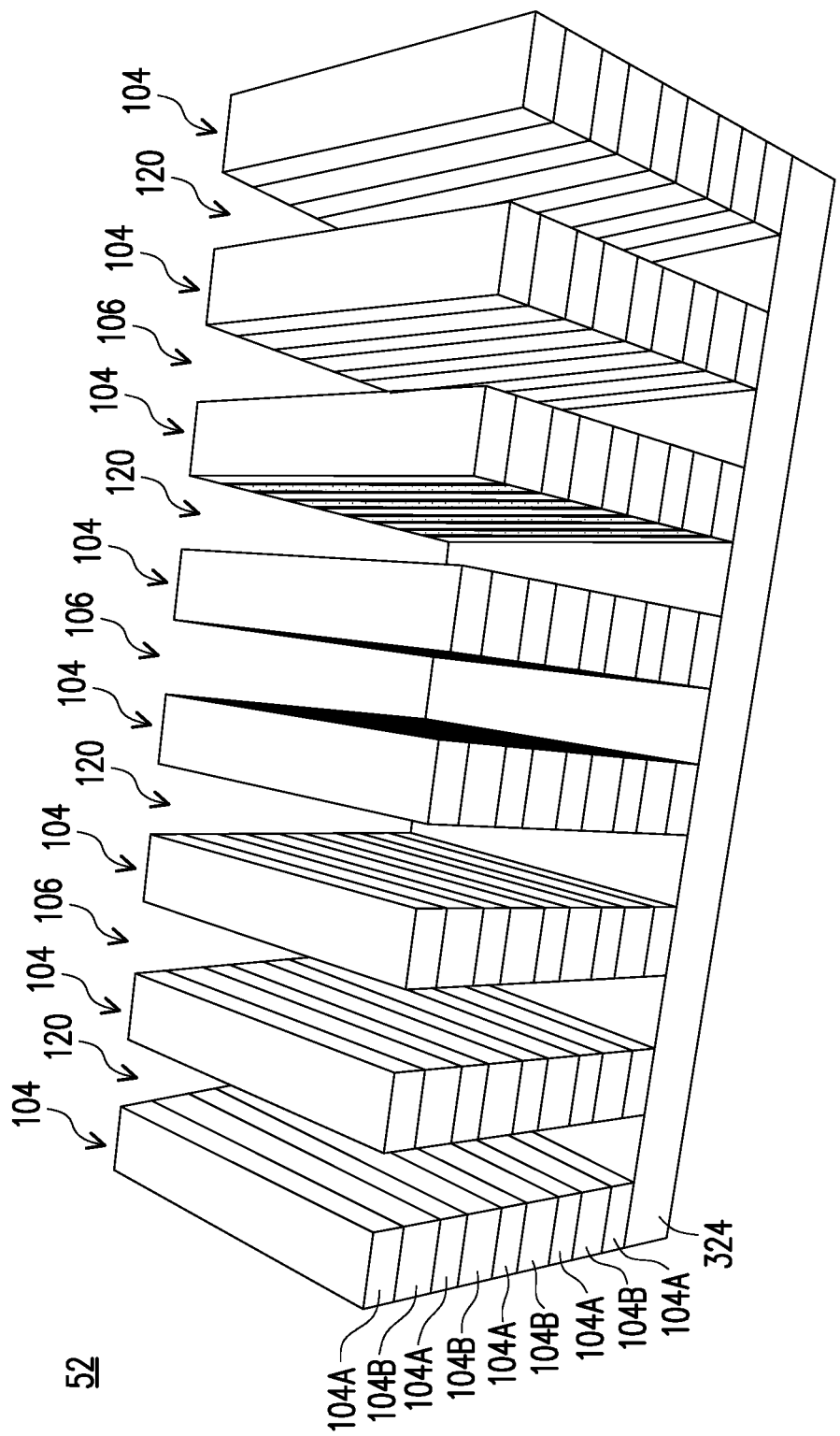

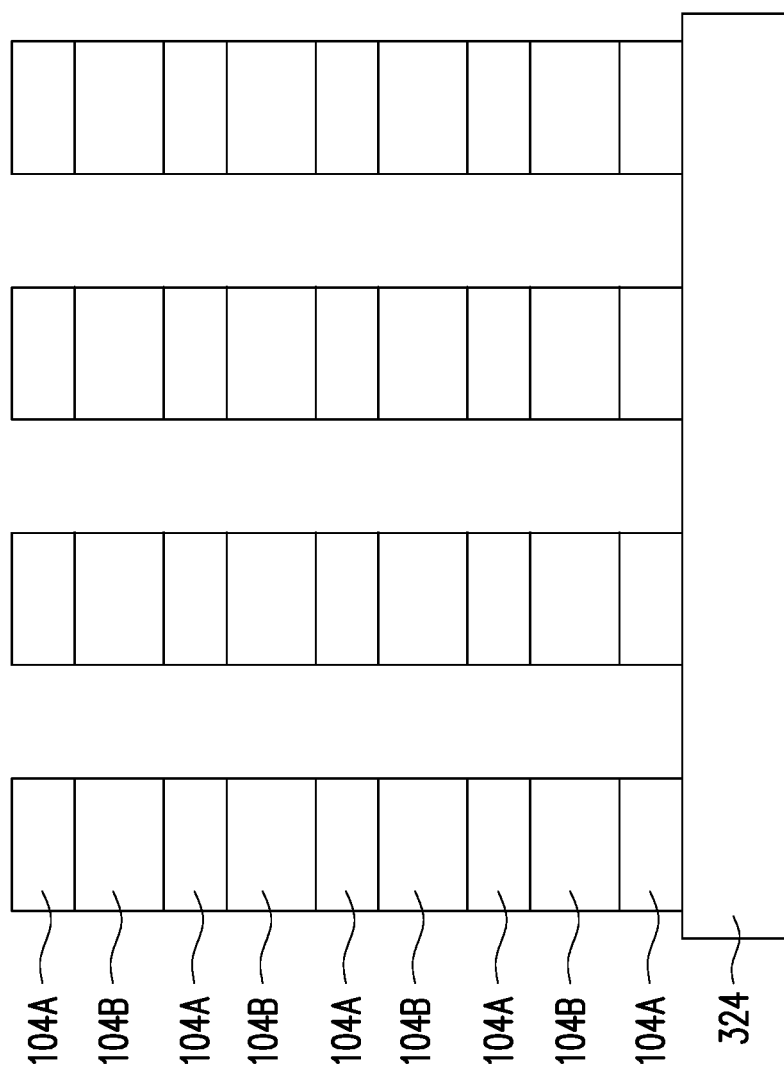

SEMICONDUCTOR DEVICE AND METHOD OF MANUFACTURING THE SAME

CROSS-REFERENCE TO RELATED APPLICATION

This application is a divisional application of and claims the priority benefit of a prior application Ser. No. 17/460,294, filed on Aug. 29, 2021. The entirety of the above-mentioned patent application is hereby incorporated by reference herein and made a part of this specification.

BACKGROUND

Semiconductor memories are used in integrated circuits for electronic applications, including radios, televisions, cell phones, and personal computing devices, as examples. Semiconductor memories include two major categories. One is volatile memories; the other is non-volatile memories. Volatile memories include random access memory (RAM), which may be further divided into two sub-categories, static random access memory (SRAM) and dynamic random access memory (DRAM). Both SRAM and DRAM are volatile because they will lose the information they store when they are not powered.

On the other hand, non-volatile memories can keep data stored on them. One type of non-volatile semiconductor memory is ferroelectric random access memory (FeRAM, or FRAM). Advantages of FeRAM include its fast write/read speed and small size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 21A through 25B are various views of intermediate stages in the manufacturing of a memory array, in accordance with some other embodiments.

DETAILED DESCRIPTION

Figure 1A:
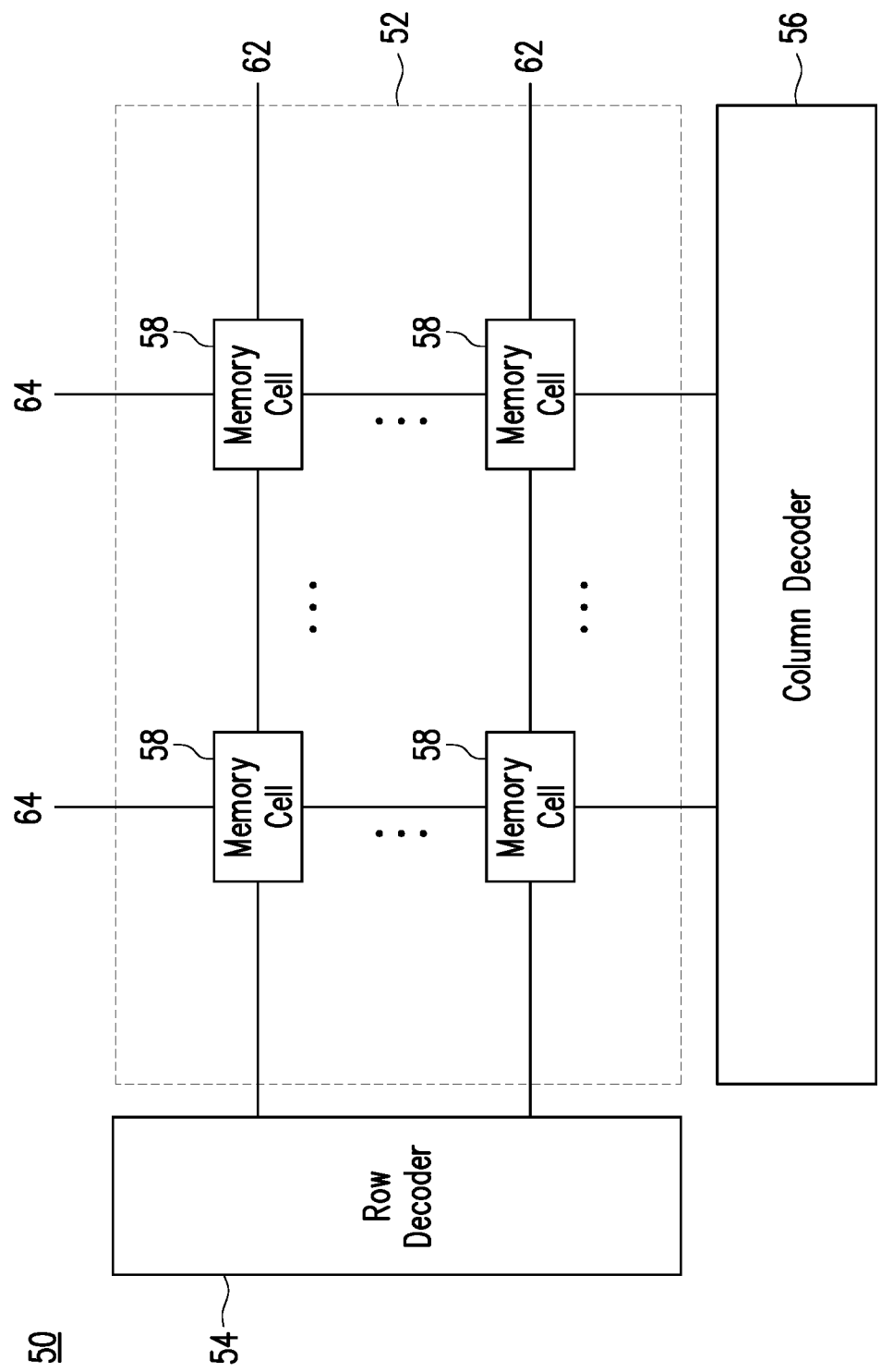
FIG. 1A is a block diagram of a random-access memory, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a block diagram of a random-access memory 50, in accordance with some embodiments. The random-access memory 50 includes a memory array 52, a row decoder 54, and a column decoder 56. The memory array 52, the row decoder 54, and the column decoder 56 may each be part of a same semiconductor die, or may be parts of different semiconductor dies. For example, the memory array 52 may be part of a first semiconductor die, while the row decoder 54 and the column decoder 56 may be parts of a second semiconductor die.

The memory array 52 includes memory cells 58, word lines 62, and bit lines 64. The memory cells 58 are arranged in rows and columns. The word lines 62 and the bit lines 64 are electrically connected to the memory cells 58. The word lines 62 are conductive lines that extend along the rows of the memory cells 58. The bit lines 64 are conductive lines that extend along the columns of the memory cells 58.

The row decoder 54 may be, e.g., a static CMOS decoder, a pseudo-NMOS decoder, or the like. During operation, the row decoder 54 selects desired memory cells 58 in a row of the memory array 52 by activating the word line 62 for the row. The column decoder 56 may be, e.g., a static CMOS decoder, a pseudo-NMOS decoder, or the like, and may include writer drivers, sense amplifiers, combinations thereof, or the like. During operation, the column decoder 56 selects bit lines 64 for the desired memory cells 58 from columns of the memory array 52 in the selected row, and reads data from or writes data to the selected memory cells 58 with the bit lines 64.

Figure 1B:
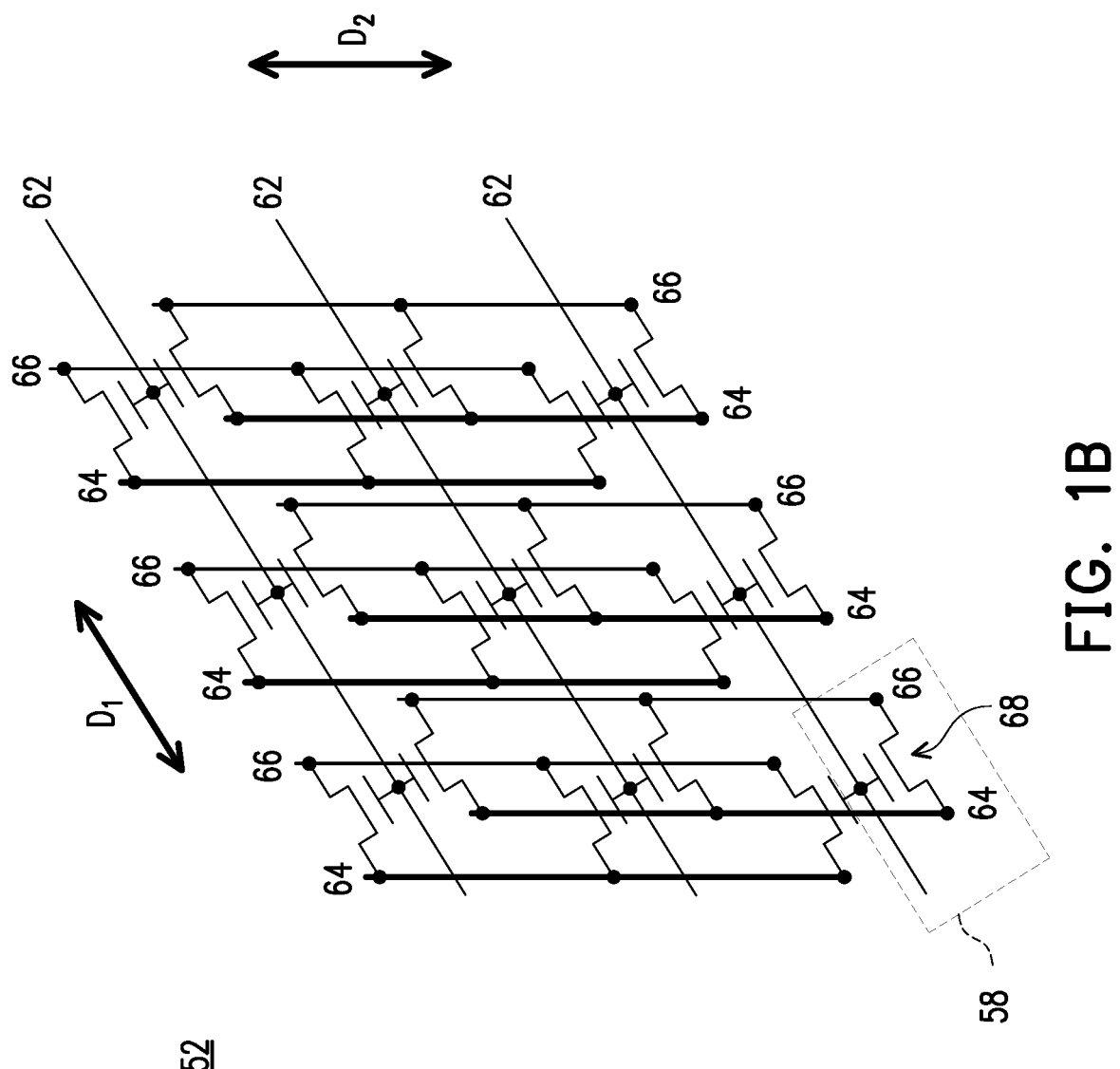
FIGS. 1B through 1E are various views of a memory array, in accordance with some embodiments.
Figure 1C:
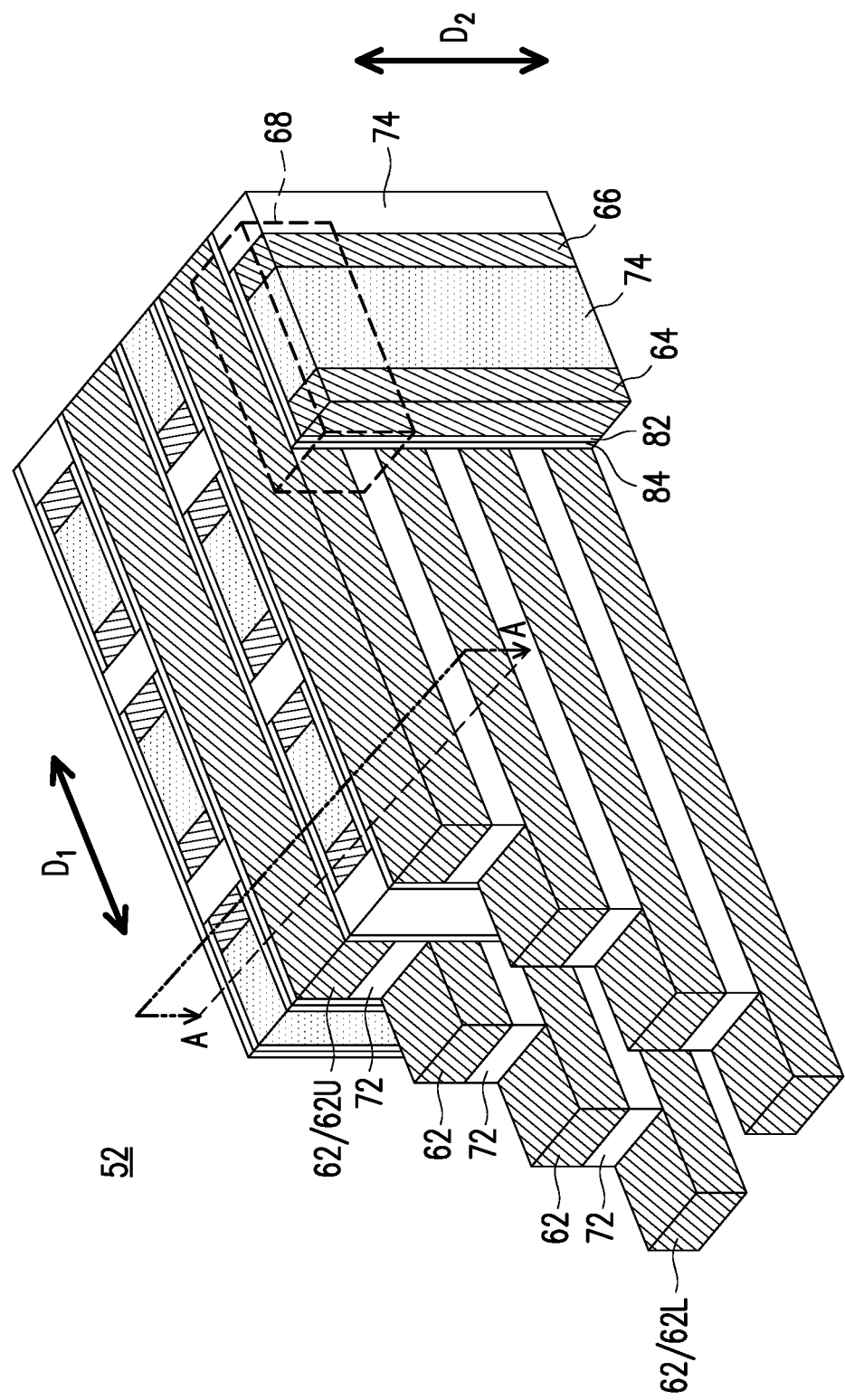
Figure 1E:
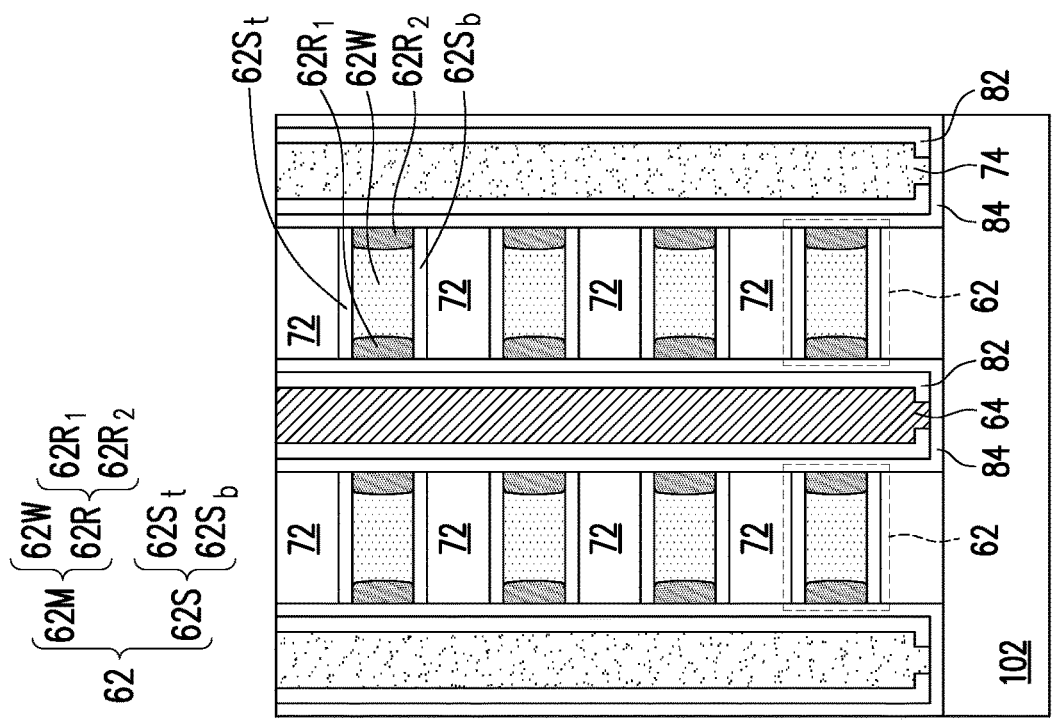
Figure 1D:
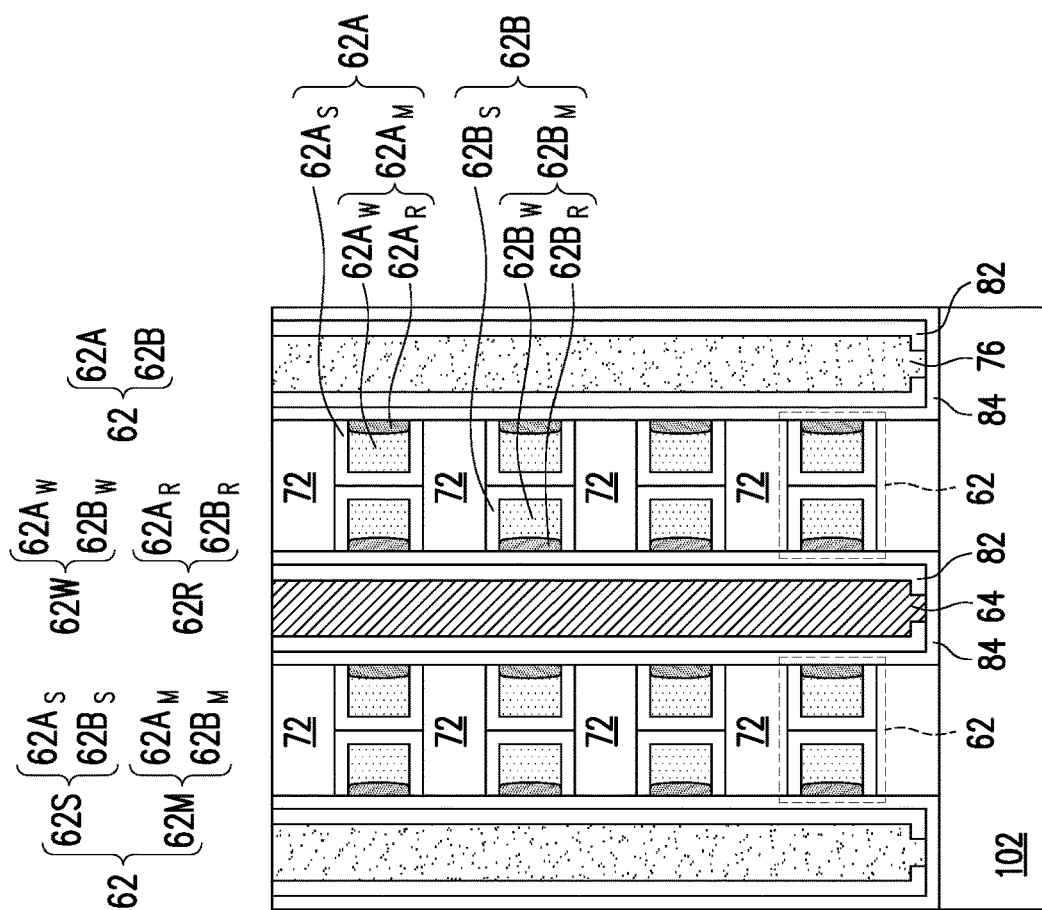

FIGS. 1B to 1E are various views of a memory array 52, in accordance with some embodiments. FIG. 1B is a circuit diagram of the memory array 52. FIG. 1C is a three-dimensional view of a portion of the memory array 52. FIGS. 1D and 1E are cross-sectionals shown along reference cross-section A-A in FIG. 1C, in accordance with some embodiments.

The memory array 52 is a flash memory array, such as a NOR flash memory array; a high speed memory array such as a DRAM or an SRAM; a non-volatile memory such as RRAM or MRAM, or the like. Each of the memory cells 58 is a flash memory cell that includes a thin film transistor (TFT) 68. The gate of each TFT 68 is electrically connected to a respective word line 62, a first source/drain region of each TFT 68 is electrically connected to a respective bit line 64, and a second source/drain region of each TFT 68 is electrically connected to a respective source line 66 (which are electrically connected to ground). The memory cells 58 in a same row of the memory array 52 share a common word line 62 while the memory cells in a same column of the memory array 52 share a common bit line 64 and a common source line 66.

The memory array 52 includes multiple arranged conductive lines (e.g., the word lines 62) with dielectric layers 72 located between adjacent ones of the word lines 62. The word lines 62 extend in a first direction $D_1$ that is parallel to a major surface of an underlying substrate (not shown in FIG. 1C, but discussed in greater detail below with respect to FIGS. 1C, 1D, and 2 through 16D). The word lines 62 may have a staircase arrangement such that lower word lines 62 are longer than and extend laterally past endpoints of upper word lines 62. For example, in FIG. 1C, multiple, stacked layers of word lines 62 are illustrated with topmost word lines 62U being the shortest lines and bottommost word lines 62L being the longest lines. Respective lengths of the word lines 62 increases in a direction extending towards the underlying substrate. In this manner, a portion of each word line 62 may be accessible from above the memory array 52, so that conductive contacts may be formed to an exposed portion of each word line 62.

The memory array 52 further includes multiple arranged conductive lines such as the bit lines 64 and the source lines 66. The bit lines 64 and the source lines 66 extend in a second direction $D_2$ that is perpendicular to the first direction $D_1$ and the major surface of the underlying substrate. A dielectric layer 74 is disposed between and isolates adjacent ones of the bit lines 64 and the source lines 66. The boundaries of each memory cell 58 are defined by pairs of the bit lines 64 and the source lines 66 along with an intersecting word line 62. A dielectric plug 76 is disposed between and isolates adjacent pairs of the bit lines 64 and the source lines 66. Although FIGS. 1B and 1C illustrate a particular placement of the bit lines 64 relative to the source lines 66, it should be appreciated that the placement of the bit lines 64 and the source lines 66 may be flipped in other embodiments.

The memory array 52 further includes ferroelectric strips 84 and channel strips 82. The ferroelectric strips 84 and the channel strips 82 may be referred to as ferroelectric layers 84 and channel layers 82. The ferroelectric strips 84 are in contact with the word lines 62. The channel strips 82 are disposed between the ferroelectric strips 84 and the dielectric layer 74.

The channel strips 82 provide channel regions for the TFTs 68 of the memory cells 58. For example, when an appropriate voltage (e.g., higher than a respective threshold voltage ($V_{th}$) of a corresponding TFT 68) is applied through a corresponding word line 62, a region of a semiconductor strip 82 that intersects the word line 62 may allow current to flow from the bit line 64 to the source lines 66 (e.g., in the direction $D_1$).

The ferroelectric strips 84 are data-storing layers that may be polarized in one of two different directions by applying an appropriate voltage differential across the ferroelectric strips 84. Depending on a polarization direction of a particular region of a ferroelectric strip 84, a threshold voltage of a corresponding TFT 68 varies and a digital value (e.g., 0 or 1) may be stored. For example, when a region of ferroelectric strip 84 has a first electrical polarization direction, the corresponding TFT 68 may have a relatively low threshold voltage, and when the region of the ferroelectric strip 84 has a second electrical polarization direction, the corresponding TFT 68 may have a relatively high threshold voltage. The difference between the two threshold voltages may be referred to as the threshold voltage shift. A larger threshold voltage shift makes it easier (e.g., less error prone) to read the digital value stored in the corresponding memory cell 58. Accordingly, the memory array 52 may also be referred to as a ferroelectric random access memory (FE-RAM) array.

To perform a write operation on a particular memory cell 58, a write voltage is applied across a region of the ferroelectric strip 84 corresponding to the memory cell 58. The write voltage may be applied, for example, by applying appropriate voltages to the word line 62, the bit line 64, and the source line 66 corresponding to the memory cell 58. By applying the write voltage across the region of the ferroelectric strip 84, a polarization direction of the region of the ferroelectric strip 84 may be changed. As a result, the corresponding threshold voltage of the corresponding TFT 68 may be switched from a low threshold voltage to a high threshold voltage (or vice versa), so that a digital value may be stored in the memory cell 58. Because the word lines 62 and the bit lines 64 intersect in the memory array 52, individual memory cells 58 may be selected and written to.

To perform a read operation on a particular memory cell 58, a read voltage (a voltage between the low and high threshold voltages) is applied to the word line 62 corresponding to the memory cell 58. Depending on the polarization direction of the corresponding region of the ferroelectric strip 84, the TFT 68 of the memory cell 58 may or may not be turned on. As a result, the bit line 64 may or may not be discharged (e.g., to ground) through the source line 66, so that the digital value stored in the memory cell 58 may be determined. Because the word lines 62 and the bit lines 64 intersect in the memory array 52, individual memory cells 58 may be selected and read from.

In FIGS. 1C to 1E, the word lines 62 may each comprise one or more layers, such as glue layers, seed layers, barrier layers, diffusion layers, and fill layers, and the like. In some embodiments, the word lines 62 each include a glue layer (or seed layer) 62S and a bulk layer 62M, although in other embodiments the glue layer may be omitted. The glue layer 62S may be titanium nitride, tantalum nitride, titanium, tantalum, molybdenum, ruthenium, rhodium, hafnium, iridium, niobium, rhenium, tungsten, combinations of these. The glue layer 62S is located between the bulk layer 62M and the dielectric layer 72.

The bulk layer 62M includes a first metal layer 62W and a second metal layer 62R. The first metal layer 62W has the resistance value lower than the resistance value of the second metal layer 62R. The second metal layer 62R has the absolute value of the Gibbs energy of metal oxide formation lower than the absolute value of the Gibbs energy of metal oxide formation of the first metal layer 62W. The first metal layer 62W may be formed of a metal, such as tungsten, cobalt, aluminum, nickel, copper, silver, gold, molybdenum, molybdenum nitride, alloys thereof, or the like, and the second metal layer 62R may be formed of a metal, such as ruthenium.

Referring to FIG. 1D, in some embodiments, the word lines 62 includes first conductive parts 62A and second conductive parts 62B in some embodiments. Adjacent pairs of the first conductive parts 62A and the second conductive parts 62B are in physical contact with one another and are electrically coupled to one another. Thus, each pair of the first conductive part 62A and the second conductive part 62B functions as a single word line 62.

The first conductive parts 62A may each comprise one or more layers, such as glue layers, glue layers, barrier layers, diffusion layers, and fill layers, and the like. In some embodiments, the first conductive parts 62A each include a glue layer $62A_S$ (or seed layer) and a bulk layer $62A_M$. Each glue layer $62A_S$ extends along three sides (e.g., the top surface, a sidewall, and the bottom surface) of a corresponding bulk layer $62A_M$. The material of the glue layer $62A_S$ is one that has good adhesion to the material of the dielectric layers 72 and the bulk layers $62A_M$.

The bulk layers $62A_M$ includes a first metal layer $62A_W$ and a second metal layer $62A_R$. The first metal layer $62A_W$ may be formed of a metal, such as tungsten, cobalt, aluminum, nickel, copper, silver, gold, molybdenum, molybdenum nitride, alloys thereof, or the like. The second metal layer $62A_R$ may be formed of a metal, such as ruthenium.

In embodiments where the dielectric layers 72 are formed of an oxide such as silicon oxide, the glue layer $62A_S$ may be formed of titanium nitride, the first metal layer $62A_W$ of the bulk layers $62A_M$ may be formed of tungsten, and the second metal layer $62A_R$ may be formed of ruthenium. The glue layer $62A_S$, and the first metal layer $62A_W$ and the second metal layer $62A_R$ of the bulk layers $62A_M$ may each be formed by an acceptable deposition process such as chemical vapor deposition (CVD), atomic layer deposition (ALD), or the like.

Three sides (e.g., the top surface, a sidewall, and the bottom surface) of the first metal layer $62A_W$ are surrounded by a corresponding glue layer $62A_S$, to improve an adhesion between the he first metal layer $62A_W$ and the dielectric layers 72. The fourth side (e.g., the other sidewall) of the first metal layer $62A_W$ is covered by the second metal layer $62A_R$. The first metal layer $62A_W$ is separated from a corresponding ferroelectric strip 84 by the second metal layer $62A_R$. The first metals $62A_W$ may not be oxidized during the process of depositing the ferroelectric strips 84. Further, the absolute value of the Gibbs energy of metal oxide formation of the second metal layer $62A_R$ is low. The second metal layers $62A_R$ are not easily oxidized during the process of depositing the ferroelectric strips 84. Therefore, no dielectric interface layer is formed between the ferroelectric strips 84 and the second metal layers $62A_R$.

The second conductive parts 62B may be formed of materials that are selected from the same group of candidate materials of the first conductive parts 62A, and may be formed using methods that are selected from the same group of candidate methods for forming the materials of the first conductive parts 62A. The first conductive parts 62A and the second conductive parts 62B may be formed from the same material, or may include different materials. In some embodiments, the second conductive parts 62B each include a glue layer $62B_S$ and a bulk layer $62B_M$, although in other embodiments the glue layer $62B_S$ may be omitted. The glue layer $62B_S$ and the bulk layers $62B_M$ of the second conductive parts 62B may have similar thicknesses as the glue layer $62A_S$ and the bulk layers $62A_M$ of the first conductive parts 62A, respectively. In some embodiments, the glue layer $62A_S$ and the glue layer $62B_S$ are formed of similar materials, in which case the glue layer $62A_S$ and the glue layer $62B_S$ may merge during formation such that no discernable interfaces exist between then. In another embodiment (discussed further below), the glue layer $62A_S$ and the glue layer $62B_S$ are formed of different materials, in which case the glue layer $62A_S$ and the glue layer $62B_S$ may not merge during formation such that discernable interfaces exist between then.

The bulk layer $62B_M$ includes a first metal layer $62B_W$ and a second metal layer $62B_R$. In some embodiments, the first metal layer $62B_W$ and the first metal layer $62A_W$ are formed of similar materials, and the second metal layer $62B_R$ and the second metal layer $62A_R$ are formed of similar materials, but not limited thereto.

Three sides (e.g., the top surface, a sidewall, and the bottom surface) of the first metal layer $62B_W$ are surrounded by a corresponding glue layer $62B_S$ to improve an adhesion between the first metal layer $62B_W$ and the dielectric layers 72. The fourth side (e.g., the other sidewall) of the first metal layer $62B_W$ is covered by the second metal layer $62B_R$. The first metal layer $62B_W$ is separated from a corresponding ferroelectric strip 84 by the second metal layer $62B_R$. The first metals $62B_W$ may not be oxidized during the process of depositing the ferroelectric strips 84. Further, the absolute value of the Gibbs energy of metal oxide formation of the second metal layer $62B_R$ is low. Therefore, in the process of depositing the ferroelectric strip 84, the second metal layer $62B_R$ is not easily oxidized. As a result, no dielectric interface layer is formed between the ferroelectric strip 84 and the second metal layer $62B_R$. The second metal layers $62A_R$ and $62B_R$ may also be referred to as anti-oxidation layers.

Referring to FIG. 1E, in some embodiments, the word lines 62 include a glue layer (or seed layer) 62S and a bulk layer 62M, although in other embodiments the glue layer may be omitted. The glue layer 62S includes a glue layer 62S t and a glue layer $62S_b$. The glue layer $62S_t$ is located between the top surface of the bulk layer 62M and the dielectric layer 72. The glue layer $62S_b$ is located between the bottom surface of the bulk layer 62M and the dielectric layer 72. In some embodiments, the glue layer $62S_t$ and the glue layer $62S_b$ are formed of the same material.

The bulk layer 62M includes a first metal layer 62W and a second metal layer 62R. The second metal layer 62R includes a first part $62R_1$ and a second part $62R_2$ on the sidewalls of the first metal layer 62W. The first part $62R_1$ and the second part $62R_2$ sandwich the first metal layer 62W therebetween. The first part $62R_1$ and the second part $62R_2$ may have similar thicknesses as the first metal layer 62W. The first part $62R_1$ and the second part $62R_2$ may be formed from the same material.

The resistance value of the first metal layer 62W is lower than the resistance value of the first part $62R_1$ and the second part $62R_2$. The absolute values of the Gibbs energy of metal oxide formation of the first part $62R_1$ and the second part $62R_2$ are lower than the absolute value of the Gibbs energy of metal oxide formation of the first metal layer 62W. The first metal layer 62W may be formed of a metal, such as tungsten, cobalt, aluminum, nickel, copper, silver, gold, molybdenum, molybdenum nitride, alloys thereof, or the like, and the first part $62R_1$ and the second part $62R_2$ may be formed of a metal, such as ruthenium.

In embodiments where the dielectric layers 72 are formed of an oxide such as silicon oxide, the glue layers $62S_t$ and $62S_b$ may be formed of titanium nitride, the first metal layer 62W may be formed of tungsten, and the second metal layers $62R_1$ and $62R_2$ may be formed of ruthenium. The glue layers $62S_t$ and $62S_b$, and the first metal layer 62W and the second metal layers $62R_1$ and $62R_2$ of the bulk layers 62M may each be formed by an acceptable deposition process such as chemical vapor deposition (CVD), atomic layer deposition (ALD), or the like.

Two sides (e.g., the top surface and the bottom surface) of the first metal layer 62W are surrounded by corresponding glue layers $62S_1$ and $62S_2$, to improve an adhesion between the he first metal layer 62W and the dielectric layers 72. The other two sides (e.g., two sidewalls) of the first metal layer 62W are covered by the second metal layers 62R$_1$ and 62R$_2$, and separated from corresponding ferroelectric strips 84 by the second metal layers 62R$_1$ and 62R$_2$. The first metal layer 62W may not be oxidized during the process of depositing the ferroelectric strips 84. Further, the absolute values of the Gibbs energy of metal oxide formation of the first part 62R$_1$ and the second part 62R$_2$ are low. The first part 62R$_1$ and the second part 62R$_2$ are not easily oxidized during the process of depositing the ferroelectric strips 84. As a result, no dielectric interface layer is formed between the ferroelectric strips 84 and the first part 62R$_1$ and the second part 62R$_2$. The first part 62R$_1$ and the second part 62R$_2$ may also be referred to as anti-oxidation layers.

FIGS. 2 through 16D are various views of intermediate stages in the manufacturing of a memory array 52, in accordance with some embodiments. A portion of the memory array 52 is illustrated. Some features, such as the staircase arrangement of the word lines (see FIG. 1C), are not shown for clarity of illustration. FIGS. 3A, 4A, 5A, 6A, 7A, 8A, 9A, 10A, 11A, 12A, 13A, 14A, and 15A are three-dimensional views of the memory array 52. FIGS. 2, 3B, 4B, 5B, 6B, 7B, 8B, 9B, 10B, 11B, 12B, 13B, 14B, and 15B are cross-sectional views shown along reference cross-section B-B in FIG. 15A.

Figure 2:
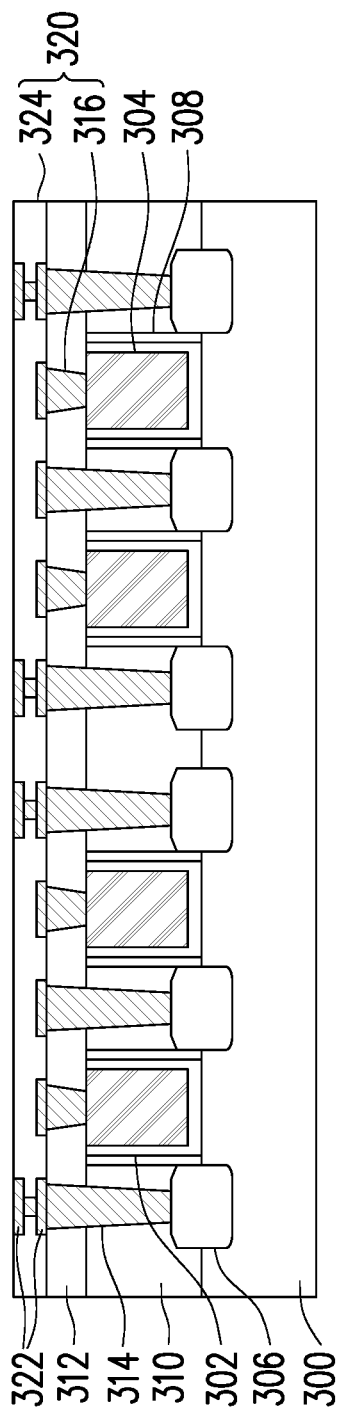
FIGS. 2 through 16D are various views of intermediate stages in the manufacturing of a memory array, in accordance with some embodiments.

In FIG. 2, a substrate 300 is provided. The substrate 300 may be a semiconductor substrate, such as a bulk semiconductor, a semiconductor-on-insulator (SOI) substrate, or the like, which may be doped (e.g., with a p-type or an n-type dopant) or undoped. The substrate 300 may be an integrated circuit die, such as a logic die, a memory die, an ASIC die, or the like. The substrate 300 may be a complementary metal oxide semiconductor (CMOS) die and may be referred to as a CMOS under array (CUA). The substrate 300 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 300 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

FIG. 2 further illustrates circuits that may be formed over the substrate 300. The circuits include transistors at a top surface of the substrate 300. The transistors may include gate dielectric layers 302 over top surfaces of the substrate 300 and gate electrodes 304 over the gate dielectric layers 302. Source/drain regions 306 are disposed in the substrate 300 on opposite sides of the gate dielectric layers 302 and the gate electrodes 304. Gate spacers 308 are formed along sidewalls of the gate dielectric layers 302 and separate the source/drain regions 306 from the gate electrodes 304 by appropriate lateral distances. The transistors may include fin field effect transistors (FinFETs), nanostructure (e.g., nanosheet, nanowire, gate-all-around, or the like) FETS (nano-FETs), planar FETs, the like, or combinations thereof, and may be formed by gate-first processes or gate-last processes.

A first inter-layer dielectric (ILD) 310 surrounds and isolates the source/drain regions 306, the gate dielectric layers 302, and the gate electrodes 304 and a second ILD 312 is over the first ILD 310. Source/drain contacts 314 extend through the second ILD 312 and the first ILD 310 and are electrically coupled to the source/drain regions 306 and gate contacts 316 extend through the second ILD 312 and are electrically coupled to the gate electrodes 304. An interconnect structure 320 is over the second ILD 312, the source/drain contacts 314, and the gate contacts 316. The interconnect structure 320 includes one or more stacked dielectric layers 324 and conductive features 322 formed in the one or more dielectric layers 324, for example. The interconnect structure 320 may be electrically connected to the gate contacts 316 and the source/drain contacts 314 to form functional circuits. In some embodiments, the functional circuits formed by the interconnect structure 320 may include logic circuits, memory circuits, sense amplifiers, controllers, input/output circuits, image sensor circuits, the like, or combinations thereof. Although FIG. 2 discusses transistors formed over the substrate 300, other active devices (e.g., diodes or the like) and/or passive devices (e.g., capacitors, resistors, or the like) may also be formed as part of the functional circuits.

Figure 3B:
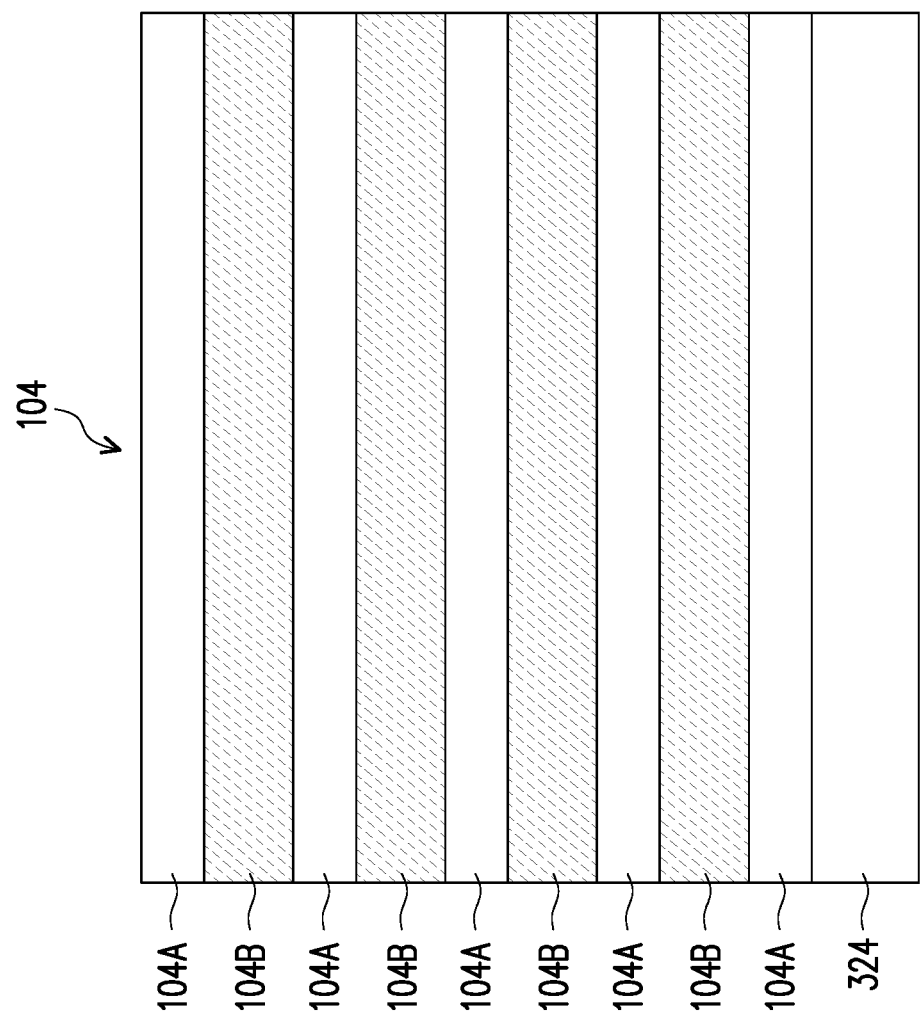

In FIGS. 3A and 3B, a multilayer stack 104 is formed over the structure of FIG. 2. The substrate 300, the transistors, the ILDs 310 and 312, and the interconnect structure 320 may be omitted from subsequent drawings for the purposes of simplicity and clarity. The multilayer stack 104 includes alternating first dielectric layers 104A and second dielectric layers 104B. The first dielectric layers 104A are formed of a first dielectric material, and the second dielectric layers 104B are formed of a second dielectric material. In the illustrated embodiment, the multilayer stack 104 includes five layers of the first dielectric layers 104A and four layers of the second dielectric layers 104B. It should be appreciated that the multilayer stack 104 may include any number of the first dielectric layers 104A and the second dielectric layers 104B.

The multilayer stack 104 will be patterned in subsequent processing. The patterned first dielectric layers 104A will be used to isolate subsequently formed TFTs. The patterned second dielectric layers 104B are sacrificial layers (or dummy layers), which will be removed in subsequent processing and replaced with word lines for the TFTs. As such, the second dielectric material of the second dielectric layers 104B also has a high etching selectivity from the etching of the first dielectric material of the first dielectric layers 104A. In some embodiments, the first dielectric layers 104A may be formed of an oxide such as silicon oxide, and the second dielectric layers 104B may be formed of a nitride such as silicon nitride. Other combinations of dielectric materials having acceptable etching selectivity from one another may also be used.

Each layer of the multilayer stack 104 may be formed by an acceptable deposition process such as chemical vapor deposition (CVD), atomic layer deposition (ALD), or the like. A thickness of each of the layers may be in the range of about 15 nm to about 90 nm. In some embodiments, the first dielectric layers 104A are formed to a different thickness than the second dielectric layers 104B. In alternative embodiments, the first dielectric layers 104A are formed to the same thickness as the second dielectric layers 104B. The multilayer stack 104 may have an overall height H 1 in the range of about 1000 nm to about 10000 nm (such as about 2000 nm).

As will be discussed in greater detail below, FIGS. 4A through 14B illustrate a process in which trenches are patterned in the multilayer stack 104 and TFTs are formed in the trenches. Specifically, a multiple-patterning process is used to form the TFTs. The multiple-patterning process may be a double patterning process, a quadruple patterning process, or the like. FIGS. 4A through 14B illustrate a double patterning process. In a double patterning process, first trenches 106 (see FIGS. 4A and 4B) are patterned in the multilayer stack 104 with a first etching process, and components for a first subset of the TFTs are formed in the first trenches 106. Second trenches 120 (see FIGS. 7A and 7B) are then patterned in the multilayer stack 104 with a second etching process, and a second subset of the TFTs are formed in the second trenches 120. Forming the TFTs with a multiple-patterning process allows each patterning process to be performed with a low pattern density, which may help reduce defects while still allowing the memory array 52 to have sufficient memory cell density, while also helping to prevent the aspect ratio from becoming too high and causing problems with structural instability.

Additionally, while the embodiment discussed above illustrates the memory array 52 being formed over the structure of FIG. 2, this is intended to be illustrative and is not intended to be limiting upon the embodiments. Rather, the memory array 52 may be formed directly over the substrate 102 (e.g., a semiconductor substrate) in either a front end of line process or a back end of line process, and may be formed either as an embedded memory array or as a stand-alone structure. Any suitable formation of the memory array 52 may be utilized, and all such formations are fully intended to be included within the scope of the embodiments.

Figure 4A:
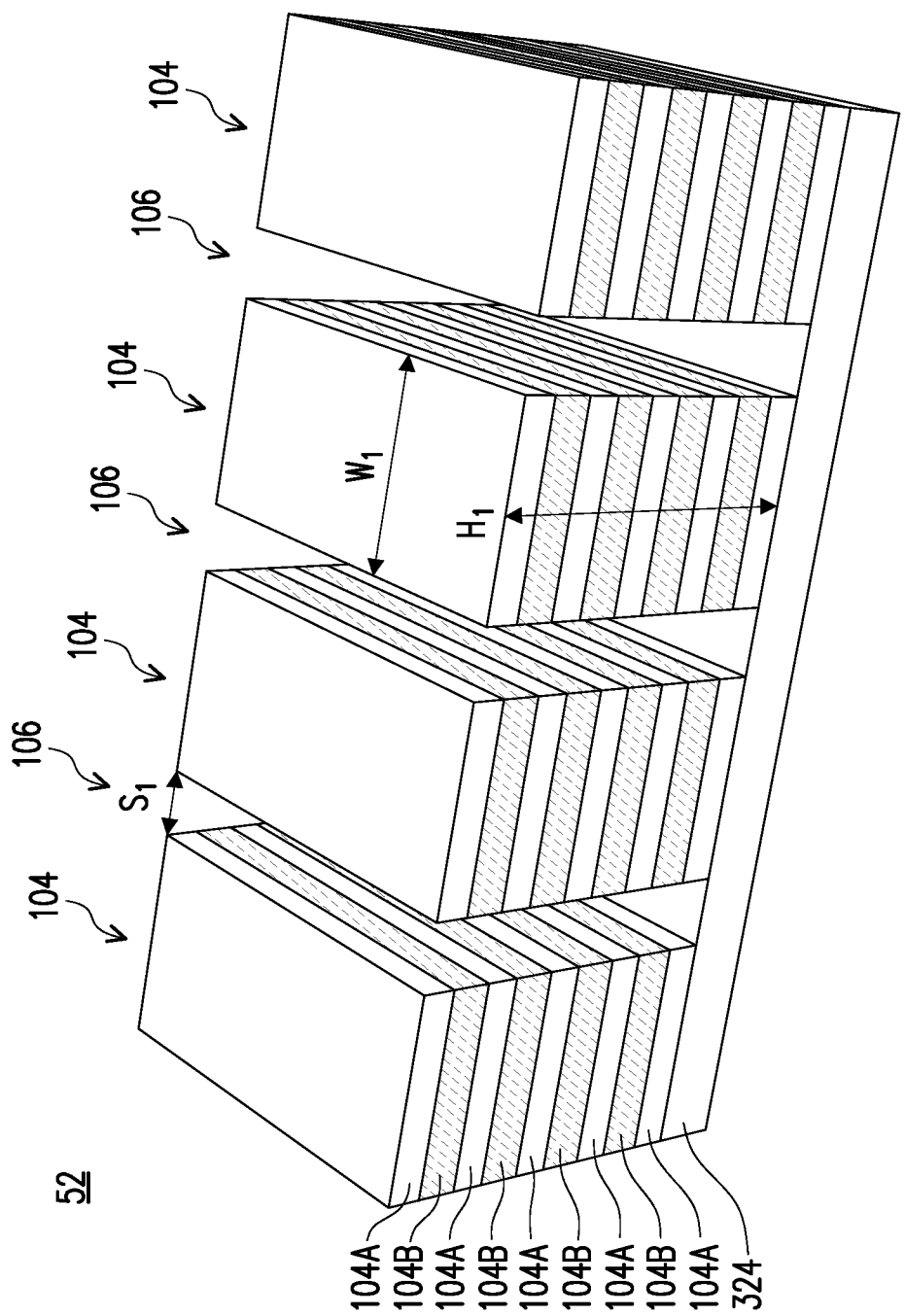
Figure 4B:
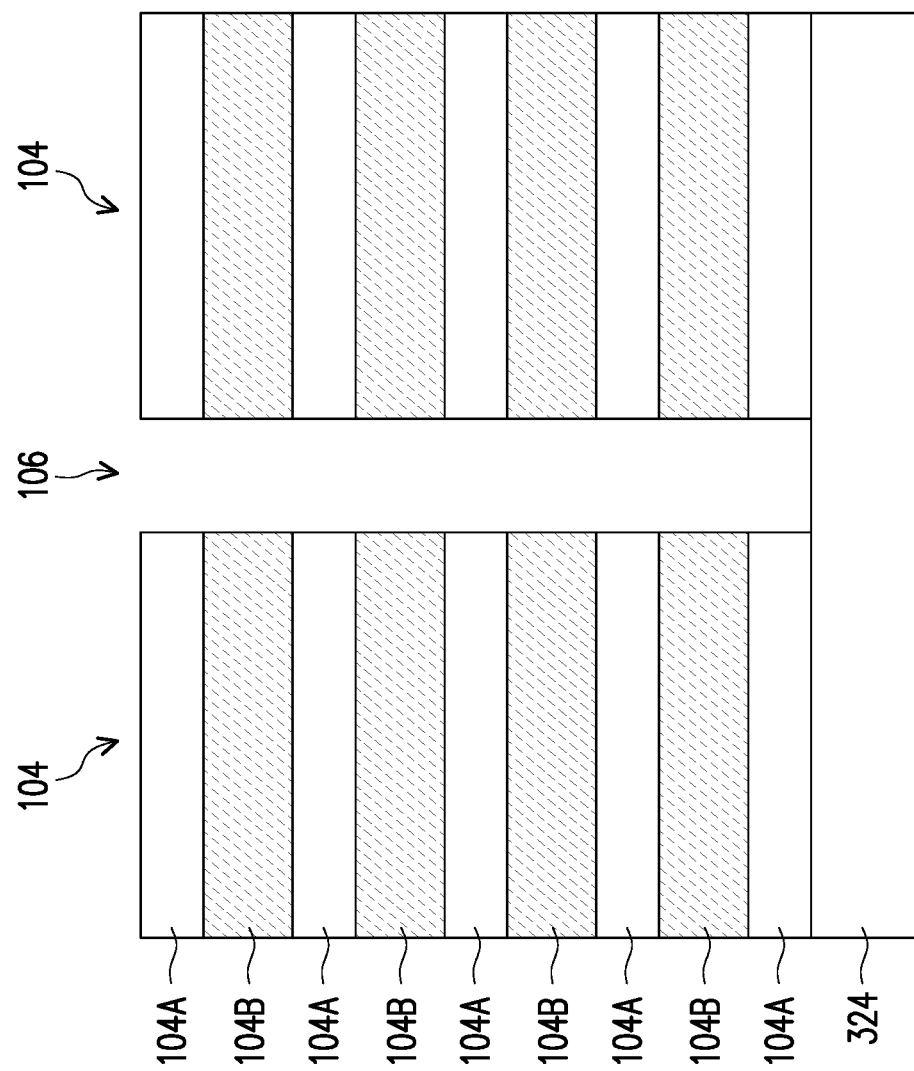

In FIGS. 4A and 4B, first trenches 106 are formed in the multilayer stack 104. In the illustrated embodiment, the first trenches 106 extend through the multilayer stack 104 and expose the substrate 324. In another embodiment, the first trenches 106 extend through some but not all layers of the multilayer stack 104. The first trenches 106 may be formed using acceptable photolithography and etching techniques, such as with an etching process that is selective to the multilayer stack 104 (e.g., etches the dielectric materials of the first dielectric layers 104A and the second dielectric layers 104B at a faster rate than the material of the substrate 102). The etching may be any acceptable etch process, such as a reactive ion etch (RIE), neutral beam etch (NBE), the like, or a combination thereof. The etching may be anisotropic. In embodiments where the first dielectric layers 104A are formed of silicon oxide, and the second dielectric layers 104B are formed of silicon nitride, the first trenches 106 may be formed by a dry etch using a fluorine-based gas (e.g., $C_4F_6$) mixed with hydrogen ($H_2$) or oxygen ($O_2$) gas.

A portion of the multilayer stack 104 is disposed between each pair of the first trenches 106. Each portion of the multilayer stack 104 may have a width $W_1$ in the range of about 50 nm to about 500 nm (such as about 240 nm), and has the height $H_1$ discussed with respect to FIGS. 3A and 3B. Further, each portion of the multilayer stack 104 is separated by a separation distance $S_1$, which may be in the range of about 50 nm and about 200 nm (such as about 80 nm). The aspect ratio (AR) of each portion of the multilayer stack 104 is the ratio of the height $H_1$ to the width of the narrowest feature of the portion of the multilayer stack 104, which is the width $W_1$ at this step of processing. In accordance with some embodiments, when the first trenches 106 are formed, the aspect ratio of each portion of the multilayer stack 104 is in the range of about 5 to about 15. Forming each portion of the multilayer stack 104 with an aspect ratio of less than about may not allow the memory array 52 to have sufficient memory cell density. Forming each portion of the multilayer stack 104 with an aspect ratio of greater than about 15 may cause twisting or collapsing of the multilayer stack 104 in subsequent processing.

Figure 5A:
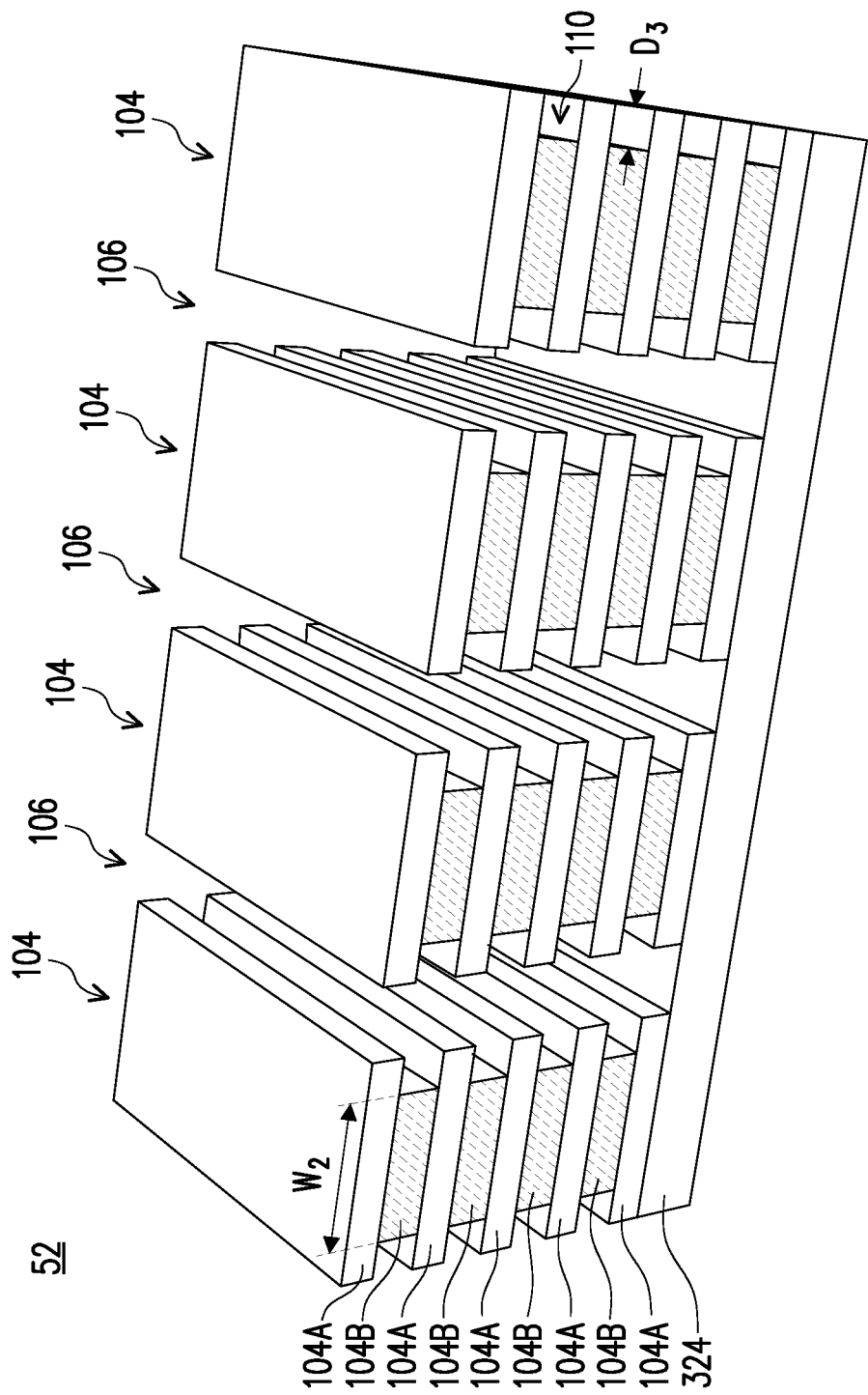
Figure 5B:
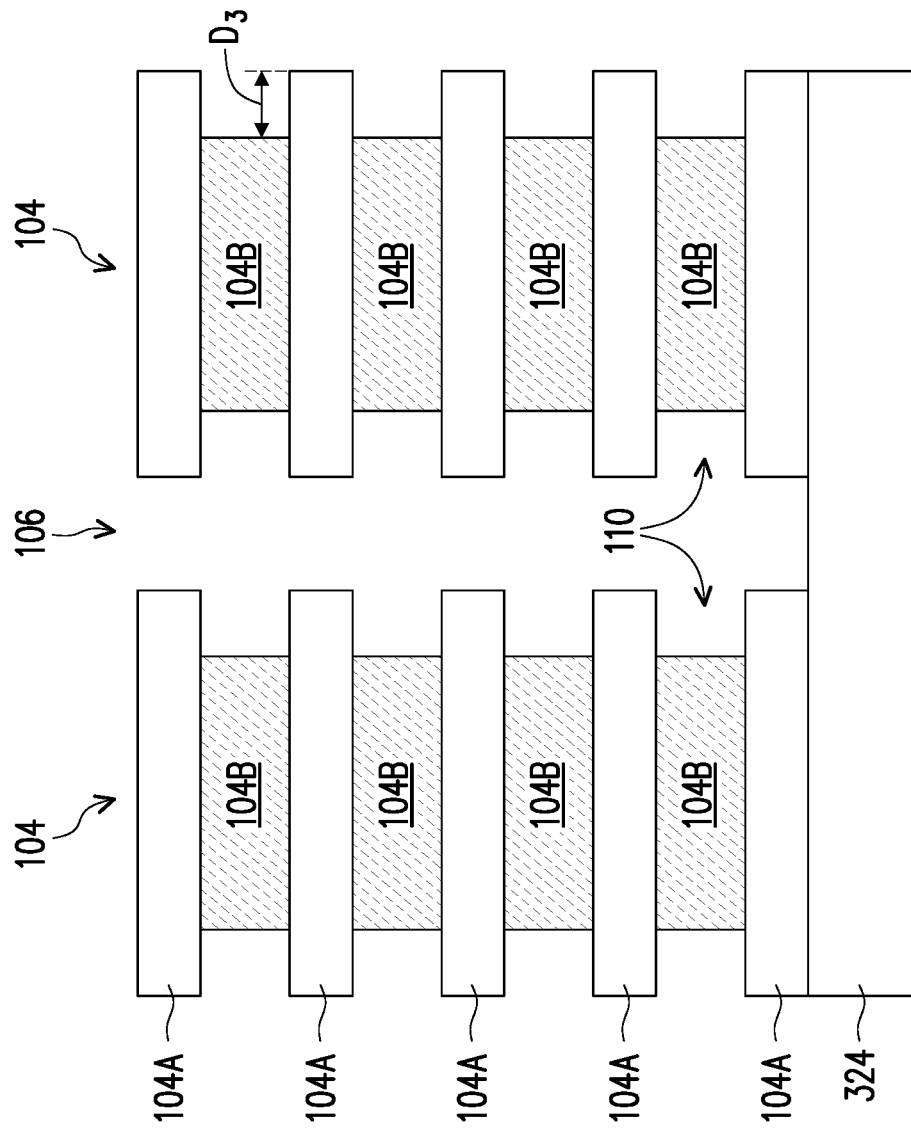

In FIGS. 5A and 5B, the first trenches 106 are expanded to form first sidewall recesses 110. Specifically, portions of the sidewalls of the second dielectric layers 104B exposed by the first trenches 106 are recessed from the first sidewall recesses 110. Although sidewalls of the second dielectric layers 104B are illustrated as being straight, the sidewalls may be concave or convex. The first sidewall recesses 110 may be formed by an acceptable etching process, such as one that is selective to the material of the second dielectric layers 104B (e.g., selectively etches the material of the second dielectric layers 104B at a faster rate than the materials of the first dielectric layers 104A and the substrate 102). The etching may be isotropic. In embodiments where the dielectric layer 324 and the first dielectric layers 104A are formed of silicon oxide, and the second dielectric layers 104B are formed of silicon nitride, the first trenches 106 are expanded by a wet etch using phosphoric acid ($H_3PO_4$). However, any suitable etching process, such as a dry selective etch, may also be utilized.

After formation, the first sidewall recesses 110 have a depth $D_3$ extending past the sidewalls of the first dielectric layers 104A. Timed etch processes may be used to stop the etching of the first sidewall recesses 110 after the first sidewall recesses 110 reach a desired depth $D_3$. For example, when phosphoric acid is used to etch the second dielectric layers 104B which can cause the first sidewall recesses 110 to have a depth $D_3$ in the range of about 10 nm to about 60 nm (such as about 40 nm). Forming the first sidewall recesses 110 reduces the width of the second dielectric layers 104B. Continuing the previous example, the second dielectric layers 104B may have a width $W_2$ in the range of about 50 nm to about 450 nm (such as about 160 nm) after the etching. As noted above, the aspect ratio (AR) of each portion of the multilayer stack 104 is the ratio of the height $H_1$ to the width of the narrowest feature of the portion of the multilayer stack 104, which is the width $W_2$ at this step of processing. Forming the first sidewall recesses 110 thus increases the aspect ratio of each portion of the multilayer stack 104. In accordance with some embodiments, after forming the first sidewall recesses 110, the aspect ratio of each portion of the multilayer stack 104 remains in the range discussed above, e.g., the range of about 5 to about 15. The advantages of such an aspect ratio (discussed above) may thus still be achieved.

Figure 6A:
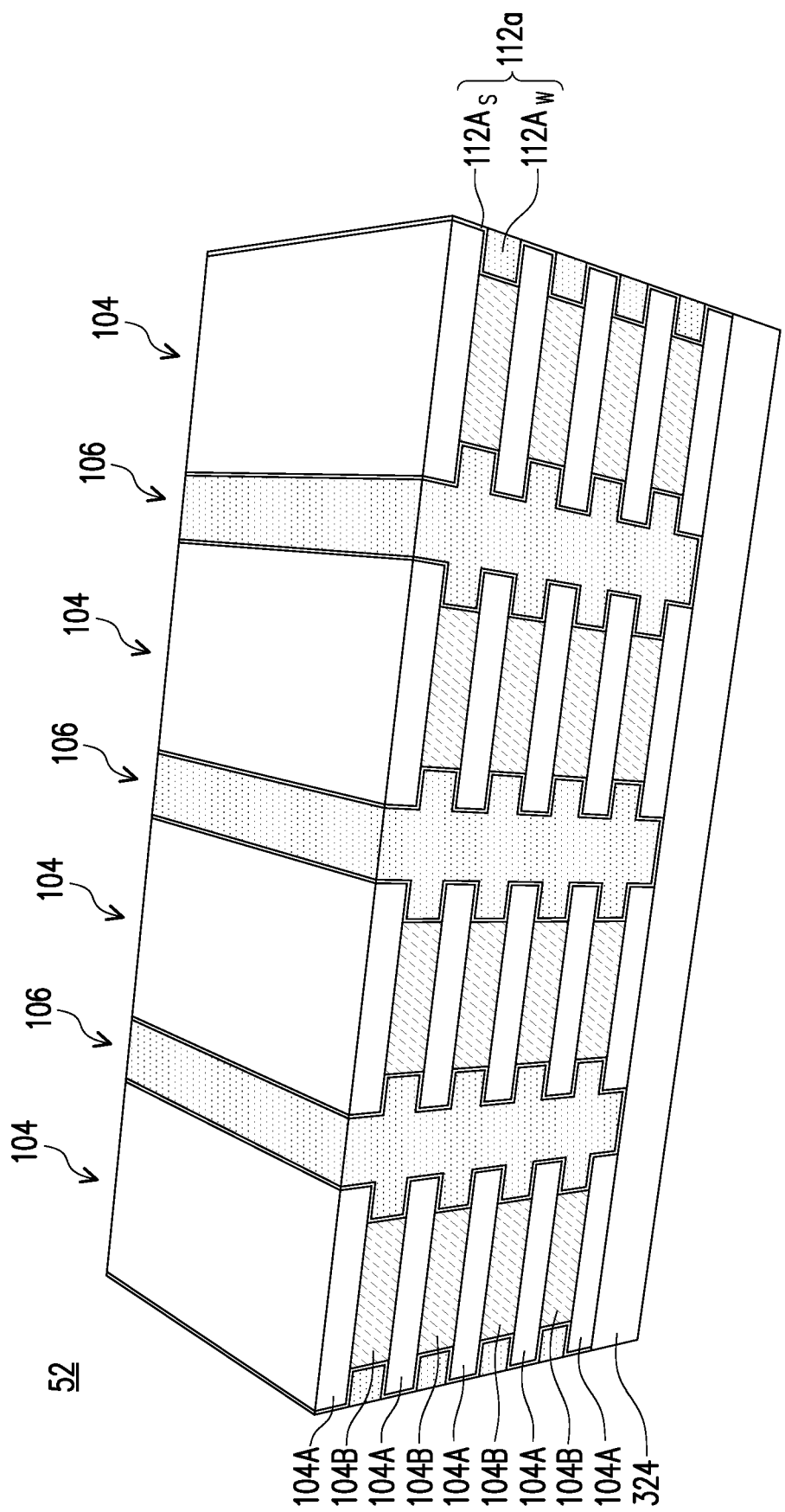
Figure 6B:
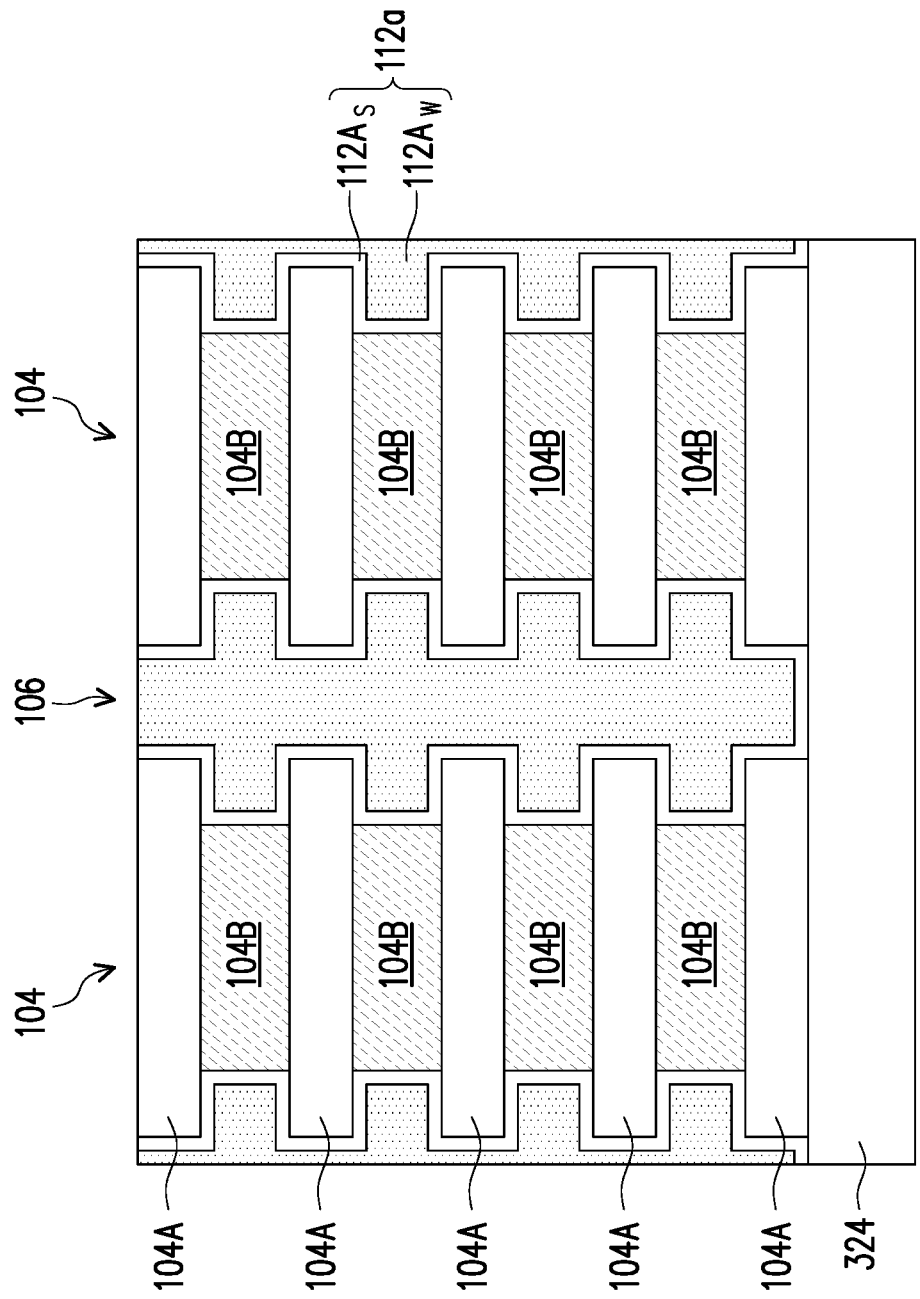

In FIGS. 6A and 6B, first conductive features 112a are formed in the first sidewall recesses 110 and to fill and/or overfill the first trenches 106, thus completing a process for replacing first portions of the second dielectric layers 104B. The first conductive features 112a may each comprise one or more layers, such as glue layers, glue layers, barrier layers, diffusion layers, and fill layers, and the like. In some embodiments, the first conductive features 112a each includes a glue layer $112A_S$ (or seed layer) and a first metal layer $112A_W$, although in other embodiments the glue layer $112A_S$ may be omitted. Each glue layer $112A_S$ extends along three sides (e.g., the top surface, a sidewall, and the bottom surface) of the material of a corresponding first metal layer $112A_W$ located within the first sidewall recesses 110. The glue layer $112A_S$ are formed of a first conductive material that may be utilized to help grow or to help adhere the subsequently deposited material, such as titanium nitride, tantalum nitride, titanium, tantalum, molybdenum, ruthenium, rhodium, hafnium, iridium, niobium, rhenium, tungsten, combinations of these, nitrides of these, or the like. The first metal layers $112A_W$ may be formed of a second conductive material, such as a metal, such as tungsten, cobalt, aluminum, nickel, copper, silver, gold, molybdenum, molybdenum nitride, alloys thereof, or the like. The material of the glue layer $112A_S$ is one that has good adhesion to the material of the first dielectric layers 104A, and the material of the first metal layers $112A_W$ is one that has good adhesion to the material of the glue layer $112A_S$. In embodiments where the first dielectric layers 104A are formed of an oxide such as silicon oxide, the glue layer $112A_S$ may be formed of titanium nitride and the first metal layers $112A_W$ may be formed of tungsten. The glue layer $112A_S$ and first metal layers $112A_W$ may each be formed by an acceptable deposition process such as chemical vapor deposition (CVD), atomic layer deposition (ALD), or the like.

Once the first conductive features 112a have been deposited in order to fill and/or overfill the first trenches 106, the first conductive features 112a may be planarized to removed excess material outside of the first trenches 106, such that after the planarizing the first conductive features 112a the first conductive features 112a completely span a top portion of the first trenches 106. In an embodiment the first conductive features 112a may be planarized using, e.g., a chemical mechanical planarization (CMP) process. However, any suitable planarization process, such as a grinding process, may also be utilized.

Figure 7A:
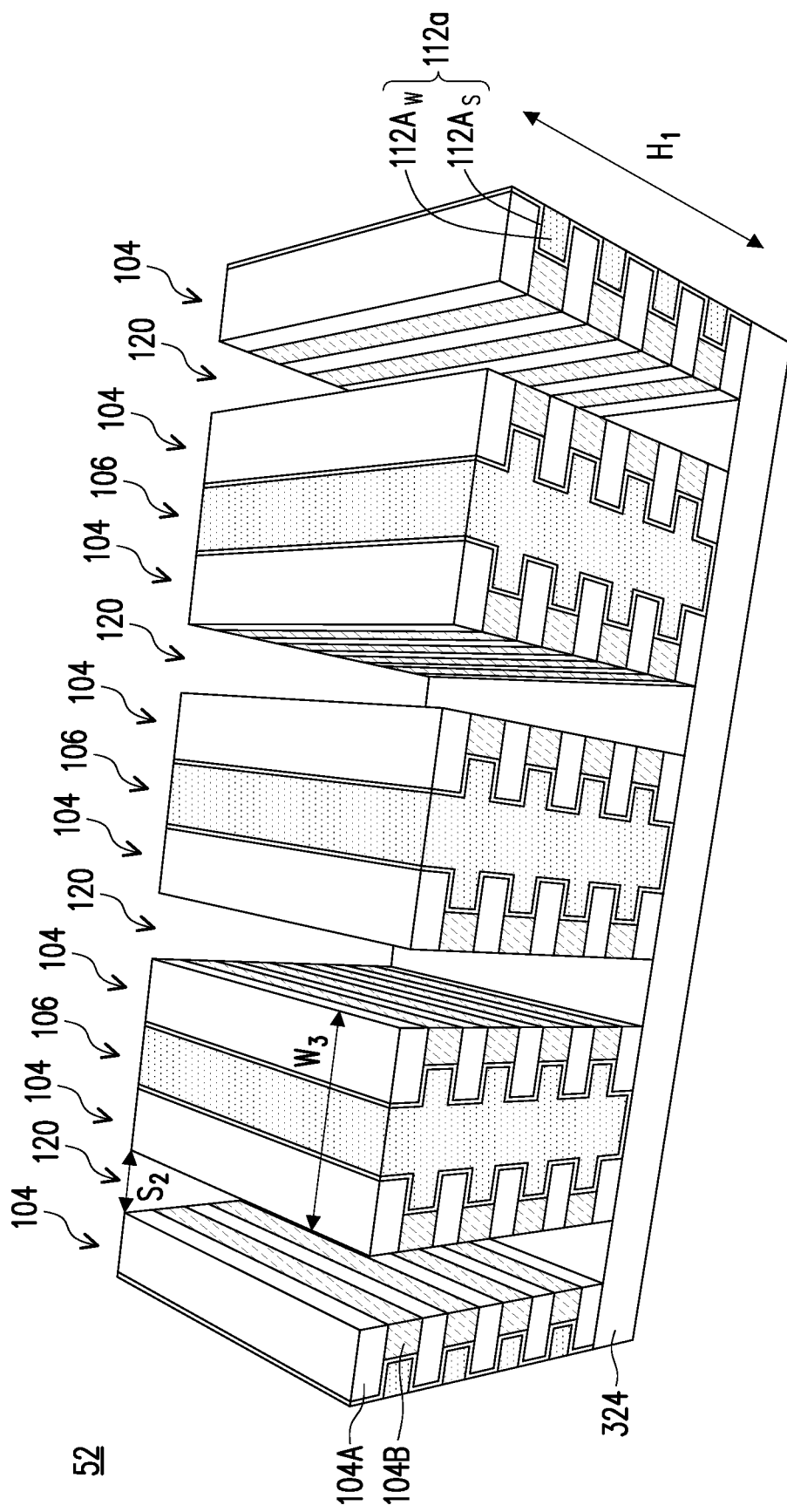
Figure 7B:
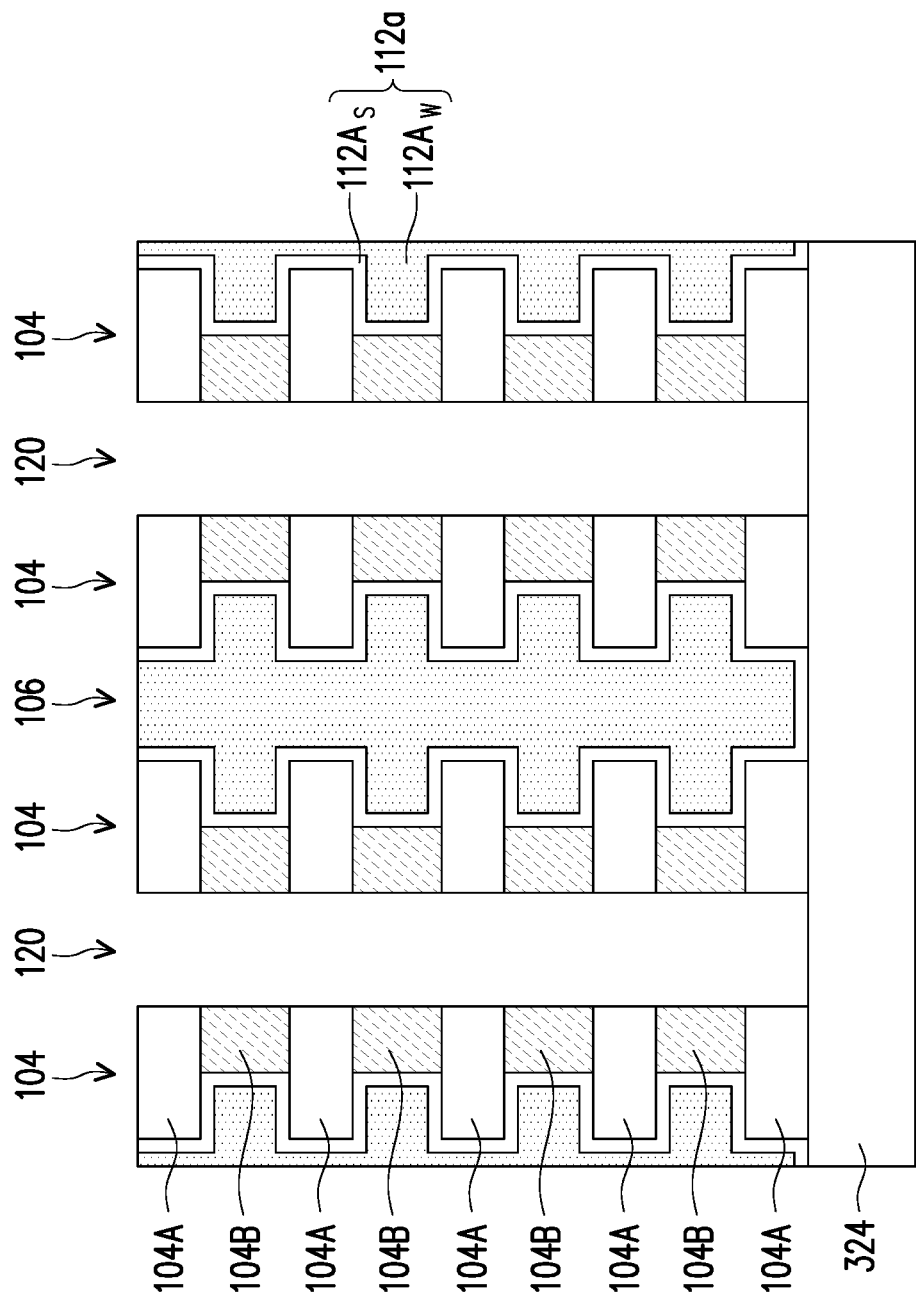

In FIGS. 7A and 7B, second trenches 120 are formed in the multilayer stack 104. In the illustrated embodiment, the second trenches 120 extend through the multilayer stack 104 and expose the substrate 324. In another embodiment, the second trenches 120 extend through some but not all layers of the multilayer stack 104. The second trenches 120 may be formed using acceptable photolithography and etching techniques, such as with an etching process that is selective to the multilayer stack 104 (e.g., etches the dielectric materials of the first dielectric layers 104A and the second dielectric layers 104B at a faster rate than the material of the substrate 102). The etching may be any acceptable etch process, and in some embodiments, may be similar to the etch used to form the first trenches 106 discussed with respect to FIGS. 4A and 4B.

A portion of the multilayer stack 104 is disposed between each second trench 120 and first trench 106. Each portion of the multilayer stack 104 may have a width $W_3$ in the range of about 50 nm to about 500 nm, and has the height $H_1$ discussed with respect to FIGS. 3A and 3B. Further, each portion of the multilayer stack 104 is separated by a separation distance $S_2$, which may be in the range of about 50 nm to about 200 nm. The aspect ratio (AR) of each portion of the multilayer stack 104 is the ratio of the height $H_1$ to the width of the narrowest feature of the portion of the multilayer stack 104, which is the width $W_3$ at this step of processing. In accordance with some embodiment, when the second trenches 120 are formed, the aspect ratio of each portion of the multilayer stack 104 is in the range of about 5 to about 15. Forming each portion of the multilayer stack 104 with an aspect ratio of less than about 5 may not allow the memory array 52 to have sufficient memory cell density. Forming each portion of the multilayer stack 104 with an aspect ratio of greater than about 15 may cause twisting or collapsing of the multilayer stack 104 in subsequent processing.

Figure 8A:
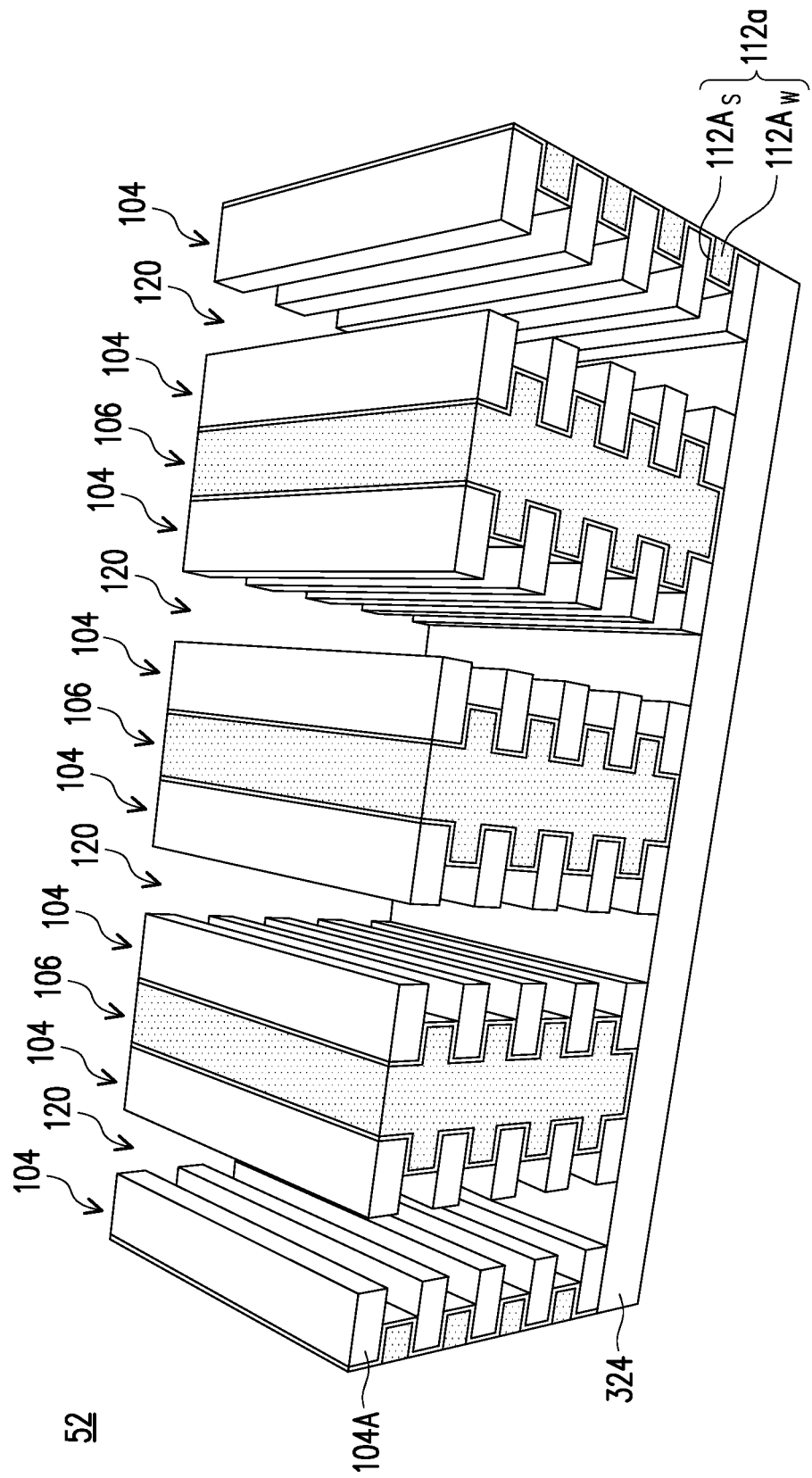
Figure 8B:
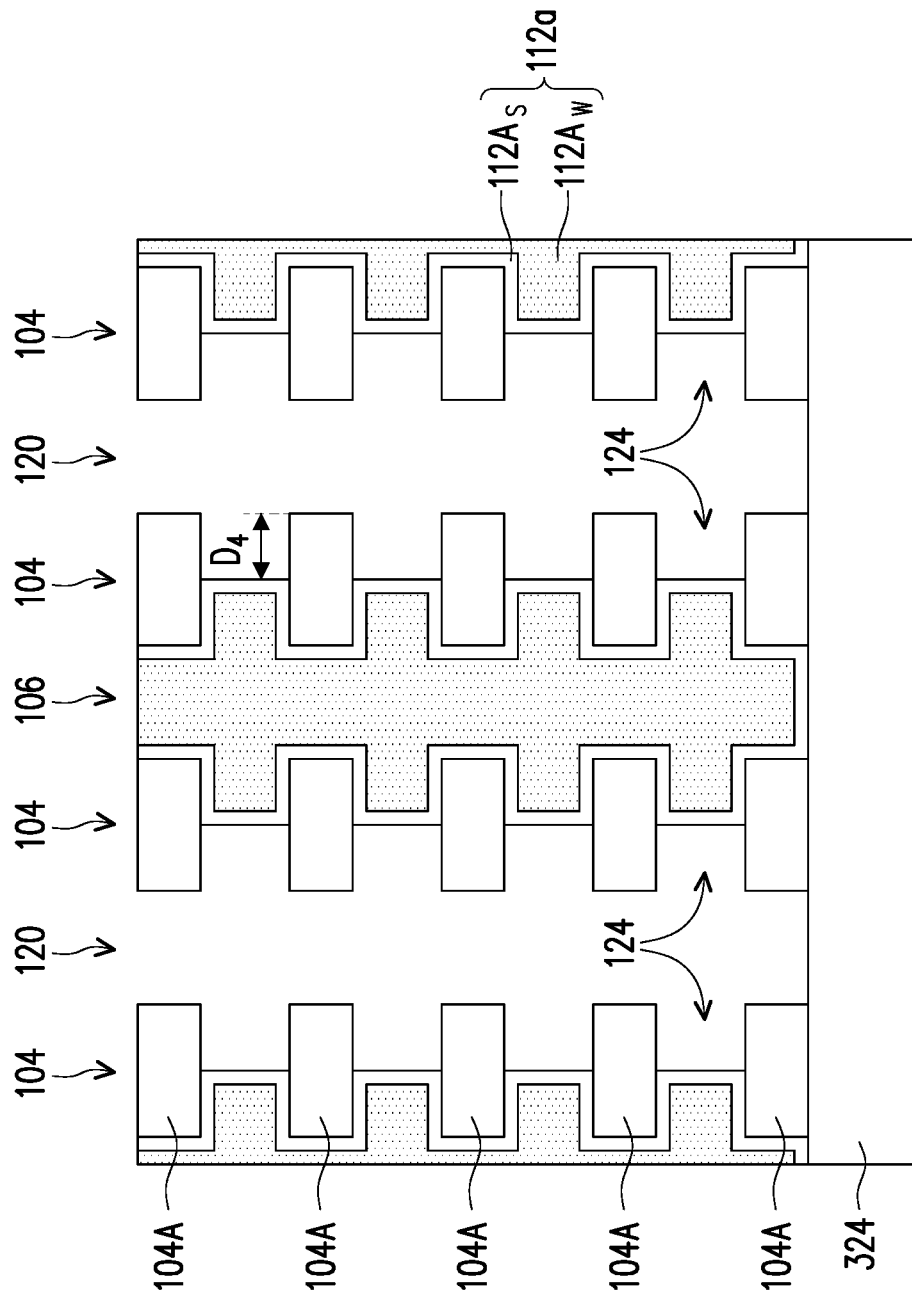

In FIGS. 8A and 8B, the second trenches 120 are expanded to form second sidewall recesses 124. Specifically, the remaining portions of the second dielectric layers 104B are removed to form the second sidewall recesses 124. The second sidewall recesses 124 thus expose portions of the first conductive features 112a, e.g., the glue layer $112A_S$, or, in embodiments in which the glue layer $112A_S$ are not present, the first metal layers $112A_W$. The second sidewall recesses 124 may be formed by an acceptable etching process, such as one that is selective to the material of the second dielectric layers 104B (e.g., selectively etches the material of the second dielectric layers 104B at a faster rate than the materials of the first dielectric layers 104A and the substrate 102). The etching may be any acceptable etch process, and in some embodiments, may be similar to the etch used to form the first sidewall recesses 110 discussed with respect to FIGS. 5A and 5B. After formation, the second sidewall recesses 124 have a depth $D_4$ extending past the sidewalls of the first dielectric layers 104A. In some embodiments, the depth $D_4$ is similar to the depth $D_3$ discussed with respect to FIGS. 5A and 5B. In another embodiment, the depth $D_4$ is different from (e.g., greater than or less than) the depth $D_3$ discussed with respect to FIGS. 5A and 5B.

Figure 9A:
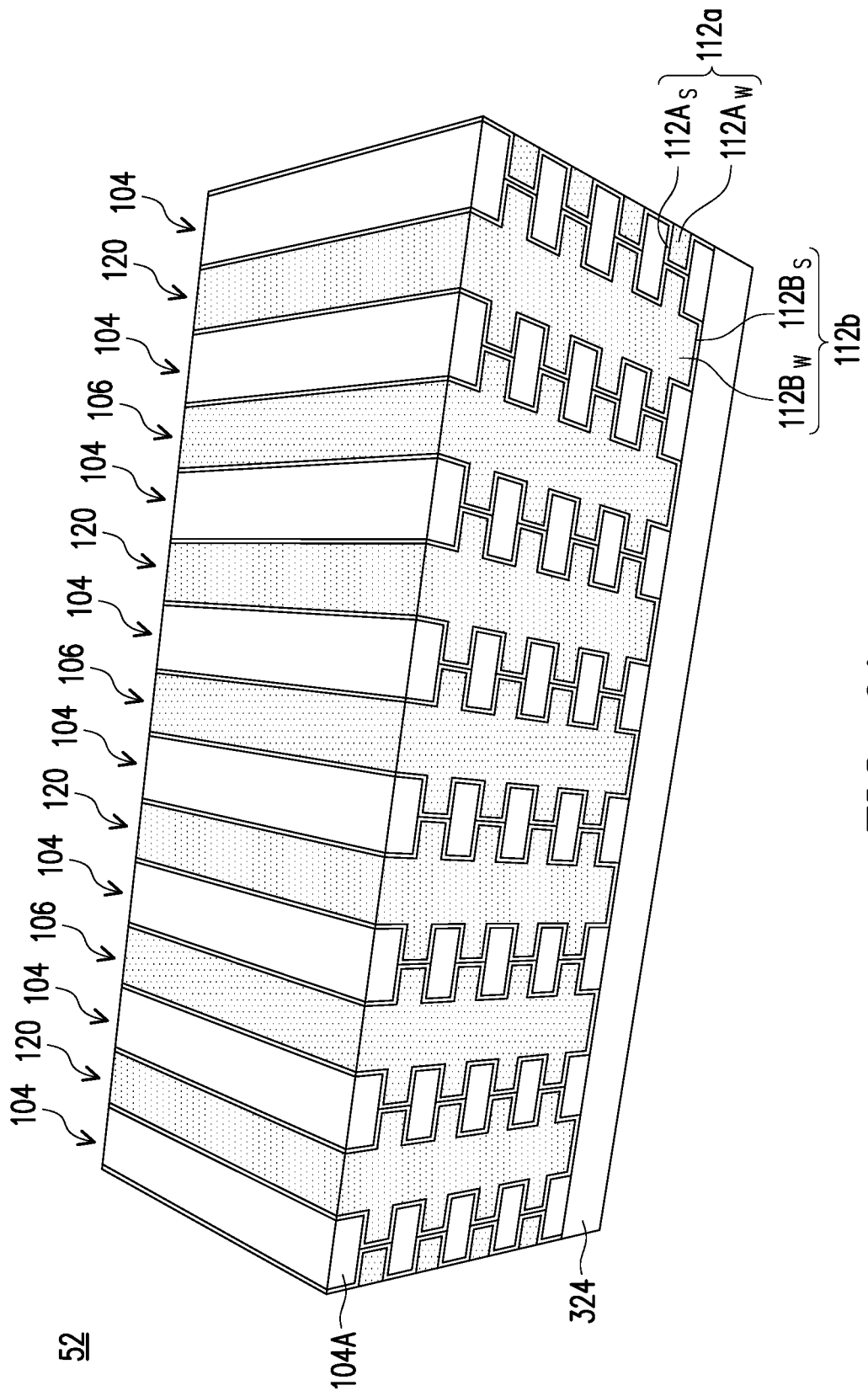
Figure 9B:
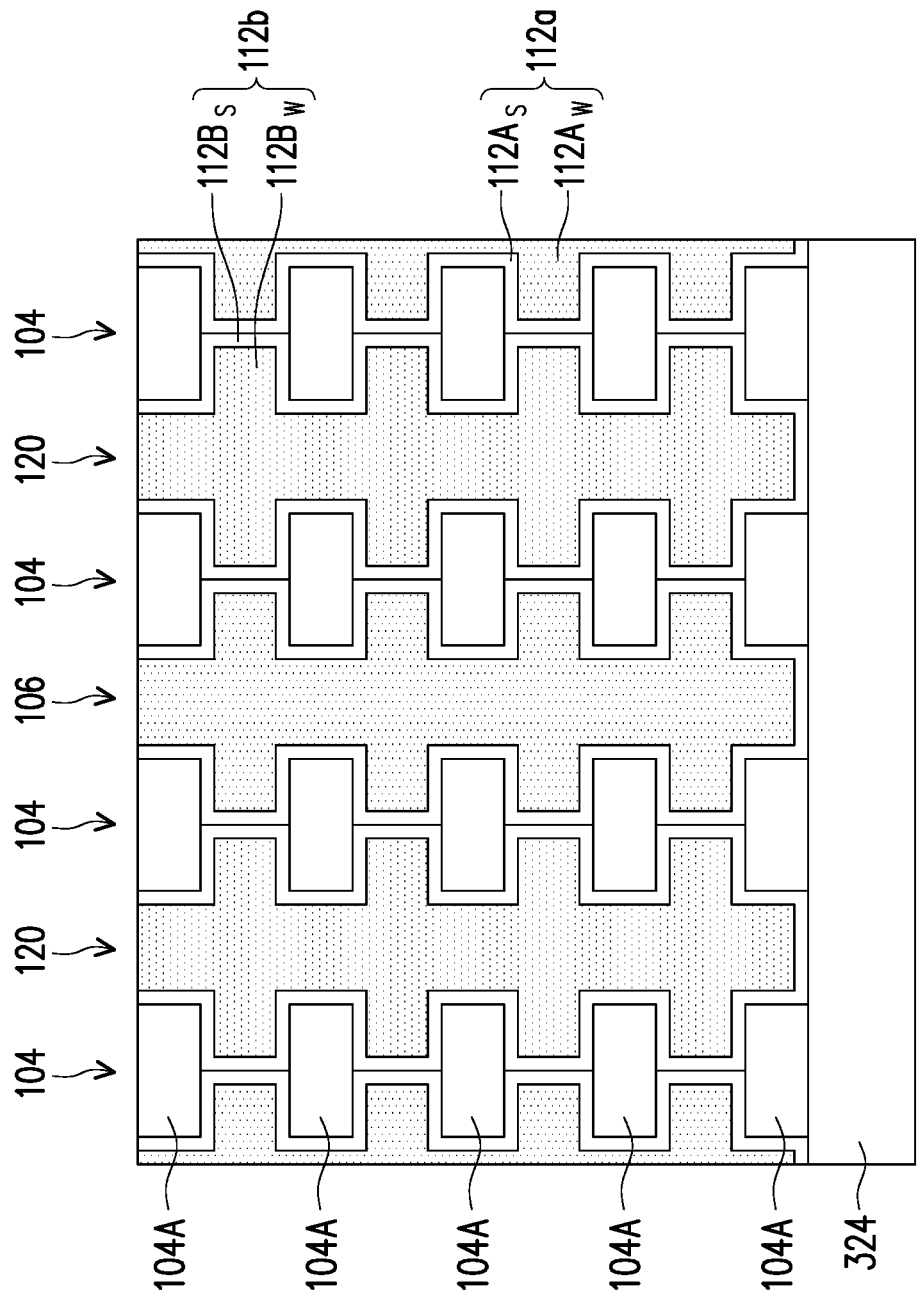

In FIGS. 9A and 9B, second conductive features 112b are formed in the second sidewall recesses 124 and to fill and/or overfill the second trenches 120, thus completing a process for replacing second portions of the second dielectric layers 104B which results in the internals layers of the first conductive features 112a and the second conductive features 112b (e.g., glue layers or seed layers) to be buried within the word line 112). The second conductive features 112b may be formed of materials that are selected from the same group of candidate materials of the first conductive features 112a, and may be formed using methods that are selected from the same group of candidate methods for forming the materials of the first conductive features 112a. The first conductive features 112a and the second conductive features 112b may be formed from the same material, or may include different materials. In some embodiments, the second conductive features 112b each include a glue layer $112B_S$ and a first metal layer $112B_W$, although in other embodiments the glue layer $112B_S$ may be omitted. The glue layer $112B_S$ and the first metal layers $112B_W$ of the second conductive features 112b may have similar thicknesses as the glue layer $112A_S$ and the first metal layers $112A_W$ of the first conductive features 112a, respectively. In some embodiments, the glue layer $112A_S$ and the glue layer $112B_S$ are formed of similar materials, in which case the glue layer $112A_S$ and the glue layer $112B_S$ may merge during formation such that no discernable interfaces exist between then. In another embodiment (discussed further below), the glue layer $112A_S$ and the glue layer $112B_S$ are formed of different materials, in which case the glue layer $112A_S$ and the glue layer $112B_S$ may not merge during formation such that discernable interfaces exist between then.

Once the second conductive features 112b have been deposited in order to fill and/or overfill the second trenches 120, the second conductive features 112b may be planarized to removed excess material outside of the second trenches 120, such that after the planarizing the second conductive features 112b the second conductive features 112b completely span a top portion of the second trenches 120. In an embodiment the second conductive features 112b may be planarized using, e.g., a chemical mechanical planarization (CMP) process. However, any suitable planarization process, such as a grinding process, may also be utilized.

Figure 10A:
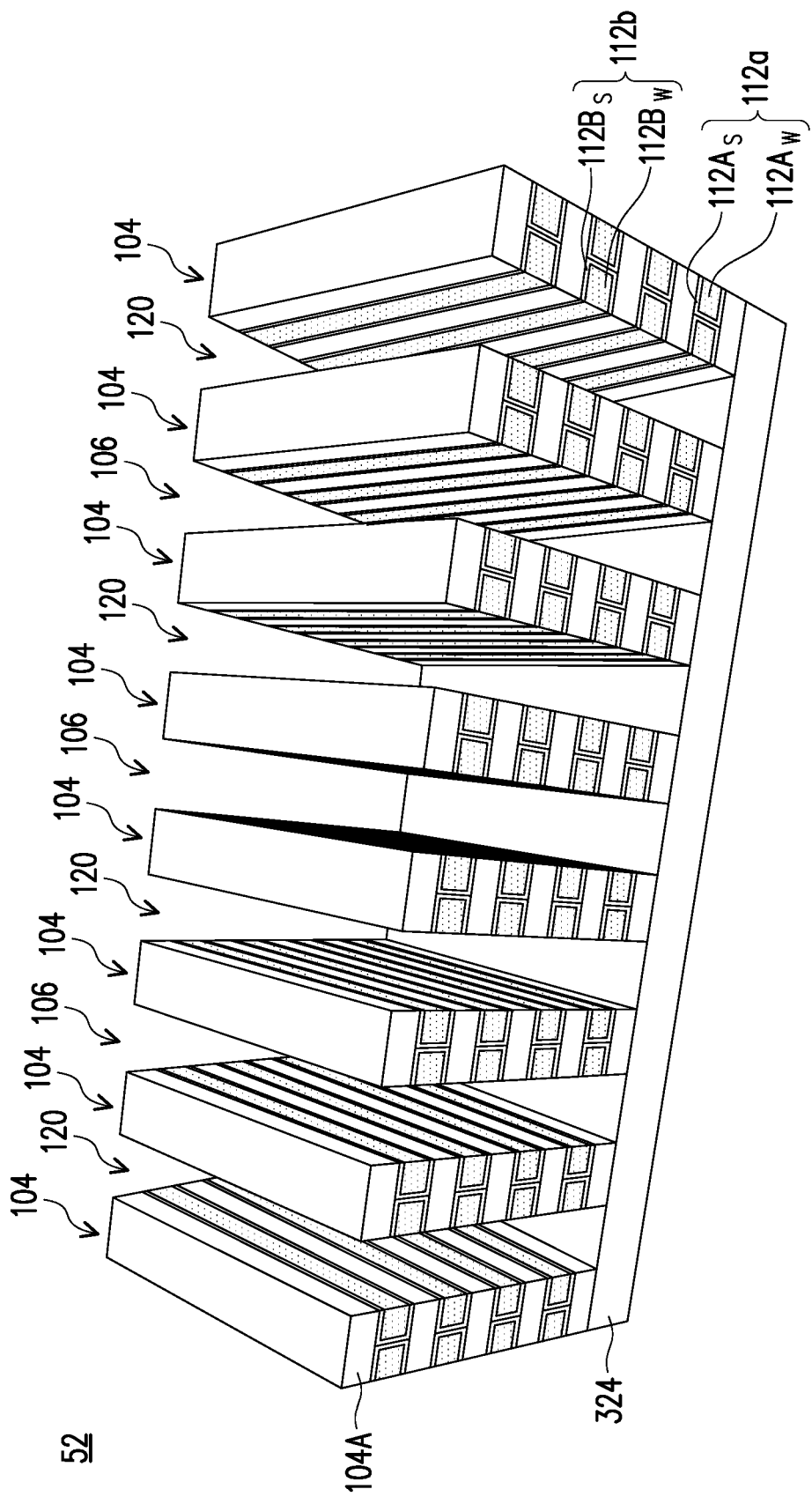
Figure 10B:
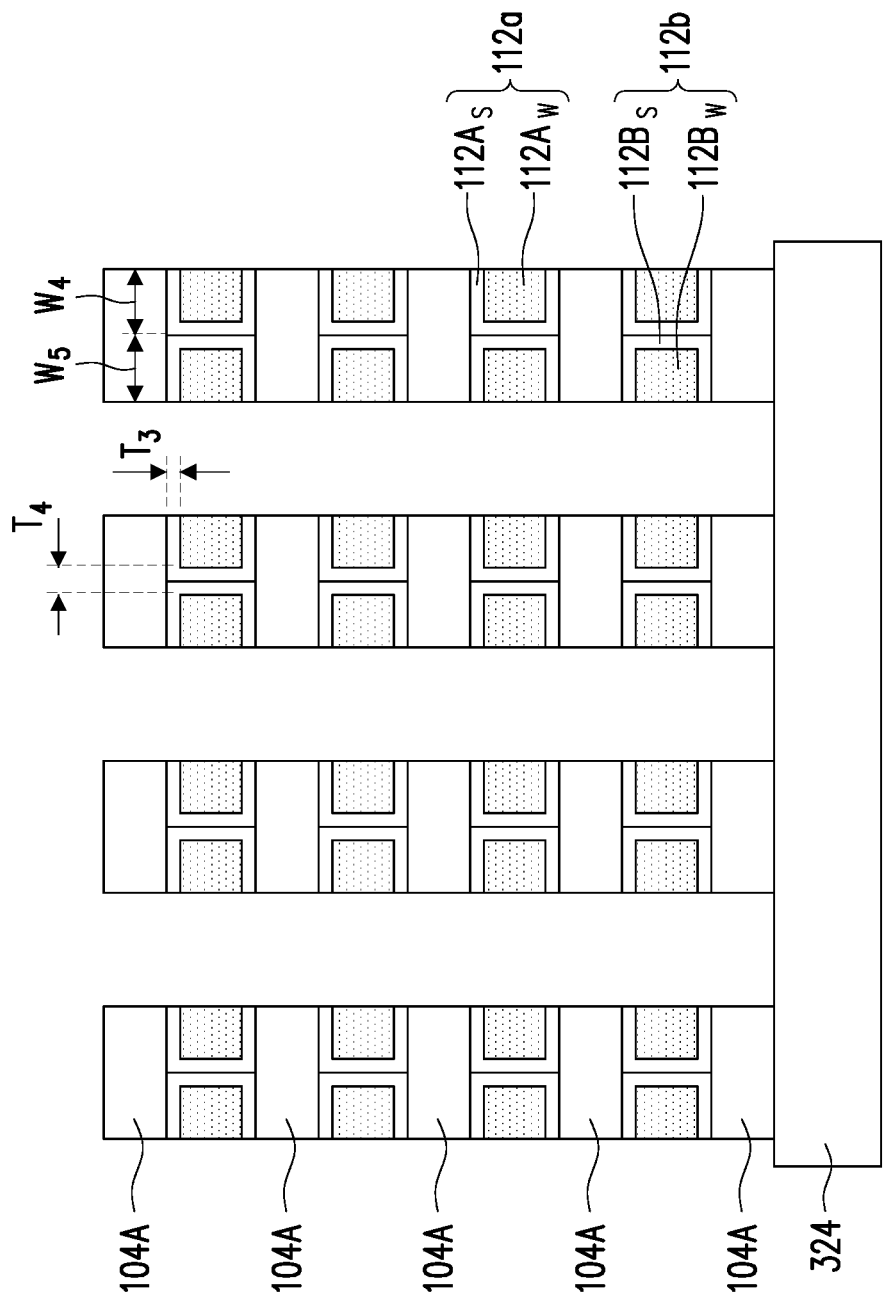

FIGS. 10A-10B illustrate an etch back process in order to remove excess portions of the first conductive features 112a and the second conductive features 112b and to expose sidewalls of the first dielectric layers 104A. In an embodiment the etch back process may be performed using, e.g., an anisotropic etching process. However, any suitable etching process may be utilized.

In an embodiment the etch back process is performed until the material of the first conductive features 112a and the second conductive features 112b that are not covered by the first dielectric layers 104A have been removed. As such, the remaining material of the first conductive features 112a and the second conductive features 112b has a similar width as the remaining portion of the first dielectric layers 104A (e.g., 80 nm). However, any suitable dimension may be utilized.

Additionally, as may be clearly seen in FIG. 10B, the first conductive features 112a may have a width W4, and the second conductive features 112b may have a width W5. Each pair of the first conductive feature 112a and the second conductive feature 112b may have equal widths (i.e., $W_4=W_5$) with each other, such as about 40 nm apiece. Additionally, the glue layers (e.g., the glue layer $112A_S$ and $112B_S$) may have an "H"-shape and also have a thickness $T_3$ along the top and bottom of the first conductive features 112a and the second conductive features 112b, and a thickness $T_4$ buried within the word line 112, wherein the glue layer $112A_S$ and $112B_S$ merge so that each of the glue layer $112A_S$ and $112B_S$ contribute to the thickness. In an embodiment the thickness $T_3$ may be between about 1 Å and about 100 Å, while the thickness $T_4$ may be between about 2 Å and about 200 Å. However, any suitable thicknesses may be utilized.

Figure 10C:
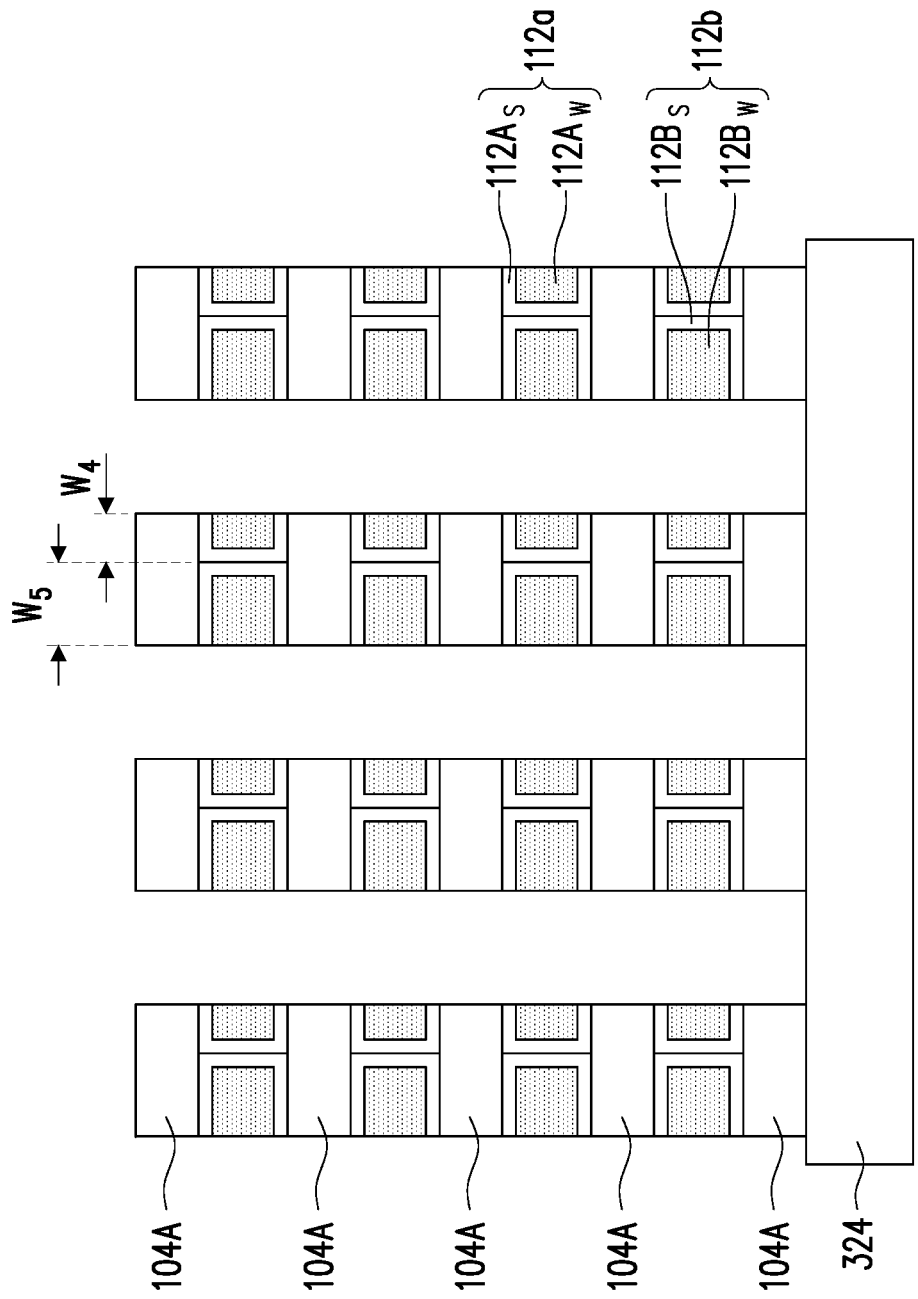

FIG. 10C illustrates another embodiment in which each pair of the first conductive feature 112a and the second conductive feature 112b have different widths. For example, in an embodiment the second trench 120 may be formed offset from a mid-point between two of the first trenches 106 (e.g., by an intentional mis-alignment of the masks). As such, the second sidewall recesses 124 may have a larger width than the first sidewall recesses 110, which causes the second conductive features 112b to have a larger width than the first conductive features 112a. For example, the first conductive features 112a may have the width $W_4$ of between about 10 Å and about 500 Å, while the second conductive features 112b may have the width $W_5$ of between about 15 Å and about 1000 Å. However, any suitable widths may be utilized.

Figure 11A:
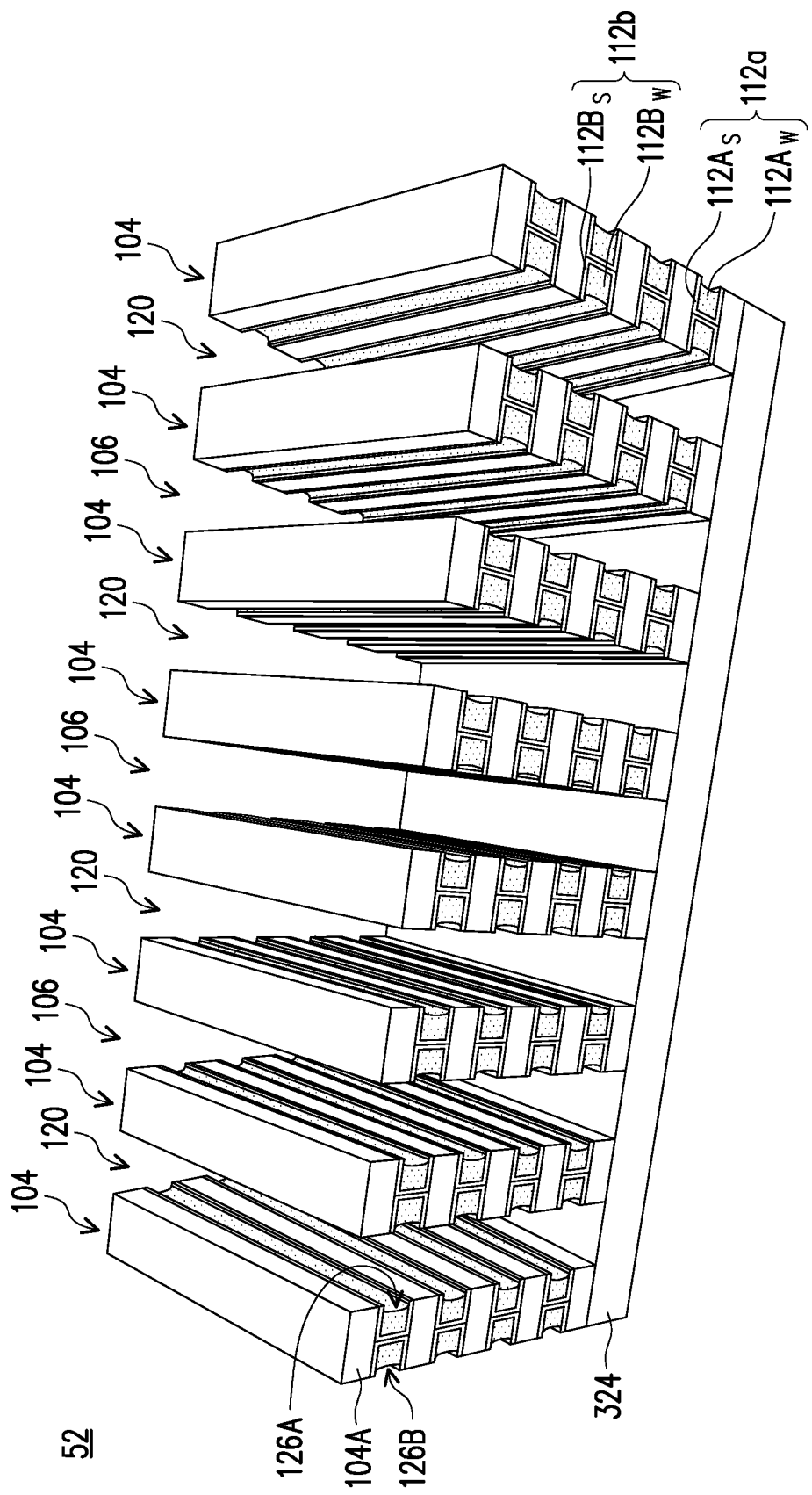
Figure 11B:
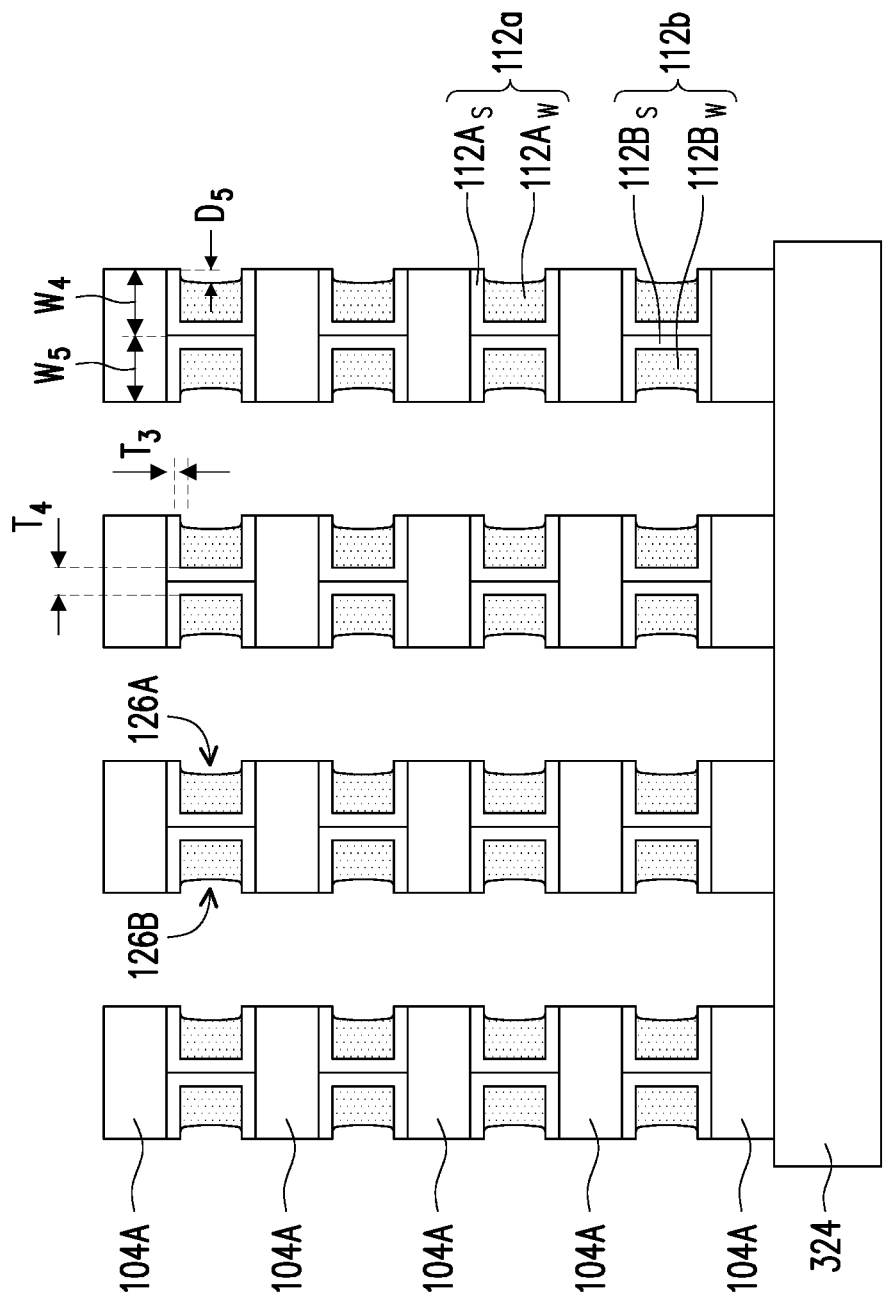
Figure 11C:
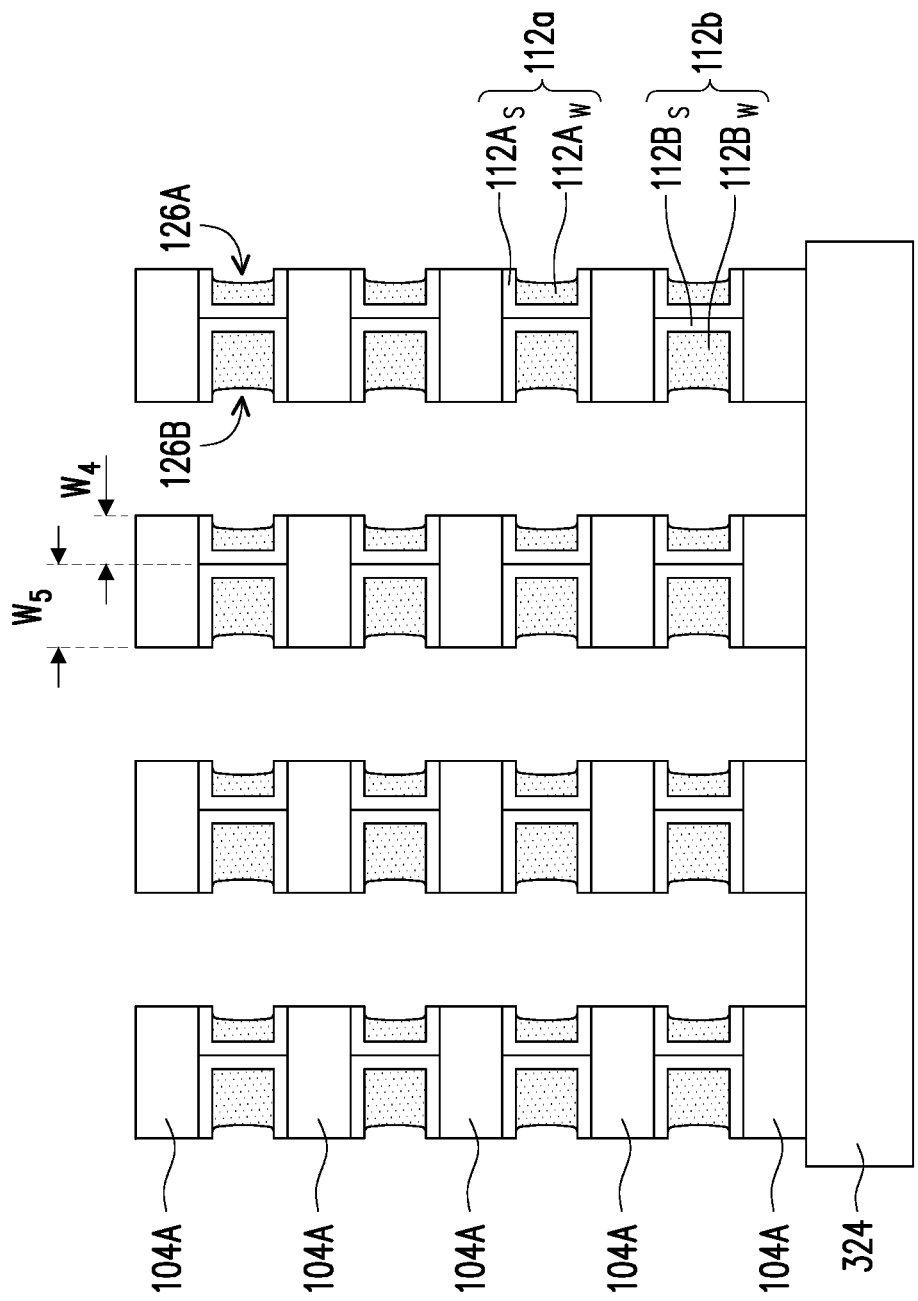

FIGS. 11A-13C illustrate portions of the first metal layers $112A_W$ and $112B_W$ are replaced with a plurality of second metal layers 112A R and 112B R. In FIG. 11A-11C, portions of the first meal layer $112A_W$ and $112B_W$ are removed to form sidewall grooves 126A and 126B at ends of the first metal layers $112A_W$ and $112B_W$. The sidewall grooves 126A thus expose portions of the glue layer $112A_S$ and the first metal layers $112A_W$. The sidewall grooves 126B thus expose portions of the glue layer $112B_S$ and the first metal layers $112B_W$. The sidewall grooves 126A and 126B may be formed by an acceptable etching process, such as one that is selective to the material of the second dielectric layers 104B (e.g., selectively etches the material of the second dielectric layers 104B at a faster rate than the materials of the first dielectric layers 104A and the dielectric layer 324). The etching may be any acceptable etch process. In some embodiments where the dielectric layer 324 and the first dielectric layers 104A are formed of silicon oxide, and the first metal layer $112A_W$ and $112B_W$ are formed of tungsten, the portions of the first meal layer $112A_W$ and $112B_W$ are removed by a dry etch using a fluorine-containing gas such as sulfur hexafluoride ($SF_6$), nitrogen trifluoride ($NF_3$) or a perfluorocarbon. The perfluorocarbon may include $CF_4$, $C_2F_6$, $C_3F_8$, $C_4F_8$, or a combination thereof. However, any suitable etching process, such as a wet selective etch, may also be utilized. After formation, the sidewall grooves 126A and 126B have a depth $D_5$ extending past the sidewalls of the first dielectric layers 104A. In some embodiments, the depth $D_5$ is less than the depth $D_3$ discussed with respect to FIG. 5B and less than the depth $D_4$ discussed with respect to FIG. 8B. In some embodiments, the ratio of the depth $D_5$ to the depth $D_3$, or the ratio of the depth $D_5$ to the depth $D_4$ is in the range of about 0.05 to about 0.5.

Figure 12A:
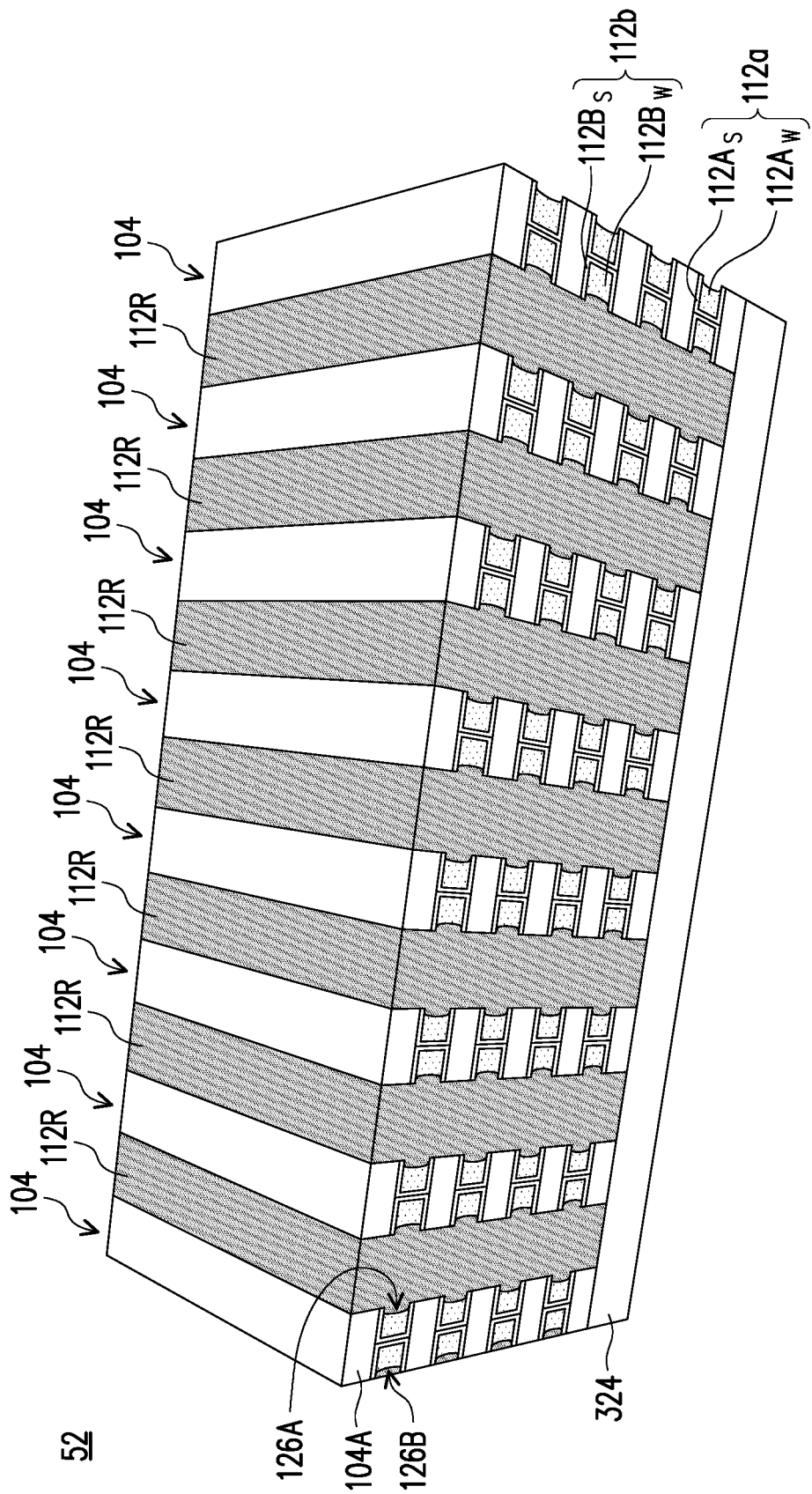
Figure 12B:
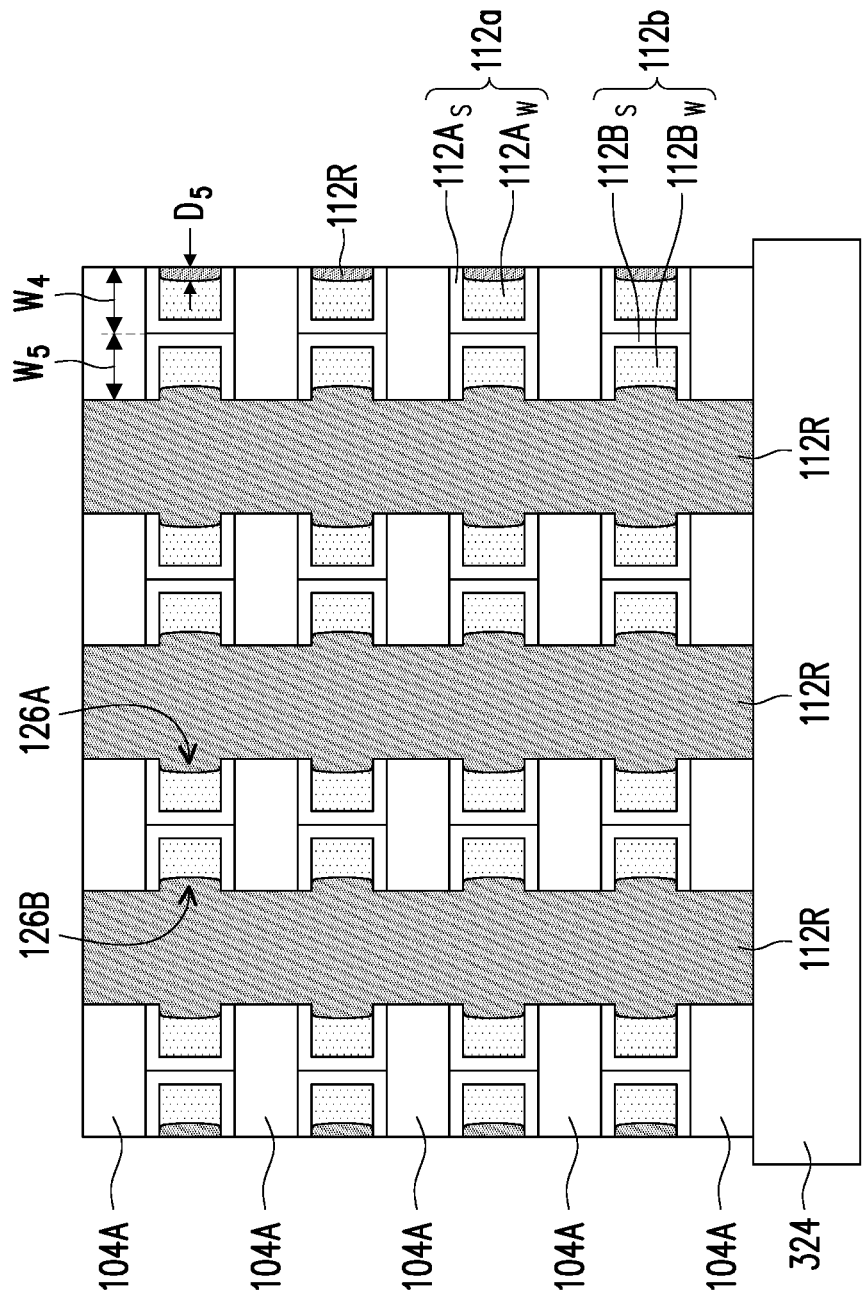
Figure 12C:
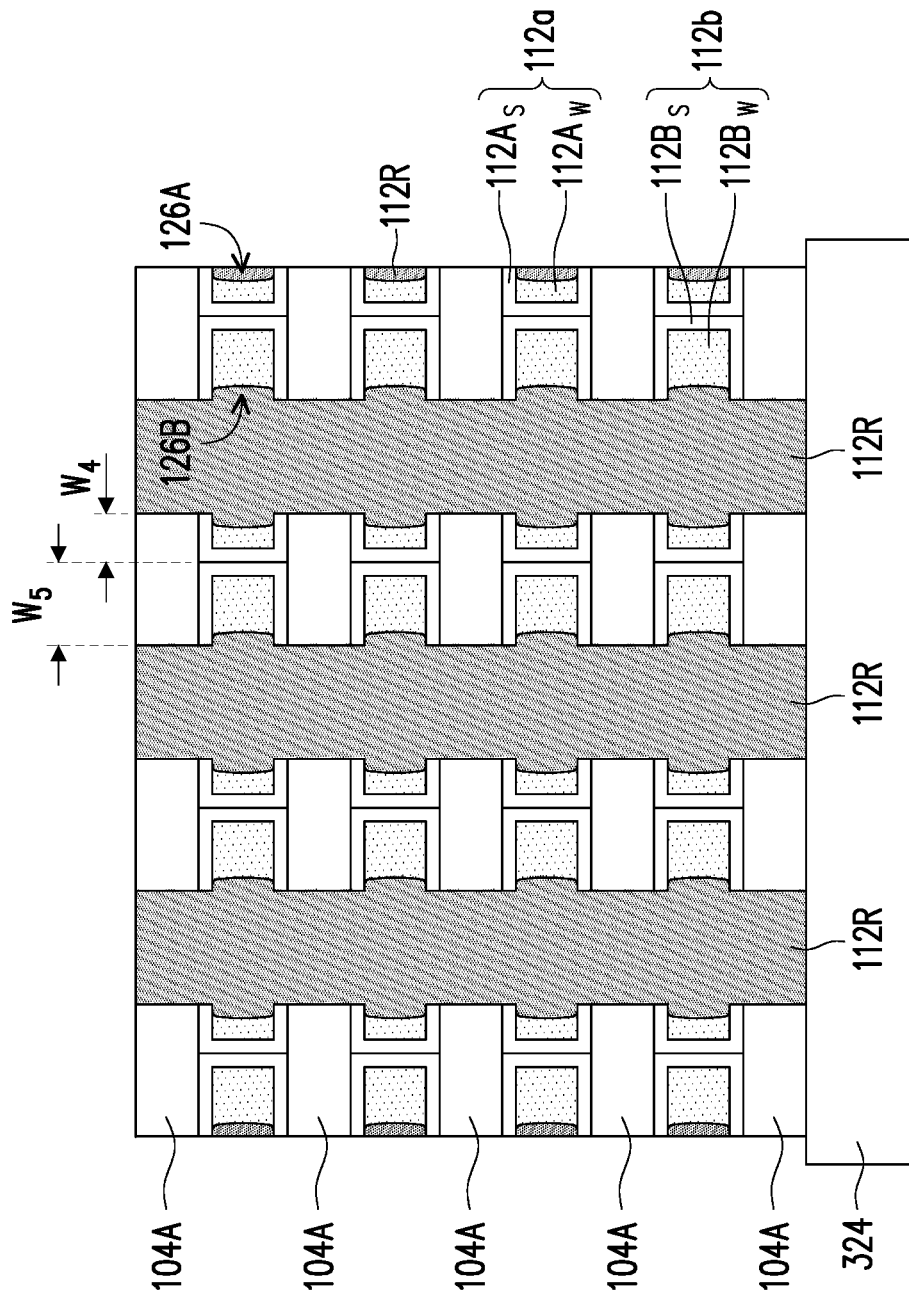

In FIGS. 12A-12C, second metal layers 112R are formed in the sidewall recesses 126A and 126B and to fill and/or overfill the first trenches 106 and second trenches 120, thus completing a process for replacing the portions of the first metal layer $112A_W$ and $112B_W$. The second metal layers 112R each includes a metal that has the absolute value of the Gibbs energy of metal oxide formation lower than the absolute value of the Gibbs energy of metal oxide formation of the first metal layer $112A_W$ and $112B_W$. In some embodiments where the first metal layer $112A_W$ and $112B_W$ formed of a metal, such as tungsten, cobalt, aluminum, nickel, copper, silver, gold, molybdenum, molybdenum nitride, alloys thereof, or the like, the second metal layers 112R is formed of a metal, such as ruthenium.

The metal material(s) of the second metal layers 112R may be formed by an acceptable deposition process such as ALD or CVD, an acceptable plating process such as electroplating or electroless plating, or the like. Once the second metal layers 112R have been deposited in order to fill and/or overfill the first trenches 106 and second trenches 120, the second metal layers 112R may be planarized to removed excess material outside of the first trenches 106 and second trenches 120, such that after the planarizing the second metal layers 112R the second metal layers 112R completely span a top portion of the first trenches 106 and second trenches 120. In an embodiment, the second metal layers 112R may be planarized using, e.g., a chemical mechanical planarization (CMP) process. However, any suitable planarization process, such as a grinding process, may also be utilized.

Figure 13A:
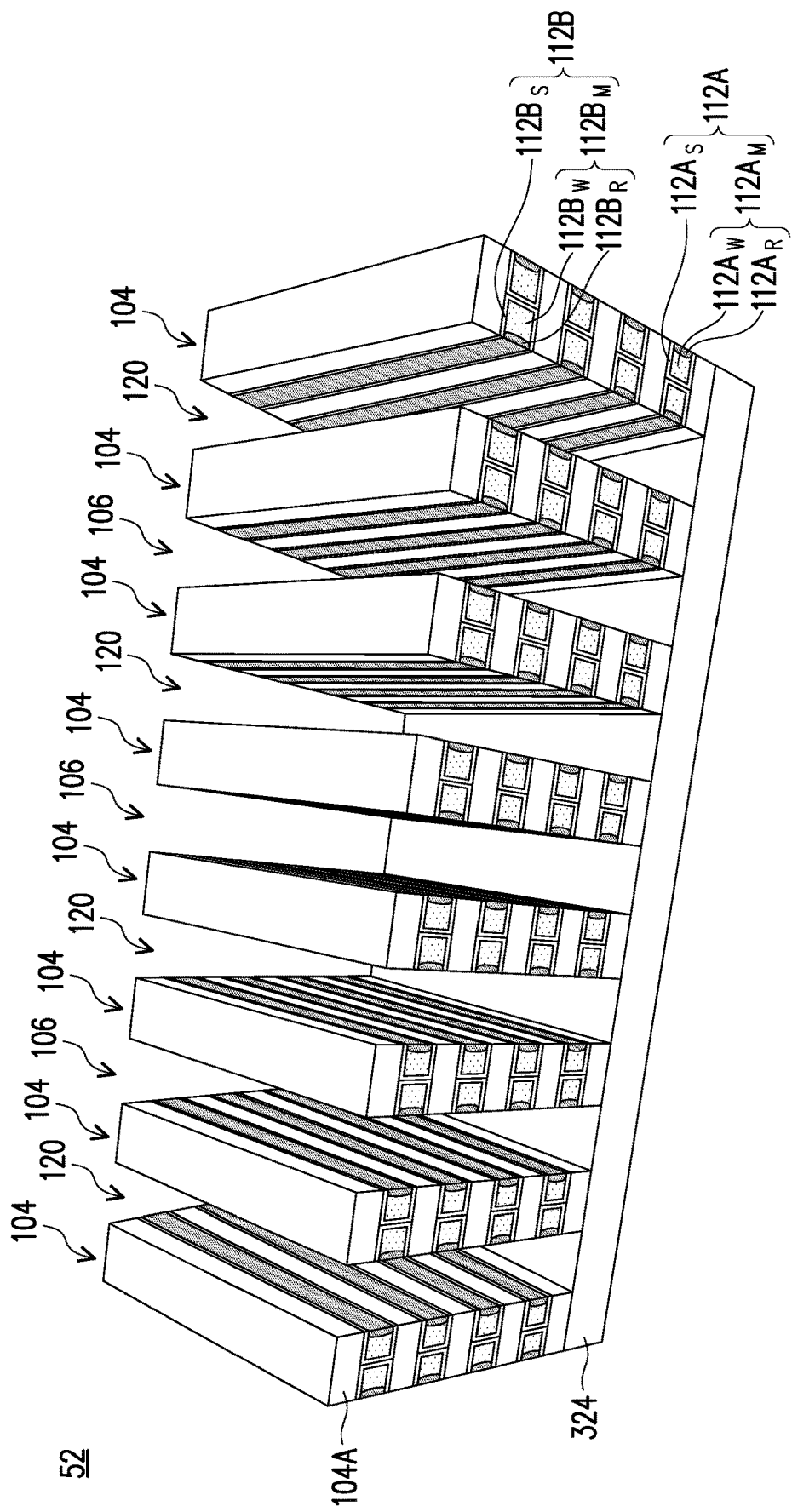
Figure 13B:
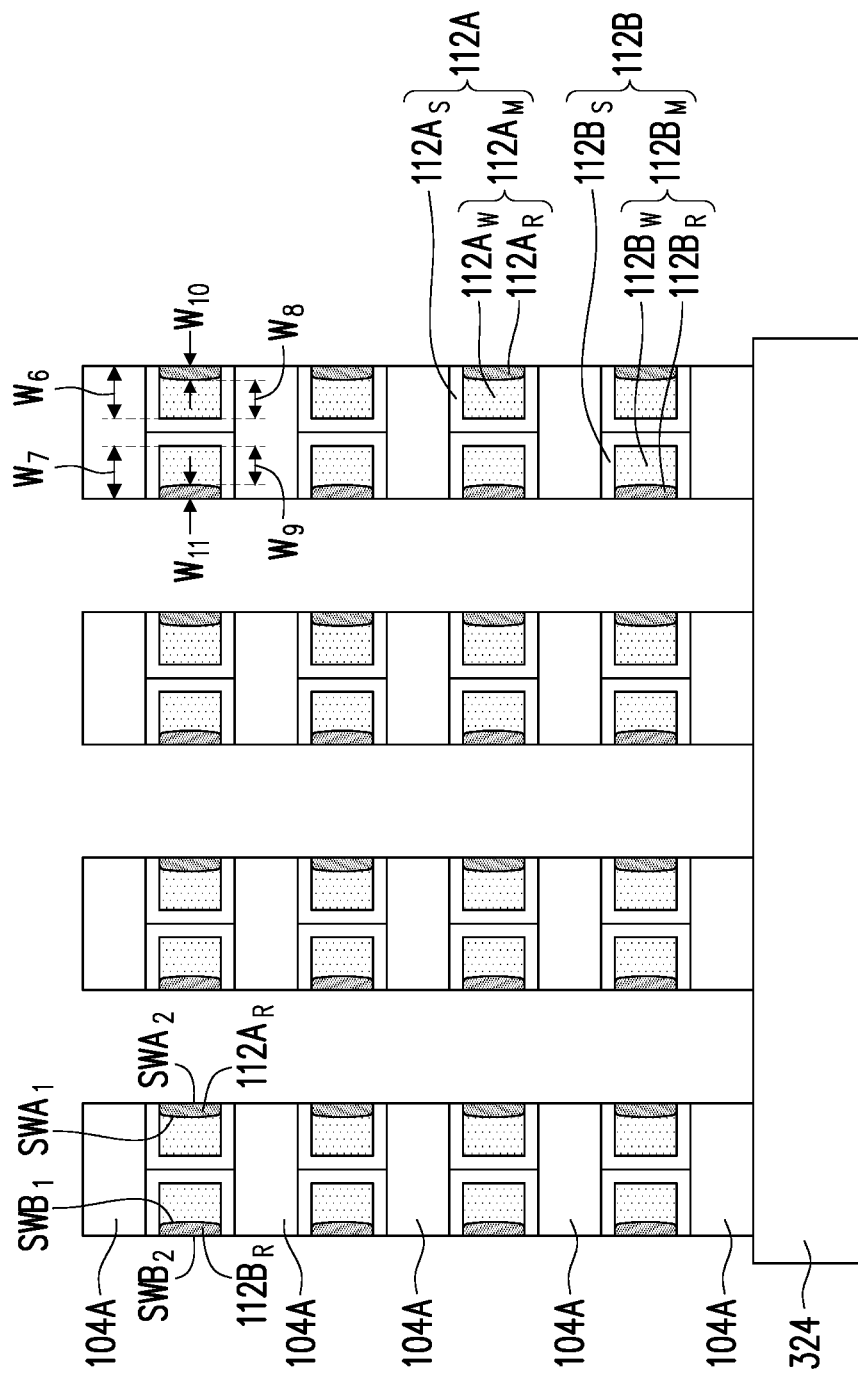
Figure 13C:
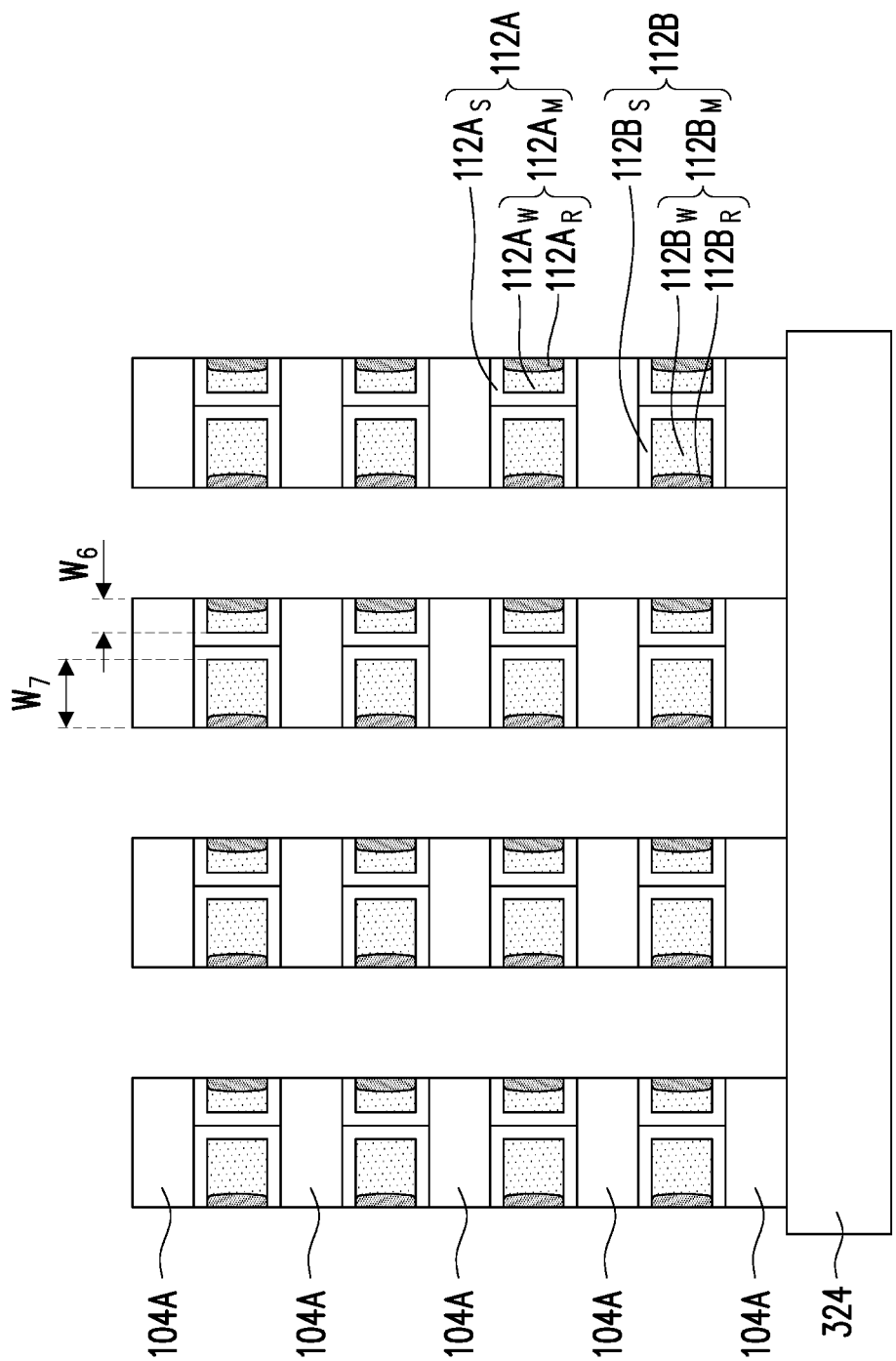

FIGS. 13A-13C illustrate an etch back process in order to remove excess portions of the second metal layers 112R and to expose the sidewalls of the first dielectric layers 104A. In an embodiment the etch back process is performed until the material of the second metal layers 112R that are not covered by the first dielectric layers 104A have been removed. As such, second metal layers 112A R are remained in the sidewall grooves 126A, and second metal layers 112B R are remained in the sidewall grooves 126B. The sidewalls $SWA_1$ and $SWA_2$ of the second metal layers $112A_R$, and sidewalls $SWB_1$ and $SWB_2$ of the second metal layers 112B R may have straight shapes, concave shapes or convex shapes. In some embodiments, the sidewalls $SWA_1$ of the second metal layers $112A_R$ and the sidewalls $SWB_1$ of the second metal layers $112B_R$ are convex, and the sidewalls $SWA_2$ of the second metal layers $112A_R$, and the sidewalls $SWB_2$ of the second metal layers $112B_R$ are straight. In some embodiments, the sidewalls $SWA_2$ of the second metal layers $112A_R$, and the sidewalls $SWB_2$ of the second metal layers $112B_R$ are substantially flush with the sidewalls of the dielectric layer layers 104A. In alternative embodiments, the sidewalls $SWA_2$ of the second metal layers $112A_R$, and the sidewalls $SWB_2$ of the second metal layers $112B_R$ are concave or convex with respect to the sidewalls of the dielectric layer layers 104A.

The first metal layers $112A_W$ and the second metal layers $112A_R$ are collectively referred to as bulk layers $112A_M$. The first metal layers $112B_W$ and the second metal layers $112B_R$ are collectively referred to as bulk layers $112B_M$. The bulk layers $112A_M$ and the glue layers $112A_S$ are collectively referred to as first conductive features 112A. The bulk layers $112B_M$ and the glue layers $112B_S$ are collectively referred to as second conductive features 112B. The first conductive features 112A and the second conductive features 112B are collectively referred to as conductive layers 112 or word lines 112 of the memory array 52. Thus, each pair of a first conductive feature 112A and a second conductive feature 112B functions as a single word line 112. Adjacent pairs of the first conductive features 112A and the second conductive features 112B are in physical contact with one another and are electrically coupled to one another.

The widths $W_6$ of the bulk layers $112A_M$ may be equal to, less than, or greater than the widths $W_7$ of the bulk layers $112B_M$. The widths $W_8$ of the first metal layers $112A_R$ may be equal to, less than, or greater than the width $W_9$ of the first metal layers $112B_R$. The widths $W_{10}$ of the second metal layers $112A_R$ may be equal to, less than, or greater than the width $W_{11}$ of the second metal layers $112B_R$. The widths $W_{10}$ is less than or equal to the width $W_8$, and the widths $W_{11}$ is less than or equal to the width $W_9$. The ratio R of the widths $W_{10}$ to the width $W_8$, or the ratio of the widths $W_{11}$ to the width $W_9$ is in the range of about 0.1 to about 1.0, for example. If the ratio R is less than 0.1, the thickness of the second metal layers $112A_R$ and $112B_R$ may be too thin. Therefore, when ferroelectric strips 114 are subsequently formed, a dielectric interface layer formed on the first metal layers 112AR and 112BR may not be effectively avoided. If the ratio R is greater than 1, the performance of the device may be affected because the second metal layers $112A_R$ and $112B_R$ with larger resistance value occupy more volume.

Figure 14A:
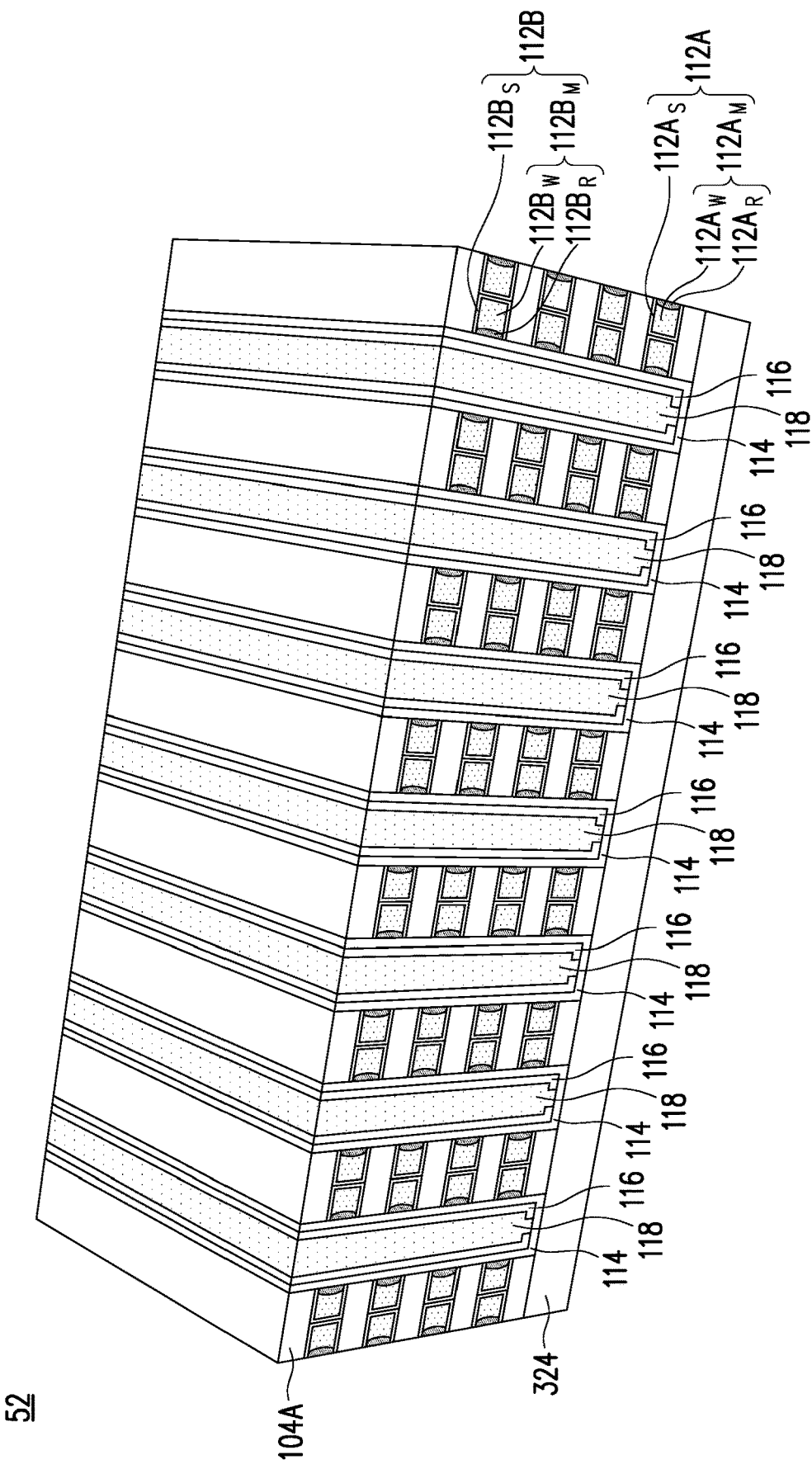
Figure 14B:
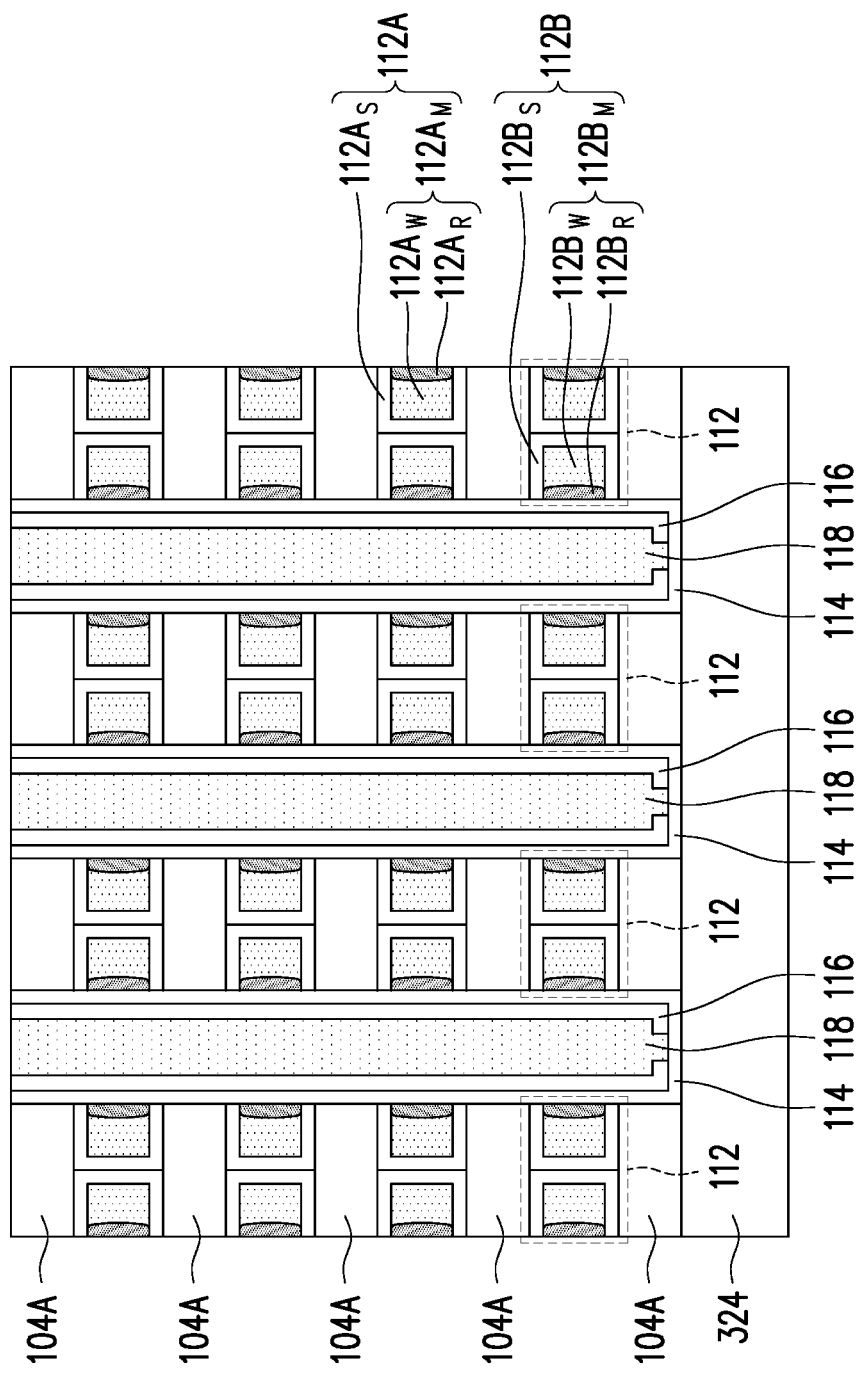

FIGS. 14A-14B illustrate TFT film stacks are formed in the first trenches 106 and the second trenches 120. Specifically, a ferroelectric strip 114, two semiconductor strips 116, and a dielectric layer 118 are formed in each of the first trenches 106 and the second trenches 120.

The ferroelectric strips 114 are data storage strips formed of an acceptable ferroelectric material for storing digital values, such as hafnium zirconium oxide (HfZrO); hafnium aluminum oxide (HfAlO), zirconium oxide (ZrO); hafnium oxide (HfO) doped with lanthanum (La), silicon (Si), aluminum (Al), or the like; undoped hafnium oxide (HfO); or the like. The material of the ferroelectric strips 114 may be formed by an acceptable deposition process such as ALD, CVD, physical vapor deposition (PVD), or the like. The ferroelectric strips 114 are separated from the first metal layers $112A_W$ and $112B_W$ by the second metal layers $112A_R$ and $112B_R$, respectively.

The first metal layers $112A_W$ and $112B_W$ may not be oxidized during the process of depositing the ferroelectric strips 114. The absolute values of the Gibbs energy of metal oxide formation of the second metal layers $112A_R$ and $112B_R$ are low. The second metal layers $112A_R$ and $112B_R$ are not easily oxidized during the process of depositing the ferroelectric strips 114. As a result, no dielectric interface layer is formed between the ferroelectric strips 114 and the second metal layers $112A_R$ and $112B_R$.

The channel strips 116 are formed of an acceptable semiconductor material for providing channel regions of TFTs, such as zinc oxide (ZnO), indium tungsten oxide (InWO), indium gallium zinc oxide (InGaZnO), indium zinc oxide (InZnO), indium tin oxide (ITO), indium gallium zinc tin oxide (IGZTO), polysilicon, amorphous silicon, or the like. The material of the channel strips 116 may be formed by an acceptable deposition process such as ALD, CVD, PVD, or the like.

The dielectric layers 118 are formed of a dielectric material. Acceptable dielectric materials include oxides such as silicon oxide and aluminum oxide; nitrides such as silicon nitride; carbides such as silicon carbide; the like; or combinations thereof such as silicon oxynitride, silicon oxycarbide, silicon carbonitride, or the like. The material of the dielectric layers 118 may be formed by an acceptable deposition process such as ALD, CVD, flowable CVD (FCVD), or the like.

The ferroelectric strips 114, the channel strips 116, and the dielectric layers 118 may be formed by a combination of deposition, etching, and planarization. For example, a ferroelectric layer may be conformally deposited on the multilayer stack 104 and in the first trenches 106 and second trench 120. A semiconductor layer may then be conformally deposited on the ferroelectric layer. The semiconductor layer can then be anisotropically etched to remove horizontal portions of the semiconductor layer, thus exposing the ferroelectric layer. A dielectric layer can then be conformally deposited on the remaining vertical portions of the semiconductor layer and the exposed portions of the ferroelectric layer. A planarization process is then applied to the various layers to remove excess materials over the multilayer stack 104. The planarization process may be a chemical mechanical polish (CMP), an etch-back process, combinations thereof, or the like. The portions of the ferroelectric layer, the semiconductor layer, and the dielectric layer remaining in the first trenches 106 and the second trenches 120 form the ferroelectric strips 114, the channel strips 116, and the dielectric layers 118, respectively. The planarization process exposes the multilayer stack 104 such that top surfaces of the multilayer stack 104, the ferroelectric strips 114, the channel strips 116, and the dielectric layers 118 are coplanar (within process variations) after the planarization process.

Figure 15A:
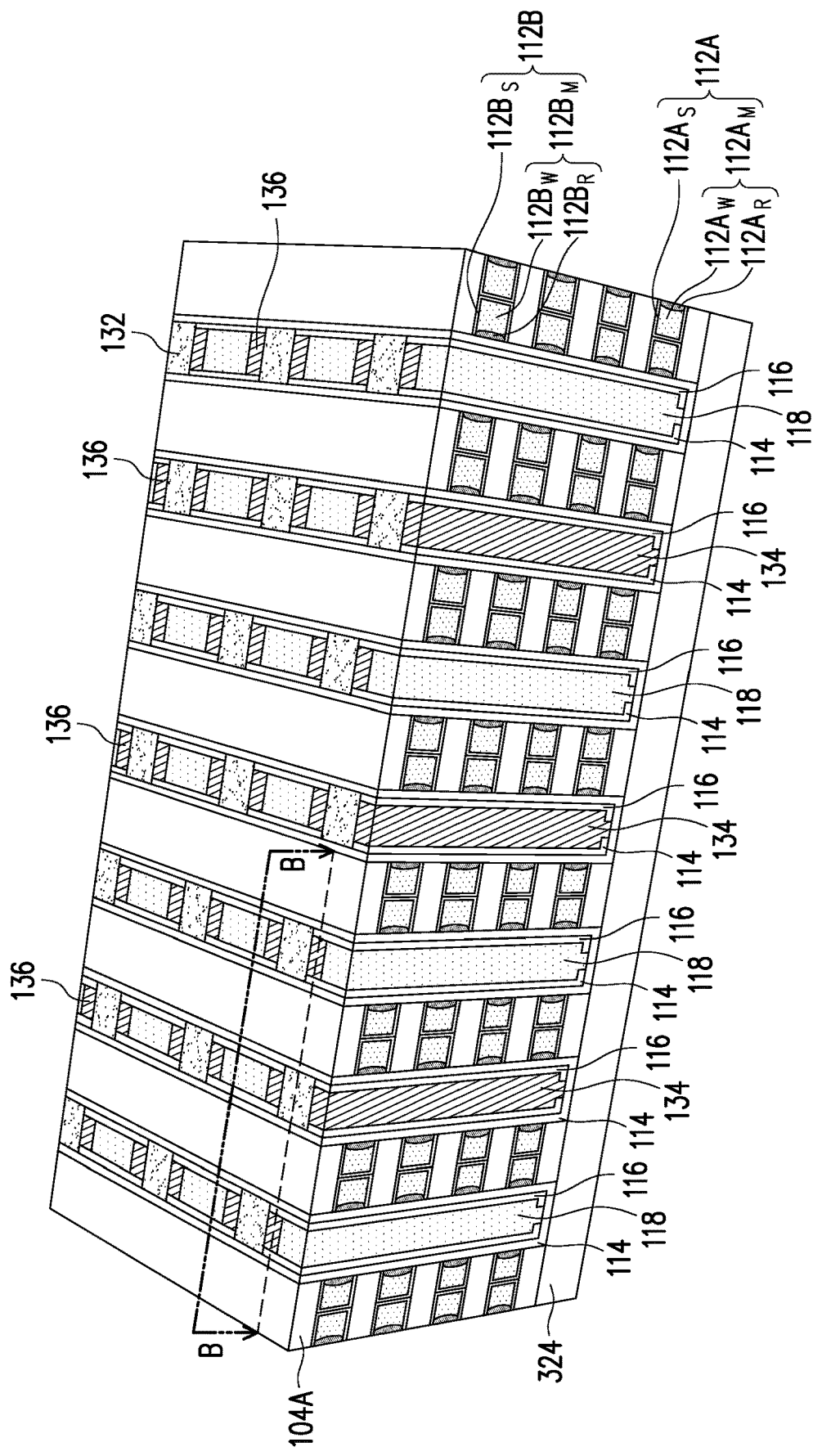
Figure 15B:
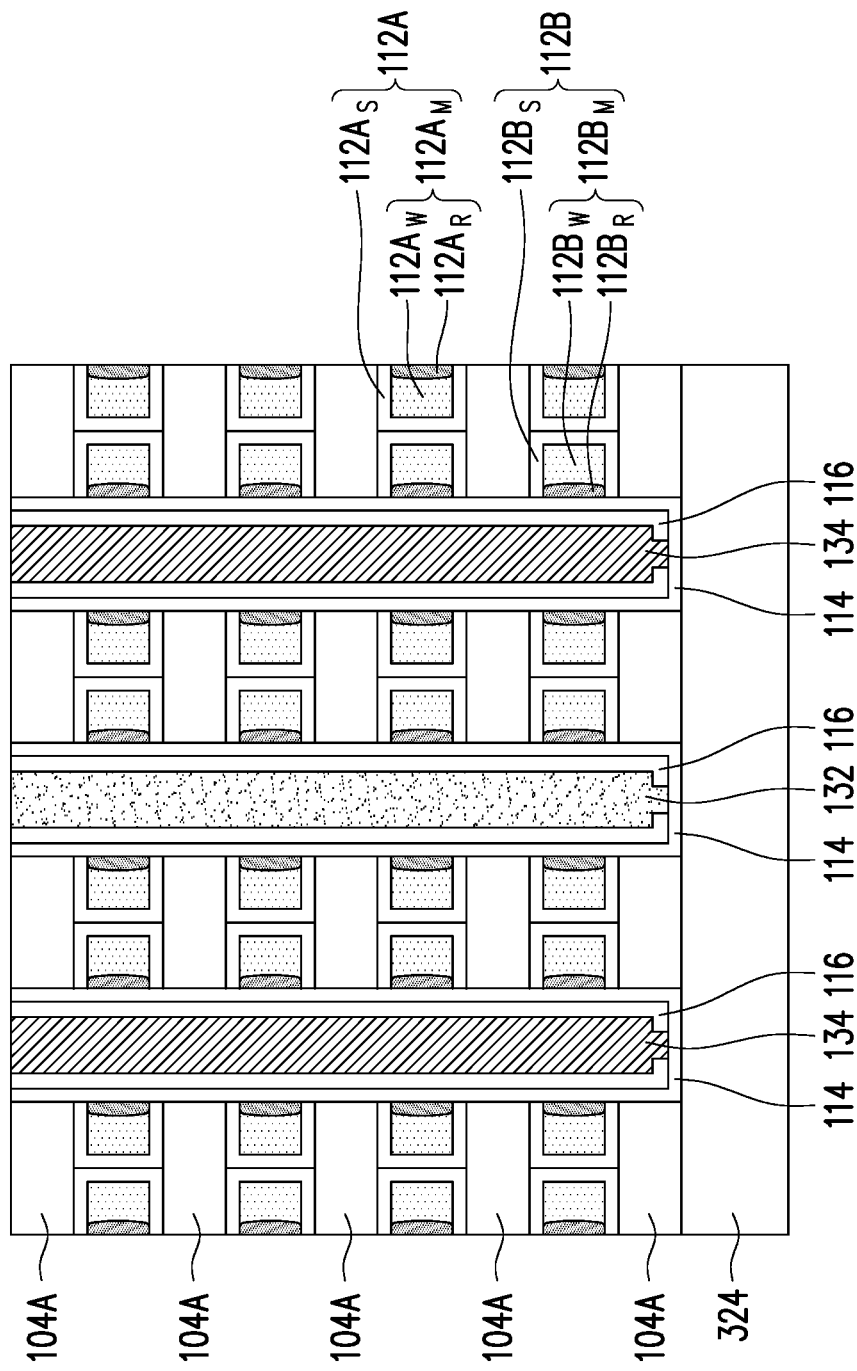

In FIGS. 15A and 15B, dielectric plugs 132 are formed through the dielectric layers 118 and the channel strips 116. The dielectric plugs 132 are isolation columns that will be disposed between adjacent TFTs, and will physically and electrically separate the adjacent TFTs. In the illustrated embodiment, the dielectric plugs 132 do not extend through the ferroelectric strips 114. Different regions of the ferroelectric strips 114 may be independently polarized, and thus the ferroelectric strips 114 can function to store values even when adjacent regions are not physically and electrically separated. In another embodiment, the dielectric plugs 132 are also formed through the ferroelectric strips 114. The dielectric plugs 132 further extend through the first dielectric layers 104A and any remaining portions of the second dielectric layers 104B.

As an example to form the dielectric plugs 132, openings for the dielectric plugs 132 may be formed through the dielectric layers 118 and the channel strips 116. The openings may be formed using acceptable photolithography and etching techniques. One or more dielectric material(s) are then formed in the openings. Acceptable dielectric materials include oxides such as silicon oxide; nitrides such as silicon nitride; carbides such as silicon carbide; the like; or combinations thereof such as silicon oxynitride, silicon oxycarbide, silicon carbonitride, or the like. The dielectric material(s) may be formed by an acceptable deposition process such as ALD, CVD, or the like. In some embodiments, silicon oxide or silicon nitride is deposited in the openings. A planarization process is then applied to the various layers to remove excess dielectric material(s) over the topmost first dielectric layer 104A. The planarization process may be a chemical mechanical polish (CMP), an etch-back process, combinations thereof, or the like. The remaining dielectric material(s) form the dielectric plugs 132 in the openings.

FIGS. 15A and 15B additionally illustrate that bit lines 134 and source lines 136 are formed through the dielectric layers 118. The bit lines 134 and the source lines 136 further extend through the first dielectric layers 104A and any remaining portions of the second dielectric layers 104B. The bit lines 134 and the source lines 136 act as source/drain regions of the TFTs. The bit lines 134 and the source lines 136 are conductive columns that are formed in pairs, with each semiconductor strip 116 contacting a corresponding bit line 134 and a corresponding source line 136. Each TFT comprises a bit line 134, a source line 136, a word line 112, and the regions of the semiconductor strip 116 and the ferroelectric strip 114 intersecting the word line 112. Each dielectric plug 132 is disposed between a bit line 134 of a TFT and a source line 136 of another TFT. In other words, a bit line 134 and a source line 136 are disposed at opposing sides of each of the dielectric plugs 132. Thus, each dielectric plug 132 physically and electrically separates adjacent TFTs.

As an example to form the bit lines 134 and the source lines 136, openings for the bit lines 134 and the source lines 136 may be formed through the dielectric layers 118. The openings may be formed using acceptable photolithography and etching techniques. Specifically, the openings are formed on opposing sides of the dielectric plugs 132. One or more conductive material(s), e.g., a glue layer and a bulk conductive material, are then formed in the openings. Acceptable conductive materials include metals such as tungsten, cobalt, aluminum, nickel, copper, silver, gold, alloys thereof, titanium nitride, tantalum nitride, combinations of these, or the like. The conductive material(s) may be formed by an acceptable deposition process such as ALD or CVD, an acceptable plating process such as electroplating or electroless plating, or the like. In some embodiments, tungsten is deposited in the openings. A planarization process is then applied to the various layers to remove excess conductive material(s) over the topmost first dielectric layer 104A. The planarization process may be a chemical mechanical polish (CMP), an etch-back process, combinations thereof, or the like. The remaining conductive material(s) form the bit lines 134 and the source lines 136 in the openings.

Figure 16B:
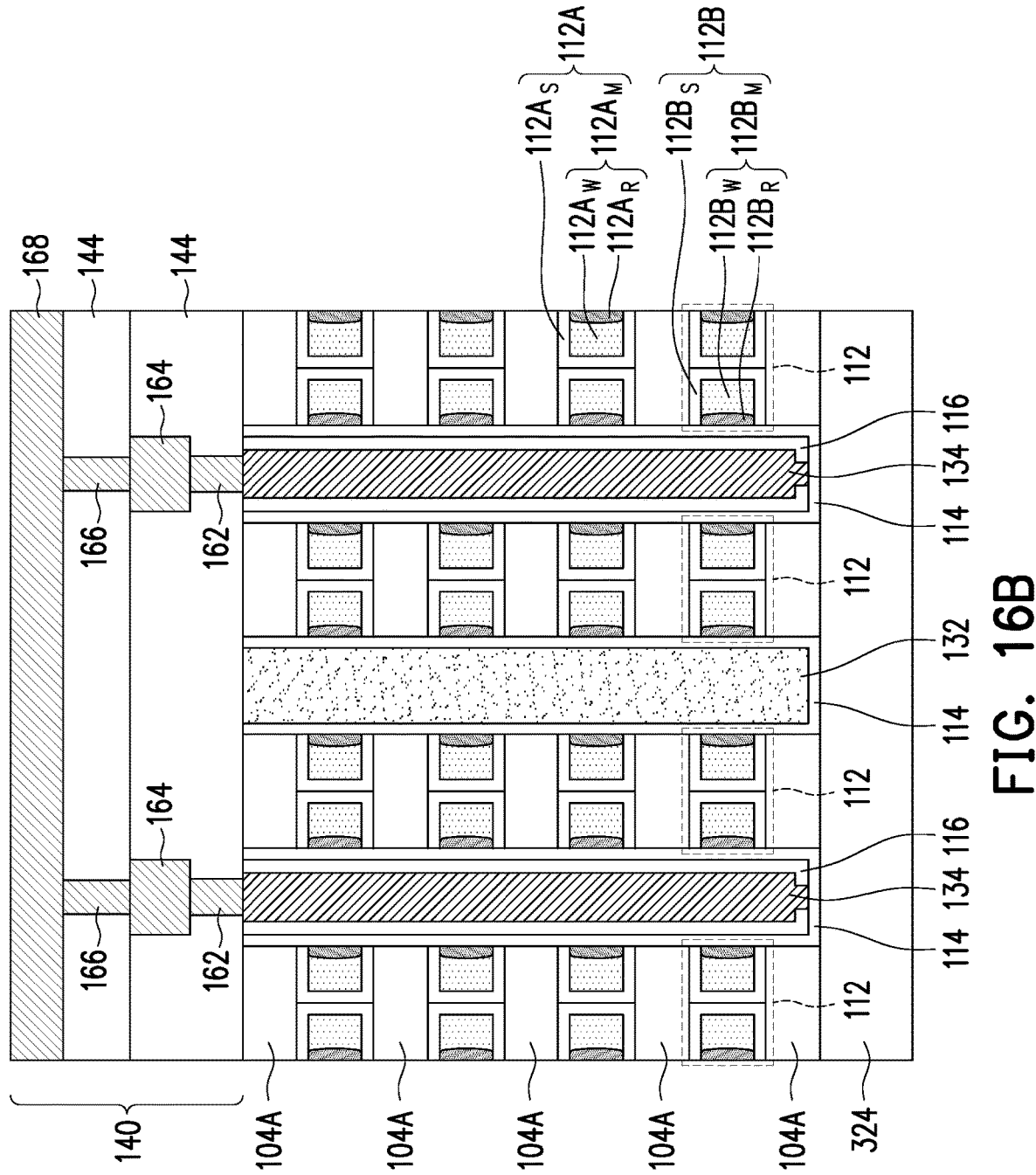
Figure 16C:
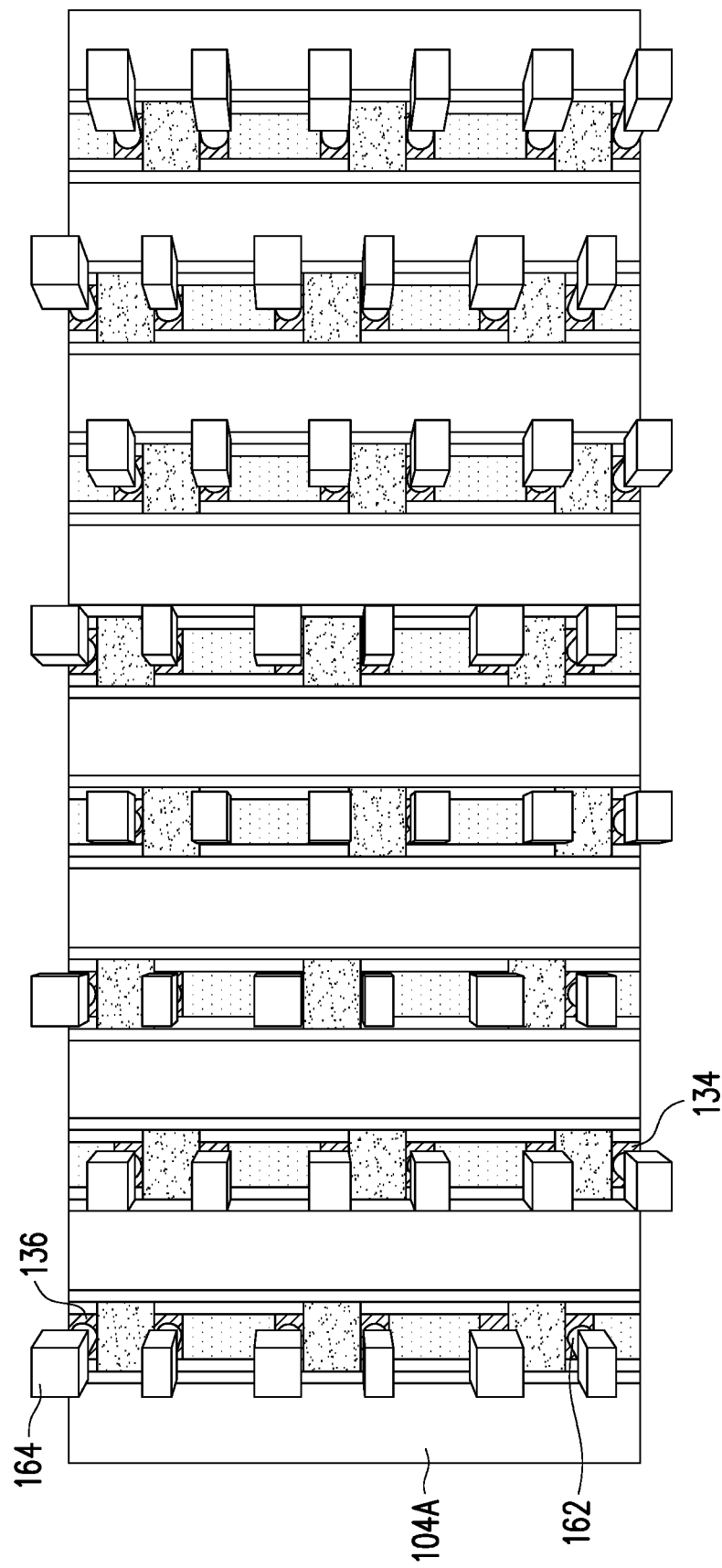
Figure 16D:
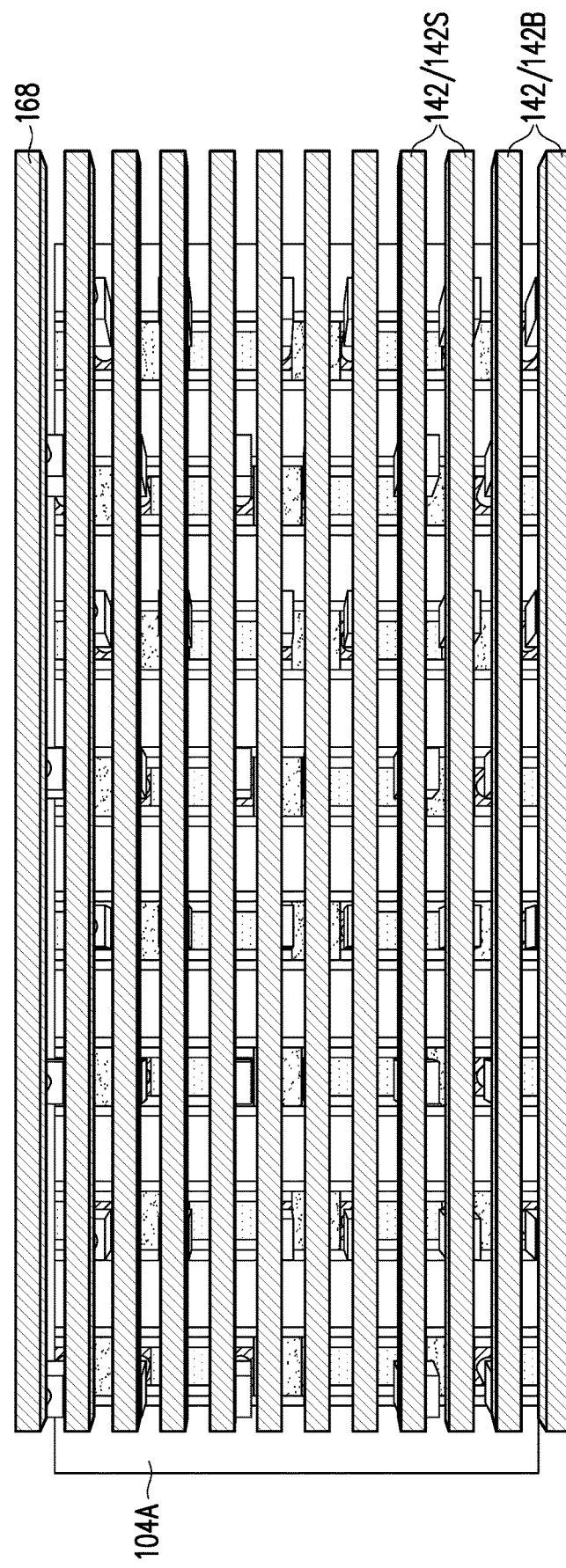

In FIGS. 16A, 16B, 16C and 16D, an interconnect structure 140 is formed over the intermediate structure, with FIG. 16B illustrating a cross-section view of the structure of FIG. 16A, FIG. 16C illustrating a top down view of the structure of FIG. 16A at the level of a first metal line 164, and FIG. 16D illustrating a top down view of the structure of FIG. 16A at the level of a metallization pattern 142. Only some features of the interconnect structure 140 are shown in FIG. 16A, for clarity of illustration. The interconnect structure 140 may include, e.g., metallization patterns 142 in a dielectric material 144. The dielectric material 144 may include one or more dielectric layers, such as one or more layers of a low-k (LK) or an extra low-K (ELK) dielectric material. The metallization patterns 142 may be metal interconnects (e.g., metal lines and vias) formed in the one or more dielectric layers. The interconnect structure 140 may be formed by a damascene process, such as a single damascene process, a dual damascene process, or the like.

In a particular embodiment that is illustrated, the metallization patterns 142 of the interconnect structure 140 comprise a first via 162 which makes contact to the bit lines 134 and the source lines 136, a first metal line 164 (e.g., a first top metal line), a second via 166, and a second metal line 168 (e.g., a second top metal line). Each of these may be formed by depositing a portion of the dielectric material 144 (not separately illustrated in FIG. 16A for clarity), forming patterns within the portion of the dielectric material 144, filling the patterns with one or more conductive materials, and planarizing the conductive materials with the dielectric material 144. However, any suitable number of vias and conductive lines may be utilized, and all such layers of connectivity are fully intended to be included within the scope of the embodiments.

In some embodiments, the metallization patterns 142 include bit line interconnects 142B (which are electrically coupled to the bit lines 134) and source line interconnects 142S (which are electrically coupled to the source lines 136). The adjacent bit lines 134 are connected to different bit line interconnects 142B, which helps avoid shorting of the adjacent bit lines 134 when their common word line 112 is activated. Similarly, the adjacent source lines 136 are connected to different source line interconnects 142S, which helps avoid shorting of the adjacent source lines 136 when their common word line 112 is activated.

As may be seen in FIG. 16C, the first vias 162 within the metallization patterns 142 of the interconnect structure 140 are electrically coupled to the bit lines 134 and the source lines 136. In this embodiment, the bit lines 134 and the source lines 136 are formed in a staggered layout, where adjacent bit lines 134 and adjacent source lines 136 are laterally offset from one another along the first direction $D_1$ (see FIG. 1C). Thus, each word line 112 is laterally disposed between a dielectric plug 132 and one of a bit line 134 or a source line 136. The first vias 162 connected to the bit lines 134 and the first vias 162 connected to the source lines 136 each extend along the second direction $D_2$ (see FIG. 1C), e.g., along the columns of the memory array 52. The first vias 162 connected to the bit lines 134 are connected to alternating ones of the bit lines 134 along the columns of the memory array 52. The first vias 162 connected to the source line interconnects 142S are connected to alternating ones of the source lines 136 along the columns of the memory array 52. Laterally offsetting the bit lines 134 and the source lines 136 obviates the need for lateral interconnects along the columns of the memory array 52, thus allowing the overlying metallization patterns 142 to the bit lines 134 and the source lines 136 to be straight conductive segments. In another embodiment the bit lines 134 and the source lines 136 may not be formed in a staggered layout, and instead lateral interconnection is accomplished in the interconnect structure 140.

FIG. 16D illustrates the straight conductive segments within the overlying metallization patterns 142 (e.g., the second metal line 168). As may be seen, because the underlying connections have been formed in a staggered formation, the bit line interconnects 142B and the source line interconnects 142S may be placed in a straight line formation without the need for lateral interconnects. Such alignment greatly increases the line density in the metallization layers.

Figure 17A:
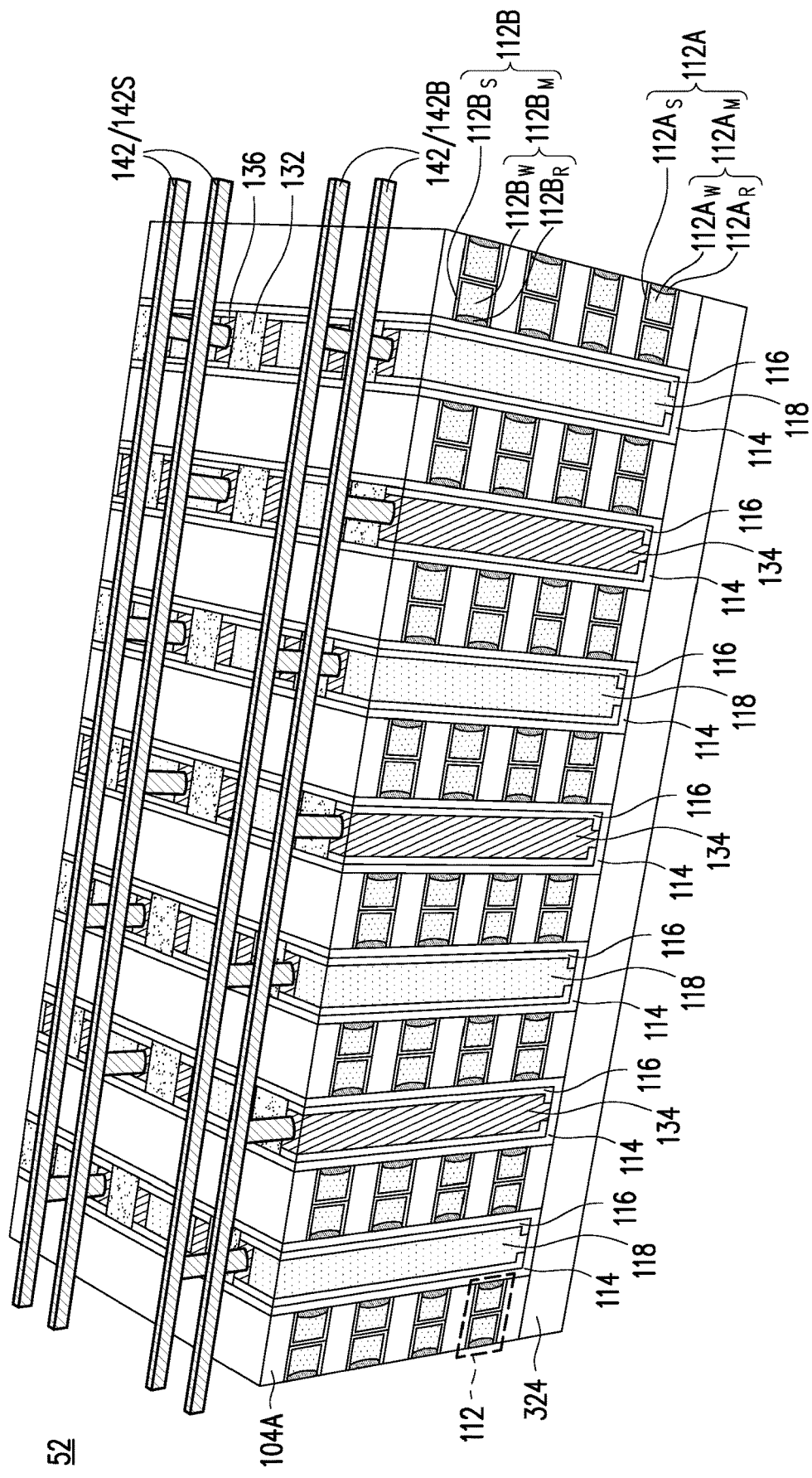
FIGS. 17A and 17B are various views of a memory array, in accordance with some other embodiments.
Figure 17B:
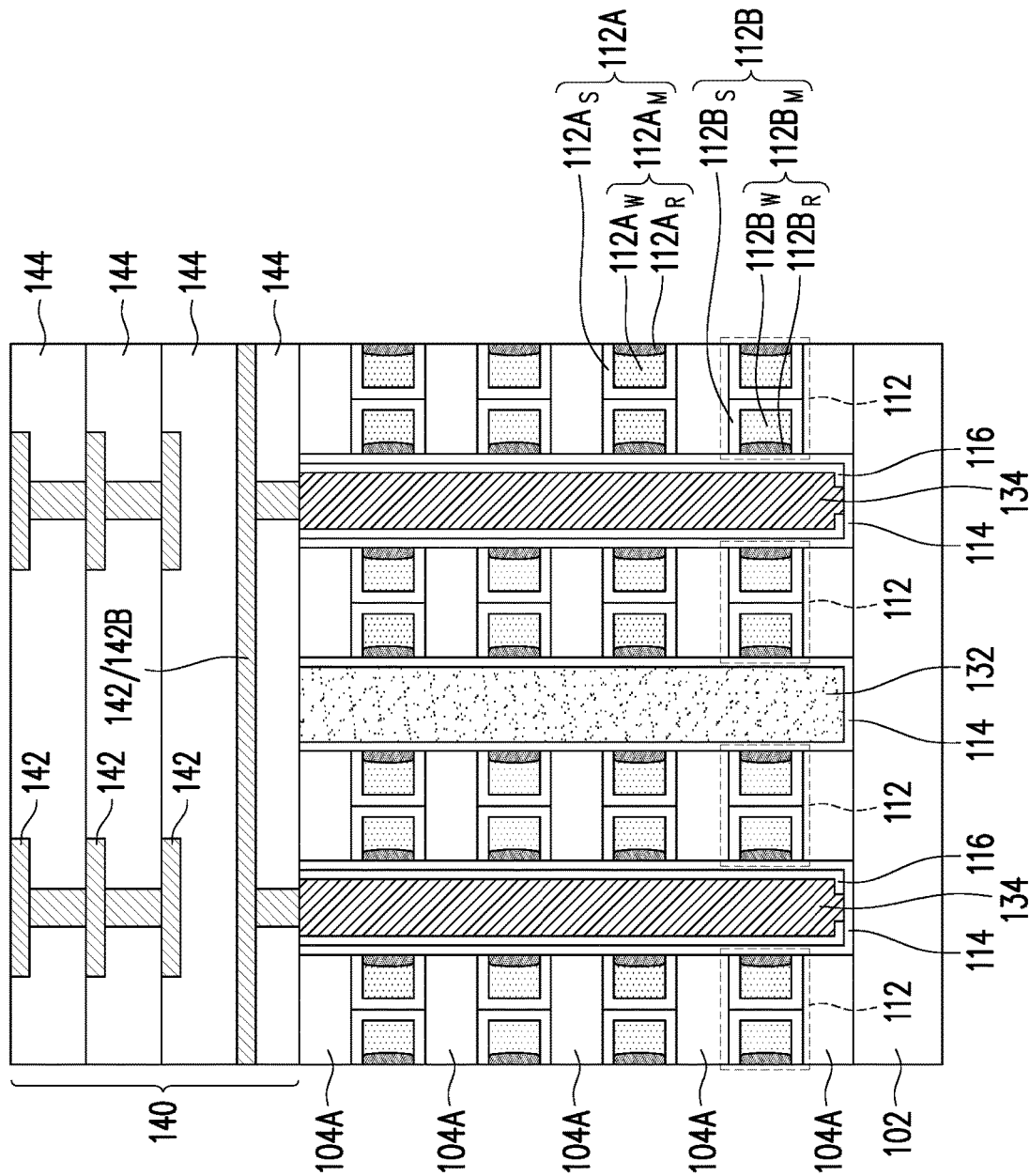

FIGS. 17A and 17B are various views of a memory array 52, in accordance with some other embodiments. A portion of the memory array 52 is illustrated. Some features, such as the staircase arrangement of the word lines (see FIG. 1C), are not shown for clarity of illustration. FIG. 17A is a three-dimensional view of the memory array 52, and FIG. 17B is a cross-sectional view showing a similar cross-section as reference cross-section B-B in FIG. 15A.

In this embodiment, the glue layer 112A$_S$ and the glue layer 112B$_S$ are formed of different materials in order to help lower the overall resistivity. For example, the glue layer 112A$_S$ may be formed of a first glue material (e.g., titanium nitride) and the glue layer 112B$_S$ may be formed of a second glue material (e.g., tantalum nitride) that has a different resistivity. As such, the glue layer 112A$_S$ and the glue layer 112B$_S$ may not merge during formation such that they are separate and distinct from each another.

Figure 18A:
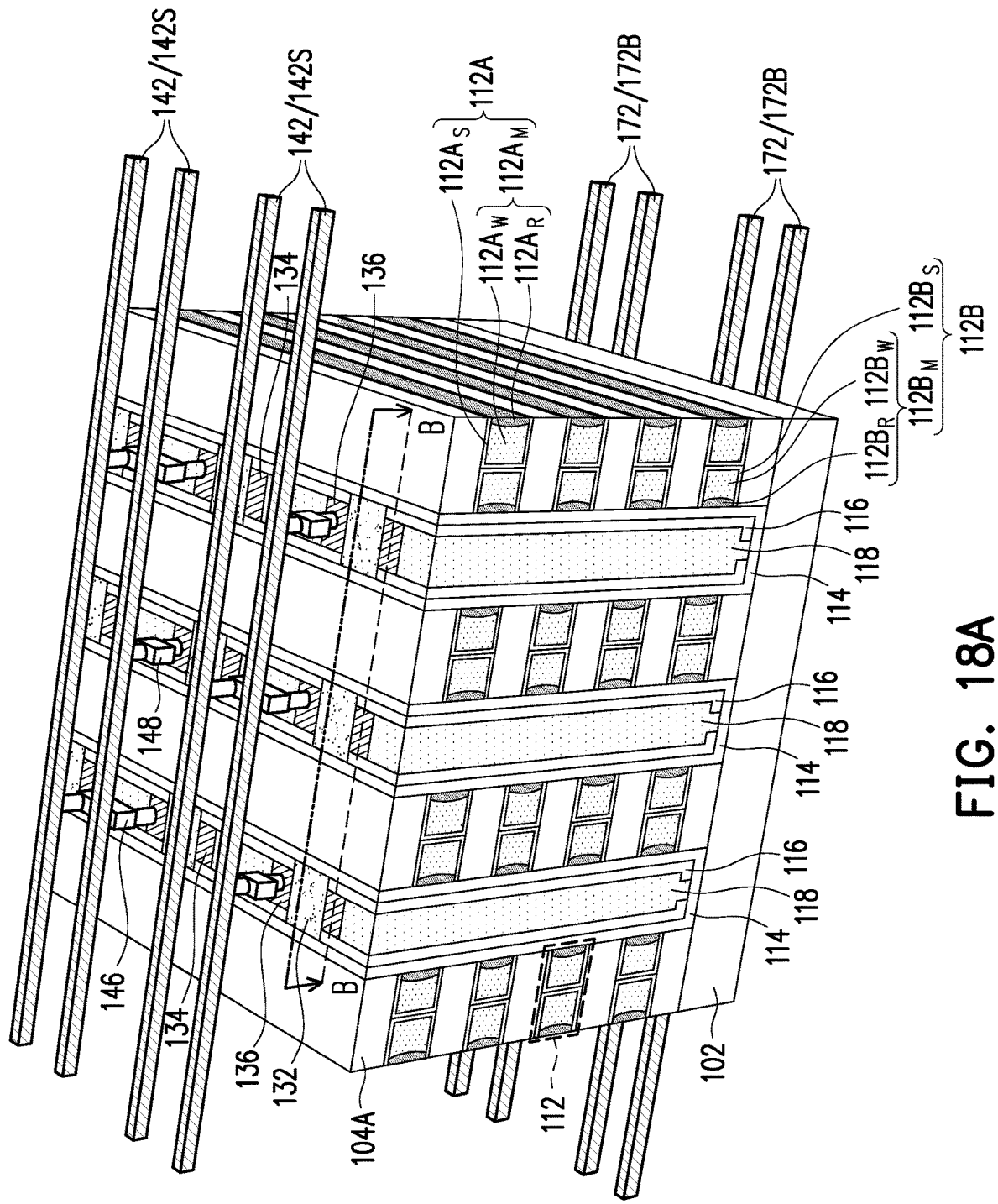
FIGS. 18A and 18B are various views of a memory array, in accordance with some other embodiments.
Figure 18B:
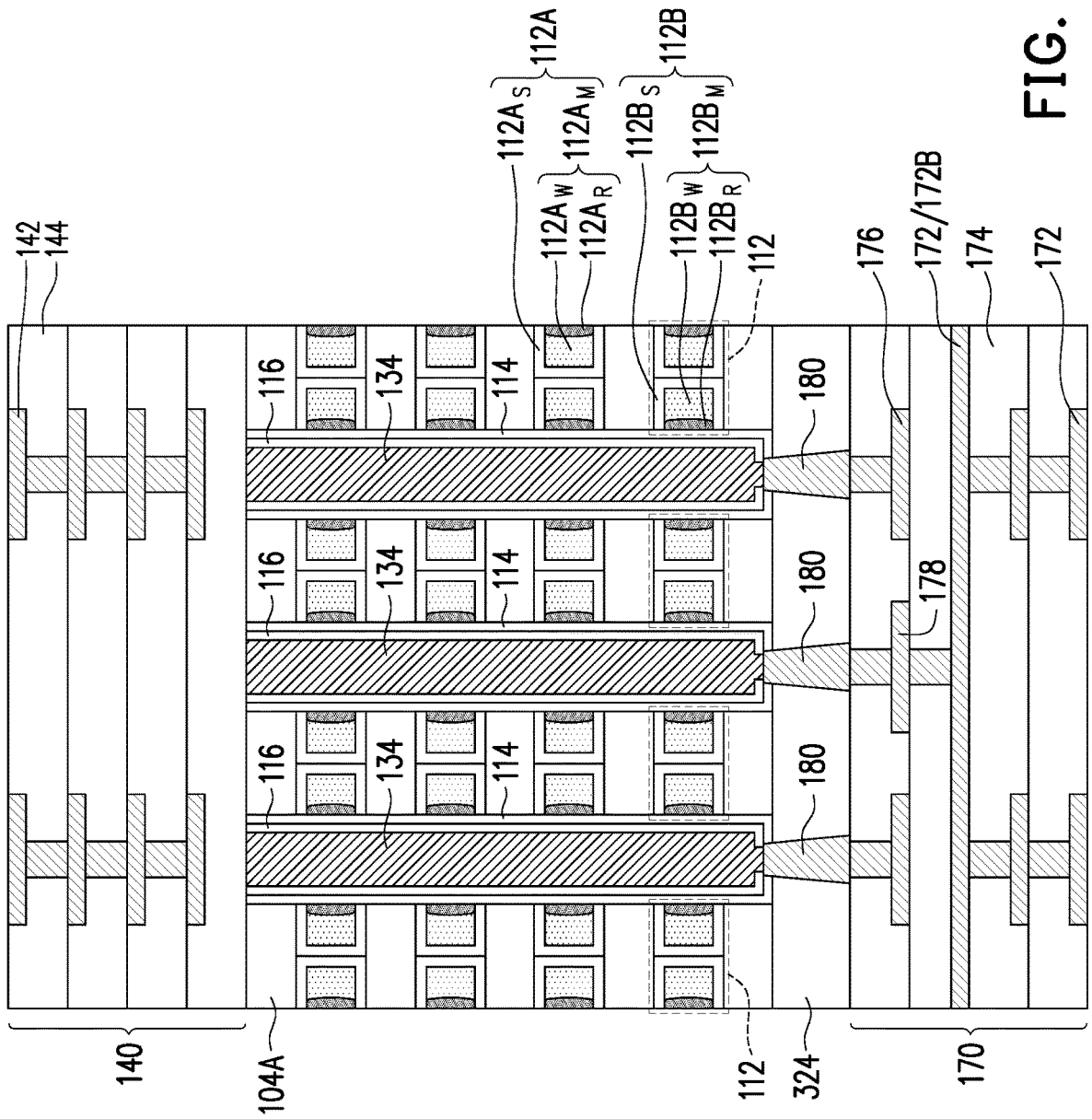

FIGS. 18A and 18B are various views of a memory array 52, in accordance with some other embodiments. A portion of the memory array 52 is illustrated. Some features, such as the staircase arrangement of the word lines (see FIG. 1C), are not shown for clarity of illustration. FIG. 18A is a three-dimensional view of the memory array 52, and FIG. 18B is a cross-sectional view shown along reference cross-section B-B in FIG. 18A.

In this embodiment, the metallization patterns 142 of the interconnect structure 140 only include source line interconnects 142S. Another interconnect structure 170 is formed at an opposite side of the substrate 102 from the interconnect structure 140. The interconnect structure 170 may be formed in a similar manner as the interconnect structure 140. The interconnect structure 170 may include, e.g., metallization patterns 172 in a dielectric material 174. Conductive vias 180 may be formed through the substrate 102 and the ferroelectric strips 114 to electrically couple the metallization patterns 172 to the bit lines 134 and/or the source lines 136. For example, the metallization patterns 172 include bit line interconnects 172B (which are electrically coupled to the source lines 136 by the conductive vias 180).

Further, in this embodiment, the bit lines 134 and the source lines 136 are not formed in a staggered layout, and thus adjacent bit lines 134 and adjacent source lines 136 are laterally aligned with one another along the first direction D$_1$ (see FIG. 1C). Thus, each word line 112 is laterally disposed between a pair of bit lines 134 or a pair of source lines 136. Because the bit lines 134 and the source lines 136 are not formed in a staggered layout, lateral interconnection to a subset of the source line interconnects 142S is accomplished in the interconnect structure 140, and lateral interconnection to a subset of the bit line interconnects 172B is accomplished in the interconnect structure 170. For example, the source line interconnects 142S are straight conductive segments that are formed at an intermediate level of the interconnect structure 140. Lateral interconnects 146 between a first subset of the source line interconnects 142S and the source lines 136 are formed at a lower level of the interconnect structure 140 than the source line interconnects 142S. Straight interconnects 148 between a second subset of the source line interconnects 142S and the source lines 136 are formed at a lower level of the interconnect structure 140 than the source line interconnects 142S. Similarly, the bit line interconnects 172B are straight conductive segments that are formed at an intermediate level of the interconnect structure 170. Lateral interconnects 176 between a first subset of the bit line interconnects 172B and the bit lines 134 are formed at a lower level of the interconnect structure 170 than the bit line interconnects 172B. Straight interconnects 178 between a second subset of the bit line interconnects 172B and the bit lines 134 are formed at a lower level of the interconnect structure 140 than the bit line interconnects 172B.

It should be appreciated that the layouts of the interconnect structures 140, 170 may be flipped in other embodiments. For example, the metallization patterns 142 of the interconnect structure 140 can include bit line interconnects, and the metallization patterns 172 of the interconnect structure 170 can include source line interconnects.

Figure 19A:
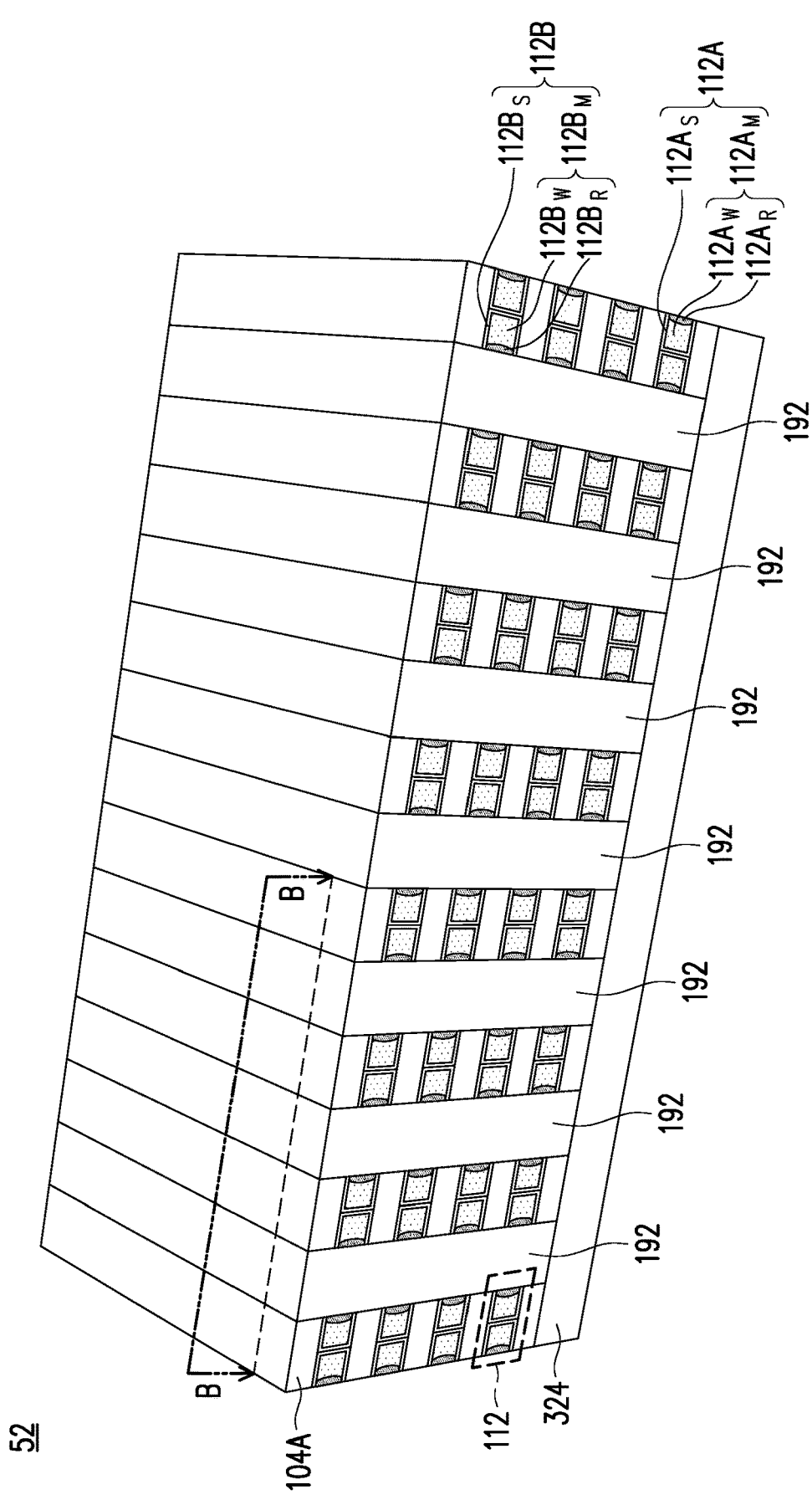
FIGS. 19A and 19B are various views of a memory array, in accordance with some other embodiments.
Figure 19B:
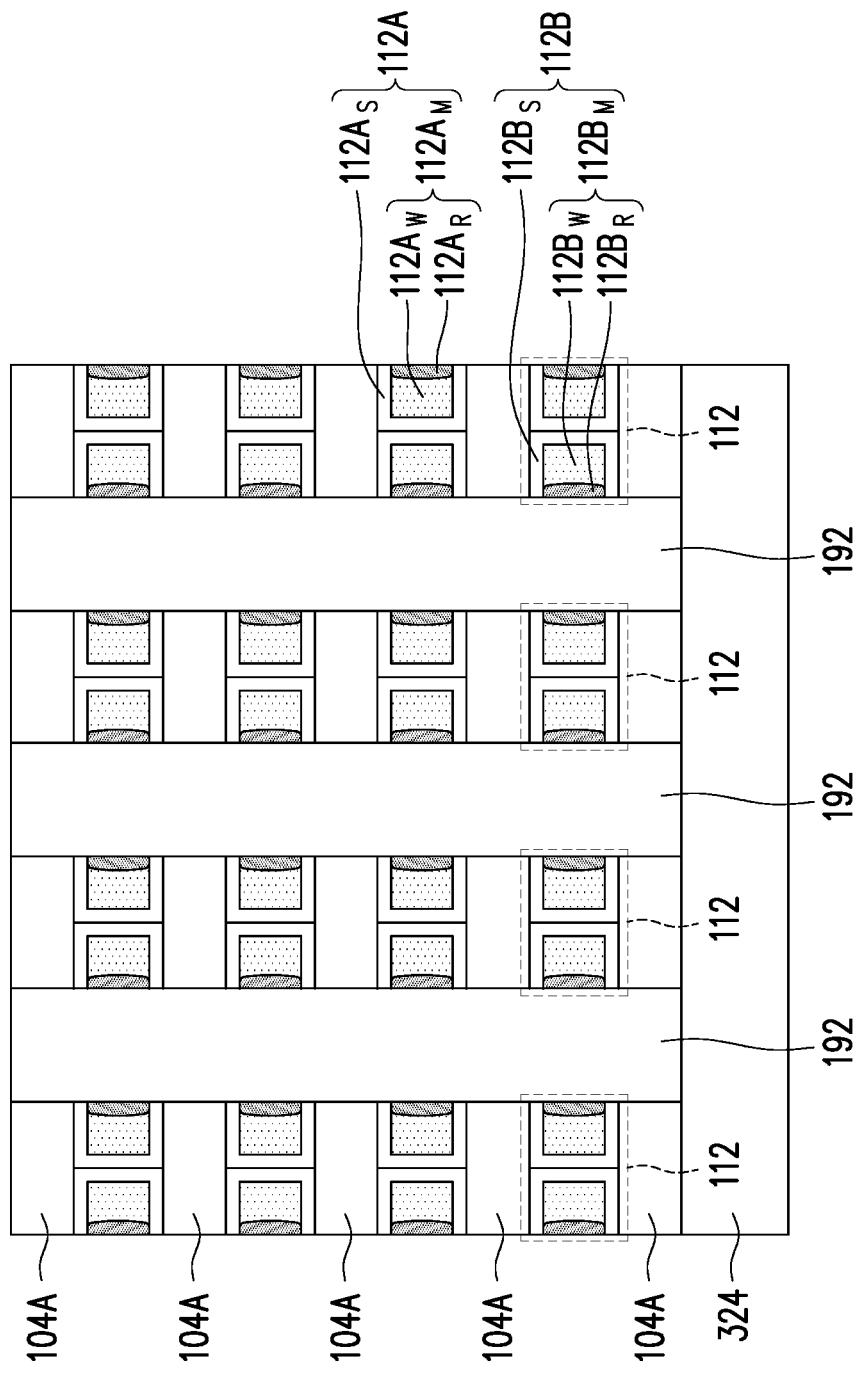
Figure 20A:
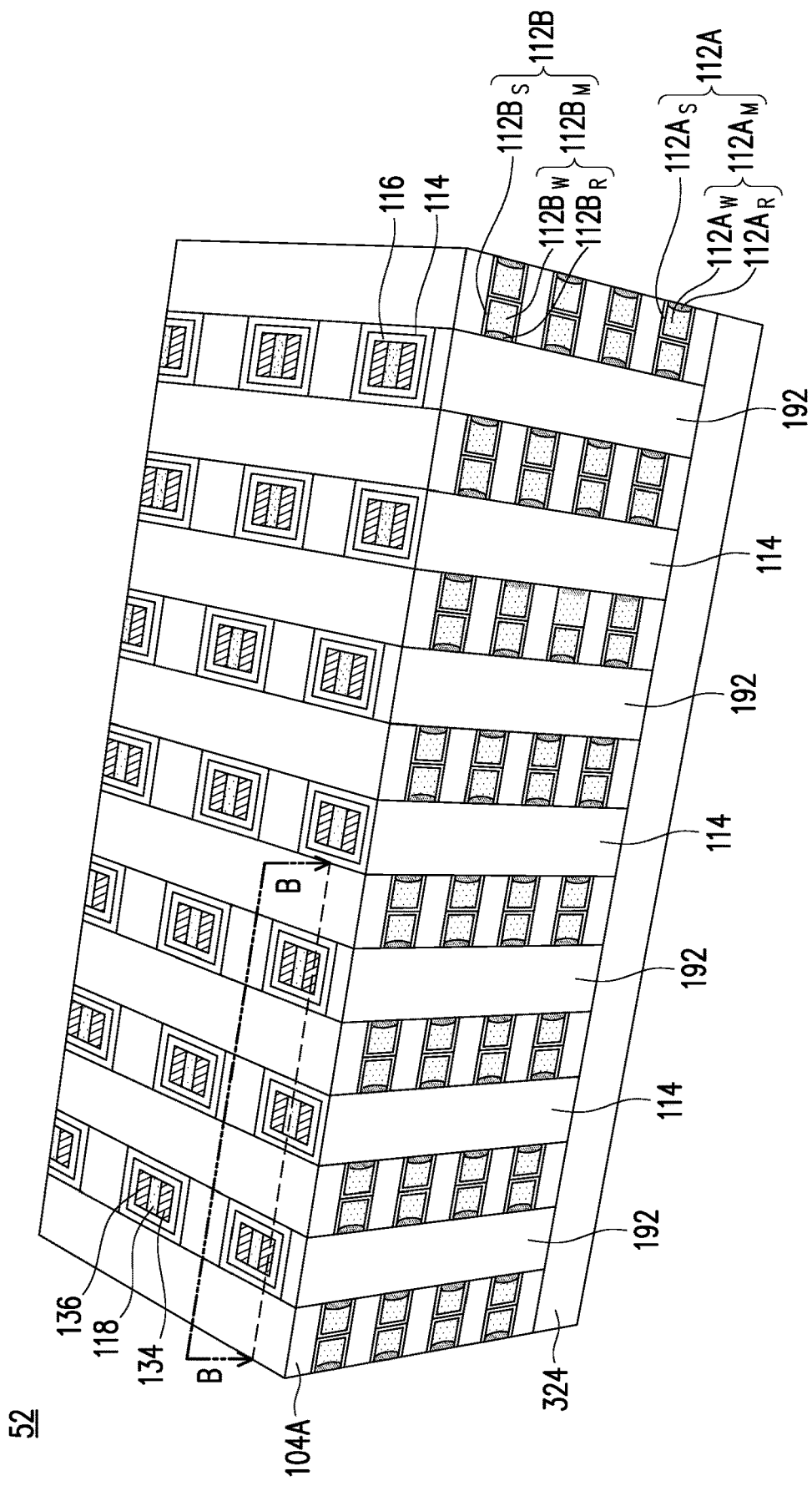
FIGS. 20A through 20D are various views of intermediate stages in the manufacturing of a memory array, in accordance with some other embodiments.
Figure 20B:
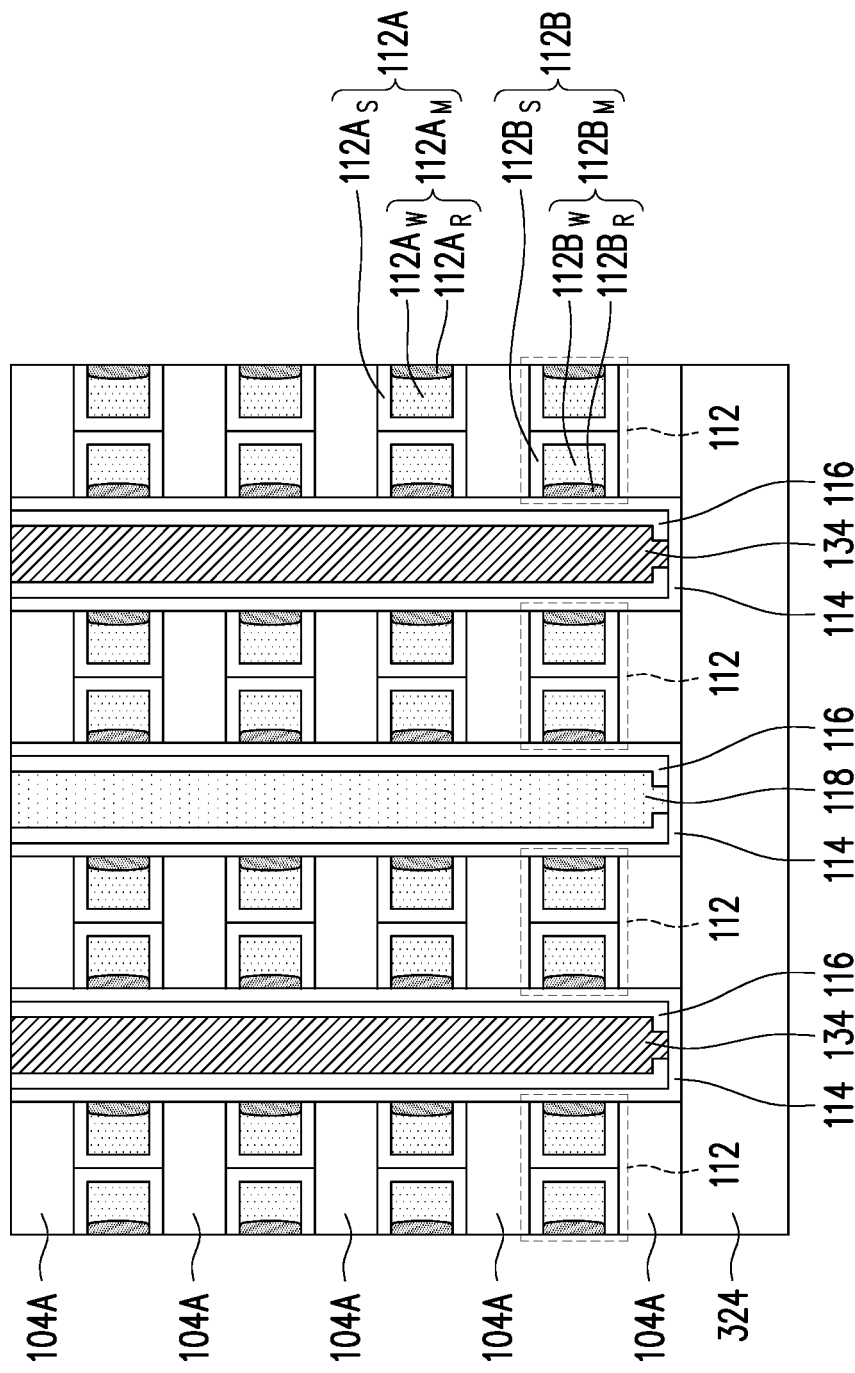
Figure 20D:
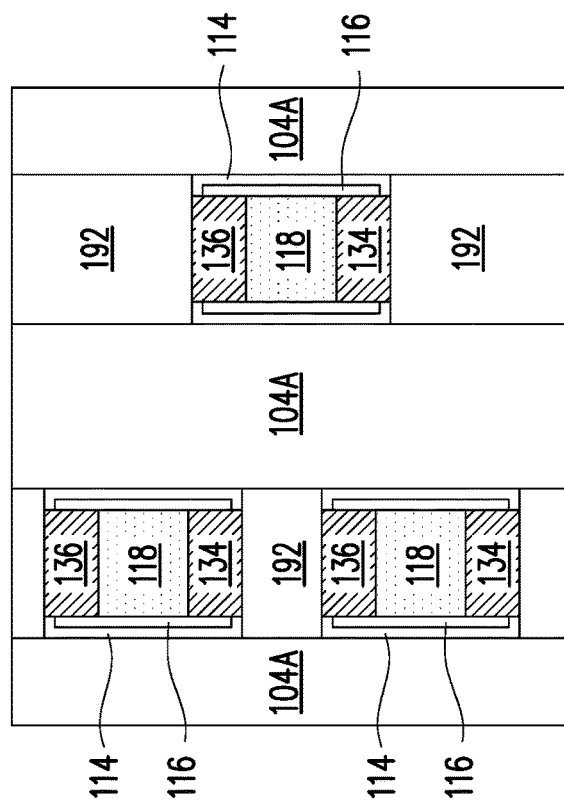

FIGS. 19A through 20D are various views of intermediate stages in the manufacturing of a memory array 52, in accordance with some other embodiments. A portion of the memory array 52 is illustrated. Some features, such as the staircase arrangement of the word lines (see FIG. 1C), are not shown for clarity of illustration. FIGS. 19A and 20A are three-dimensional views of the memory array 52. FIGS. 19B and 20B are a cross-sectional view shown along reference cross-section B-B in Figure FIGS. 20C and 20D are top-down views of a portion of the memory array 52.

In FIGS. 19A and 19B, a structure similar to that described with respect to FIGS. 16A and 16B is obtained, however, the ferroelectric strips 114, the channel strips 116, and the dielectric layers 118 are not formed at this step of processing. Instead, the first trenches 106 (see FIGS. 4A and 4B) and the second trenches 120 (see FIGS. 8A and 8B) are each filled with an insulating layer 192. The insulating layers 192 are formed of a dielectric material. Acceptable dielectric materials include oxides such as silicon oxide; nitrides such as silicon nitride; carbides such as silicon carbide; the like; or combinations thereof such as silicon oxynitride, silicon oxycarbide, silicon carbonitride, or the like. The dielectric material(s) may be formed by an acceptable deposition process such as ALD, CVD, or the like. In some embodiments, silicon oxide is deposited in the first trenches 106 and the second trenches 120. Planarization processes may be applied to the various layers to remove excess dielectric materials over the topmost first dielectric layer 104A. The planarization process may be a chemical mechanical polish (CMP), an etch-back process, combinations thereof, or the like. For example, a first planarization process may be performed after the first trenches 106 are filled to form the insulating layers 192, and a second planarization process may be performed after the second trenches 120 are filled to form the insulating layers 192.

In FIGS. 20A and 20B, TFT film stacks are formed extending through the insulating layers 192. The TFT film stacks each include a ferroelectric strip 114, a semiconductor strip 116, and a dielectric layer 118. Bit lines 134 and source lines 136 are then formed through at least the dielectric layers 118.

The ferroelectric strips 114, the channel strips 116, and the dielectric layers 118 may be formed by a combination of deposition, etching, and planarization. For example, openings may be formed through the insulating layers 192. The openings may be formed using acceptable photolithography and etching techniques. A ferroelectric layer may be conformally deposited on sidewalls of the openings through the insulating layers 192. A channel layer can then be conformally deposited on the ferroelectric layer. The semiconductor layer can then be anisotropic ally etched to remove horizontal portions of the semiconductor layer, thus exposing the ferroelectric layer. A dielectric layer can then be conformally deposited on the remaining vertical portions of the semiconductor layer and the exposed portions of the ferroelectric layer. A planarization process is then applied to the various layers to remove excess materials over the topmost first dielectric layer 104A. The planarization process may be a chemical mechanical polish (CMP), an etch-back process, combinations thereof, or the like. The portions of the ferroelectric layer, the channel layer, and the dielectric layer remaining in the openings through the insulating layers 192 form the ferroelectric strips 114, the channel strips 116, and the dielectric layers 118, respectively. The planarization process exposes the topmost first dielectric layer 104A such that top surfaces of the topmost first dielectric layer 104A, the ferroelectric strips 114, the channel strips 116, and the dielectric layers 118 are coplanar (within process variations) after the planarization process.

Figure 20C:
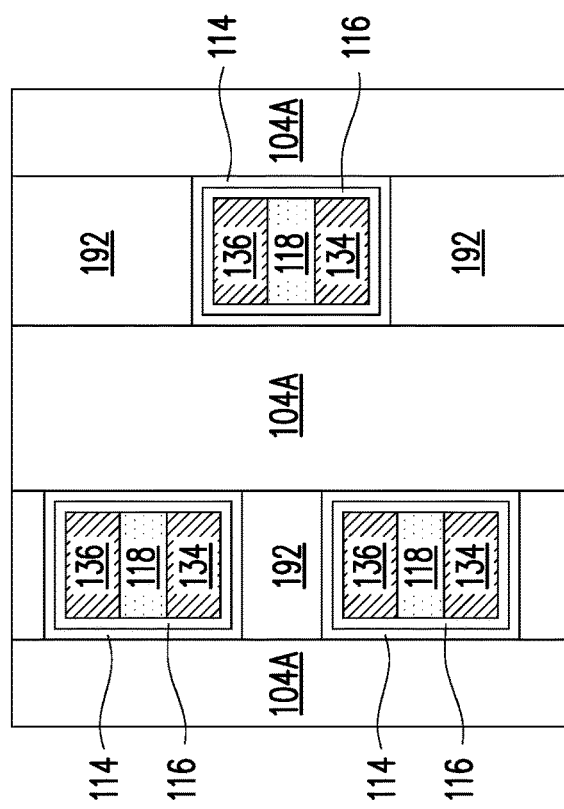
Figure 22A:
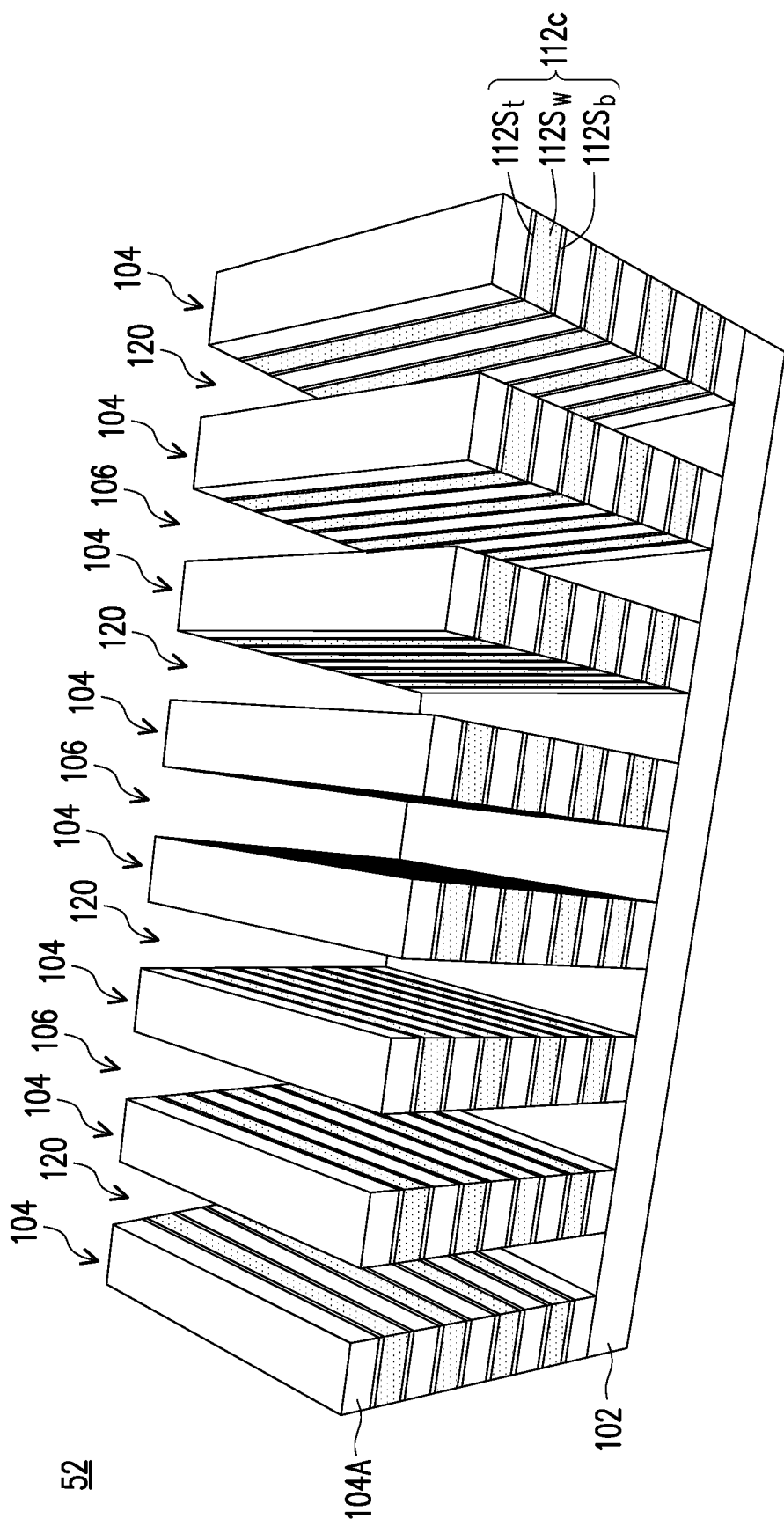
Figure 22B:
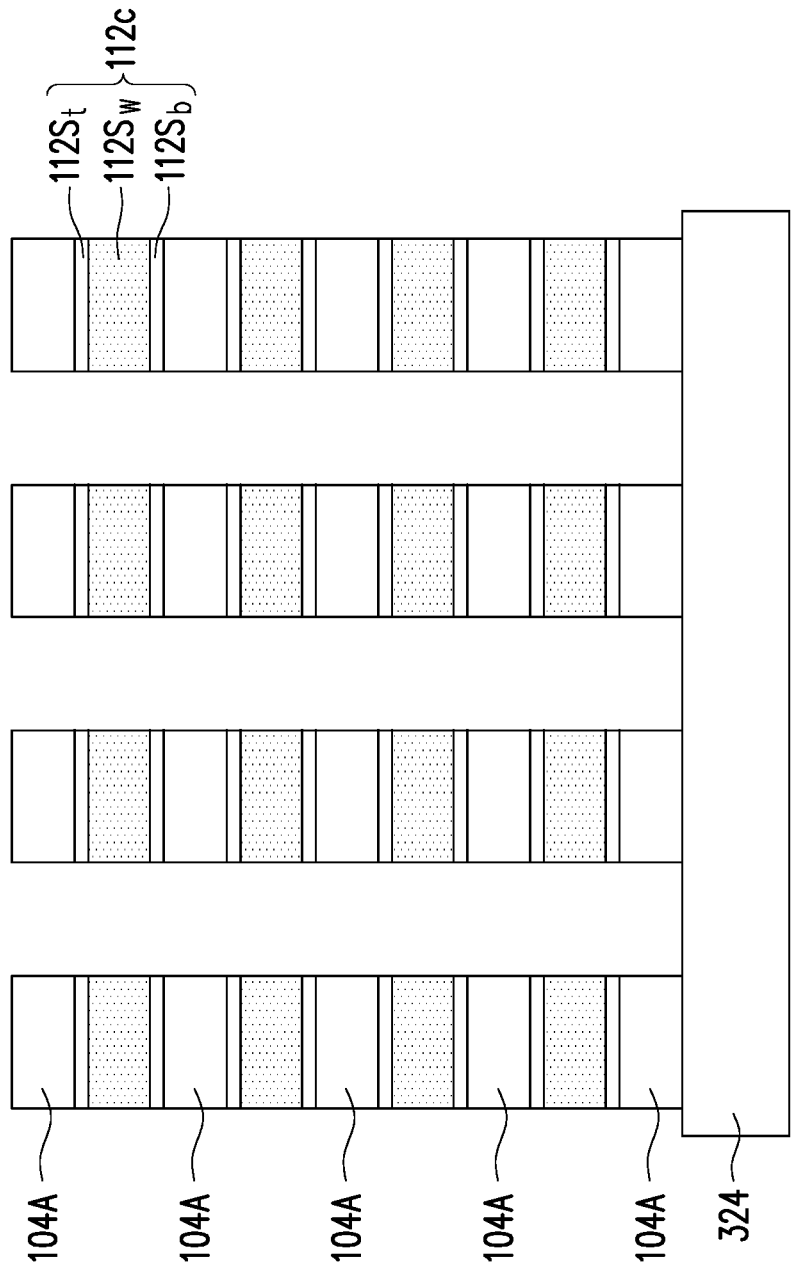

As an example to form the bit lines 134 and the source lines 136, openings for the bit lines 134 and the source lines 136 may be formed through the dielectric layers 118, and optionally also the ferroelectric strips 114 and the channel strips 116. The openings may be formed using acceptable photolithography and etching techniques. Specifically, the openings are formed so that they oppose the sides of the remaining portions of the dielectric layers 118. In some embodiments, the openings only extend through the dielectric layers 118, so that the bit lines 134 and the source lines 136 only extend through the dielectric layers 118 (as shown by FIG. 20C). In alternative embodiments, the openings also extend through the ferroelectric strips 114 and the channel strips 116, so that the bit lines 134 and the source lines 136 also extend through the ferroelectric strips 114 and the channel strips 116. One or more conductive material(s) are then formed in the openings (as shown by FIG. 20D). Acceptable conductive materials include metals such as tungsten, cobalt, aluminum, nickel, copper, silver, gold, alloys thereof, or the like. The conductive material(s) may be formed by an acceptable deposition process such as ALD or CVD, an acceptable plating process such as electroplating or electroless plating, or the like. In some embodiments, tungsten is deposited in the openings. A planarization process is then applied to the various layers to remove excess conductive material(s) over the topmost first dielectric layer 104A. The planarization process may be a chemical mechanical polish (CMP), an etch-back process, combinations thereof, or the like. The remaining conductive material(s) form the bit lines 134 and the source lines 136 in the openings. Interconnects may then be formed over (or under) the bit lines 134 and the source lines 136, using similar techniques as those discussed above, so that the bit lines 134 and the source lines 136 may be coupled to bit line interconnects and source lines interconnects, respectively.

Figure 24A:
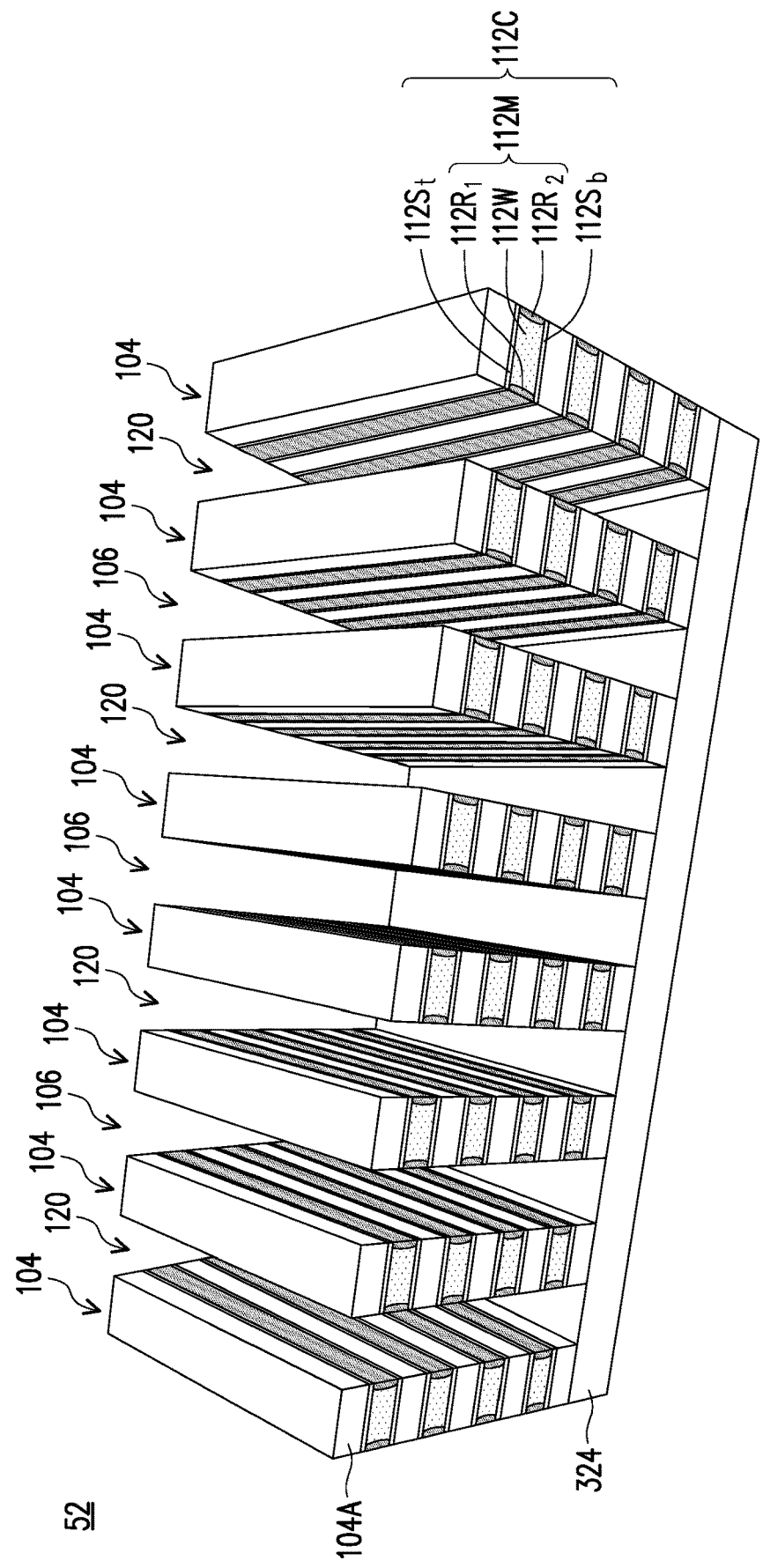
Figure 24B:
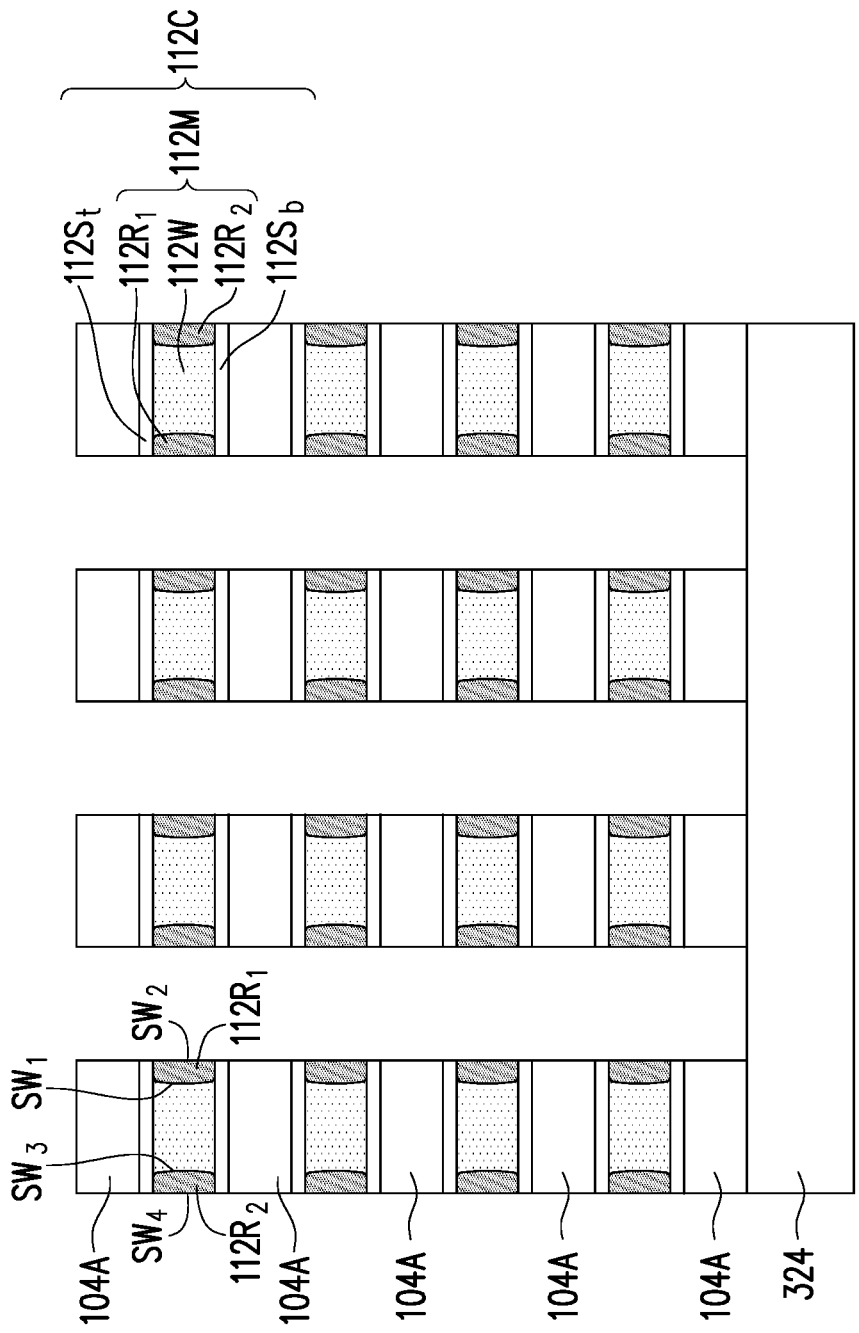
Figure 25A:
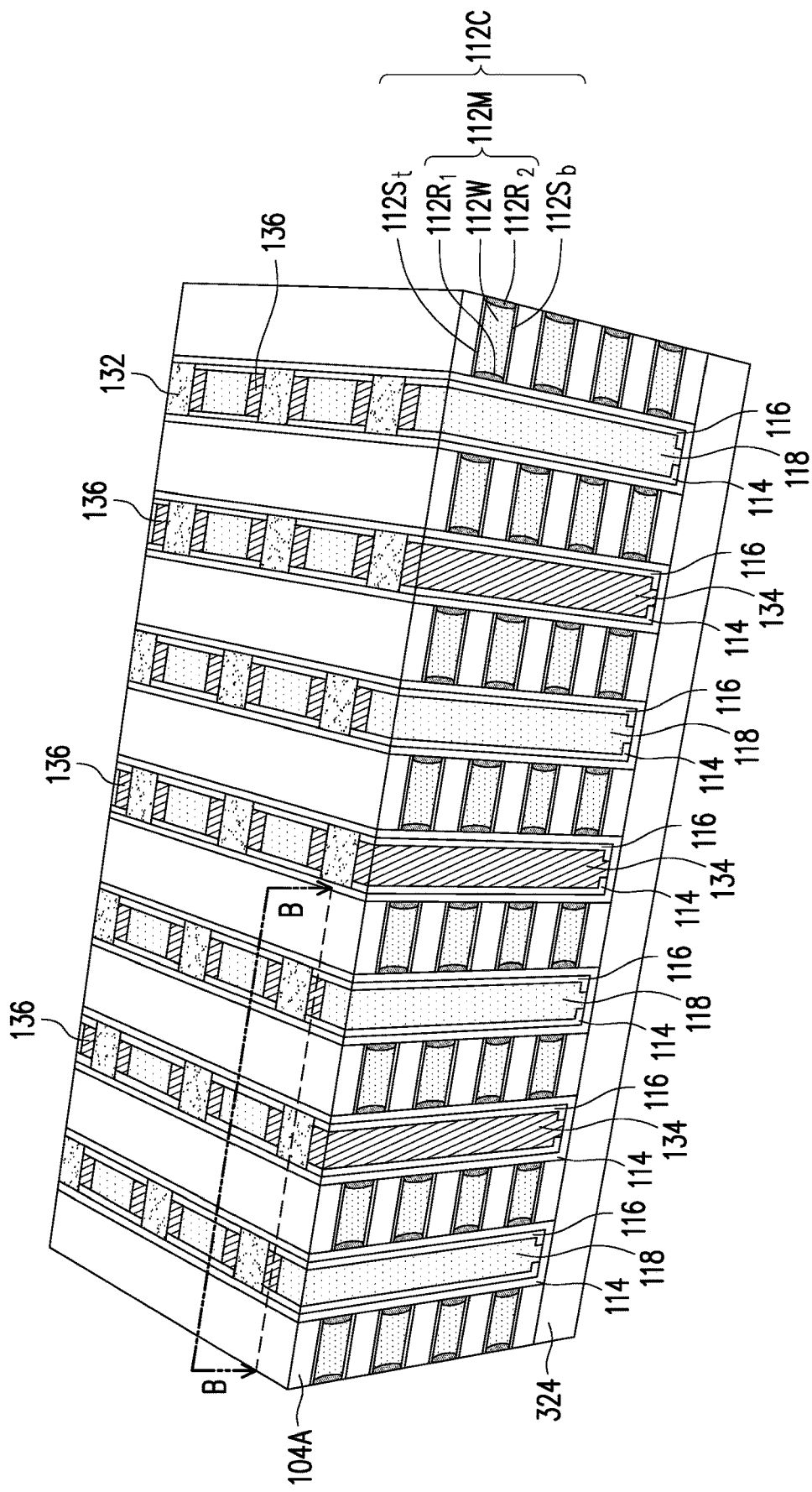
Figure 25B:
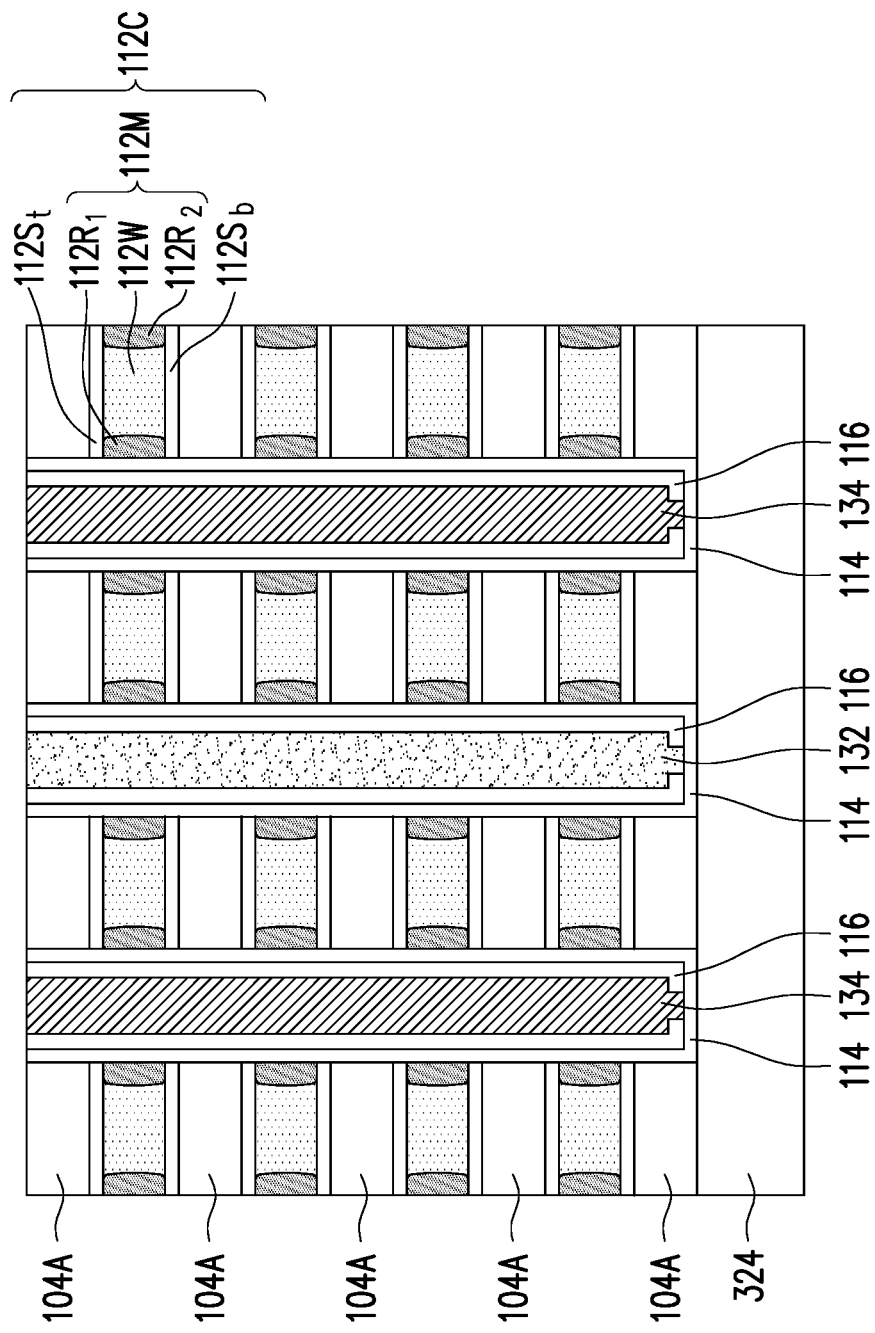

FIGS. 21A through 25B are various views of intermediate stages in the manufacturing of a memory array 52, in accordance with some other embodiments. A portion of the memory array 52 is illustrated. Some features, such as the staircase arrangement of the word lines (see FIG. 1C), are not shown for clarity of illustration. FIGS. 19A and 25A are three-dimensional views of the memory array 52. FIGS. 19B and 25B are cross-sectional views shown along reference cross-section B-B in FIG. 25A.

FIGS. 21A through 25B illustrate a process in which the first trenches 106 and the second trench 120 are patterned in the multilayer stack 104 through a single patterning process and TFTs are formed in the first trenches 106 and the second trench 120.

In FIGS. 21A-22B, the first trenches 106 and the second trench 120 are patterned in the multilayer stack 104 at the same time by a single patterning process, and the second dielectric layers 104B are replaced by conductive features 112c. The single patterning process may be performed using acceptable photolithography and etching techniques. Once the first trenches 106 and the second trench 120 are formed, the second dielectric layers 104B are removed to form lateral recesses between the first dielectric layers 104A. The lateral recesses may be formed by an acceptable etching process, such as one that is selective to the material of the second dielectric layers 104B (e.g., selectively etches the material of the second dielectric layers 104B at a faster rate than the materials of the first dielectric layers 104A and the substrate 102). The etching may be isotropic. In embodiments where the dielectric layer 324 and the first dielectric layers 104A are formed of silicon oxide, and the second dielectric layers 104B are formed of silicon nitride, the first trenches 106 are expanded by a wet etch using phosphoric acid ($H_3PO_4$). However, any suitable etching process, such as a dry selective etch, may also be utilized.

Once the second dielectric layers 104B are removed, conductive features 112c are formed in the lateral recesses formed from removing the second dielectric layers 104B. The conductive features 112c may each comprise one or more layers, such as glue layers, glue layers, barrier layers, diffusion layers, and fill layers, and the like. In some embodiments, the conductive features 112c each include a glue layer (or glue layer) $112S_t$, a glue layer (or glue layer) $112S_b$, and a first metal layer 112W, although in other embodiments the glue layers $112S_t$ and $112S_b$ may be omitted. Each glue layer $112S_t$ extends along the top surface of the material of a corresponding first metal layer 112W, and each glue layer $112S_b$ extends along the bottom surface of the material of a corresponding first metal layer 112W. The glue layers $112S_t$ and $112S_b$ are formed of a first conductive material that may be utilized to help grow or to help adhere the subsequently deposited material, such as titanium nitride, tantalum nitride, titanium, tantalum, molybdenum, ruthenium, rhodium, hafnium, iridium, niobium, rhenium, tungsten, combinations of these, nitrides of these, or the like. The first metal layer 112W may be formed of a second conductive material, such as a metal, such as tungsten, cobalt, aluminum, nickel, copper, silver, gold, molybdenum, molybdenum nitride, alloys thereof, or the like. The material of the glue layer $112S_t$ or $112S_b$ is one that has good adhesion to the material of the first dielectric layers 104A, and the material of the first metal layers 112W is one that has good adhesion to the material of the glue layer $112S_t$ or $112S_b$. In embodiments where the first dielectric layers 104A are formed of an oxide such as silicon oxide, the glue layer $112S_t$ or $112S_b$ may be formed of titanium nitride and the first metal layers 112W may be formed of tungsten. The glue layers $112S_t$ and $112S_b$ and first metal layers 112W may each be formed by an acceptable deposition process such as chemical vapor deposition (CVD), atomic layer deposition (ALD), or the like.

Once the conductive features 112c have been deposited in order to fill and/or overfill the first trenches 106 and the second trenches 120, the first conductive features 112c may be planarized to removed excess material outside of the first trenches 106 and the second trenches 120, such that after the planarizing the conductive features 112c the conductive features 112c completely span a top portion of the first trenches 106 and the second trenches 120. In an embodiment the conductive features 112c may be planarized using, e.g., a chemical mechanical planarization (CMP) process, and then an etch back process in order to remove excess portions of the conductive features 112c and to expose sidewalls of the first dielectric layers 104A. However, any suitable planarization process, such as a grinding process, may also be utilized.

Figure 23A:
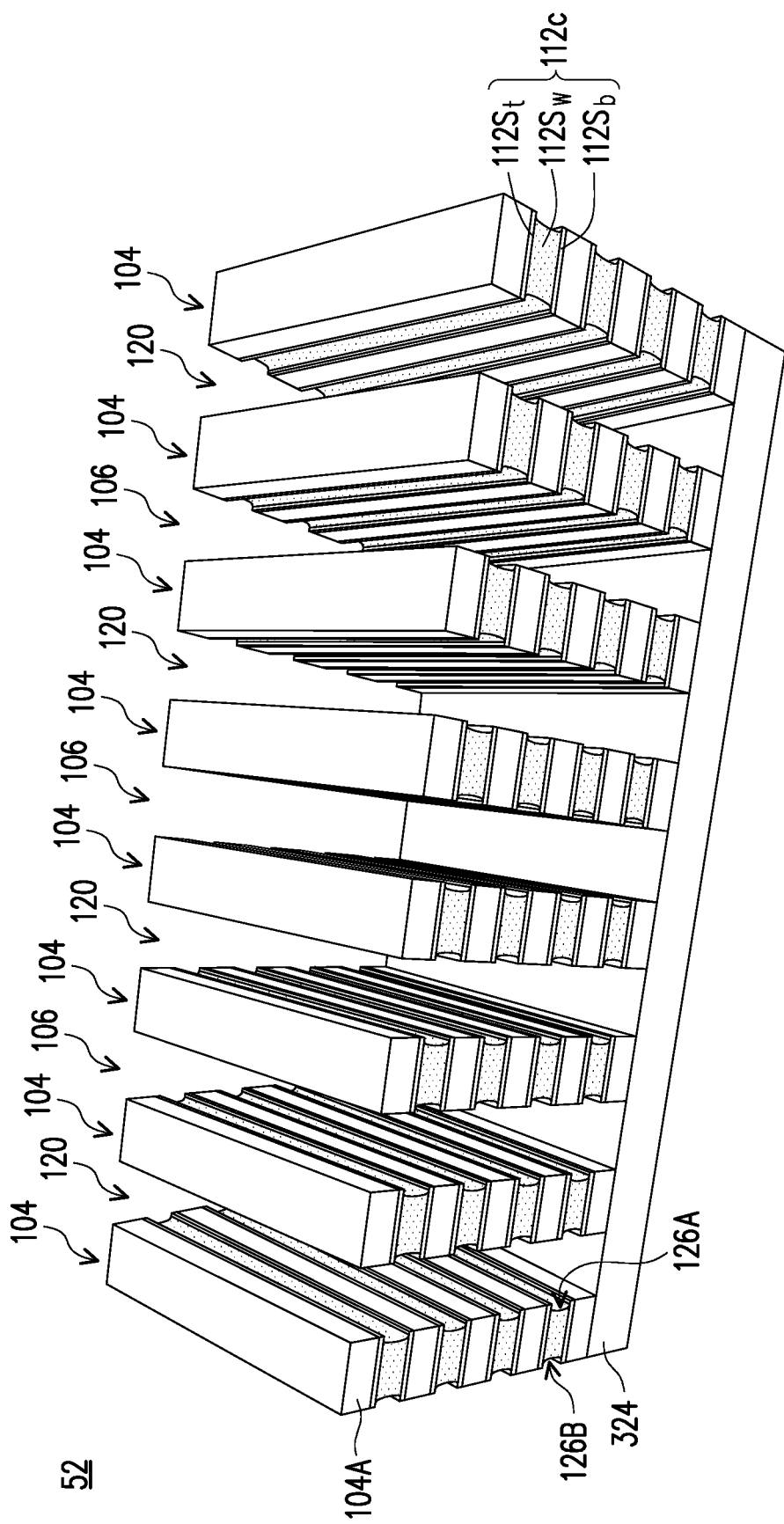
Figure 23B:
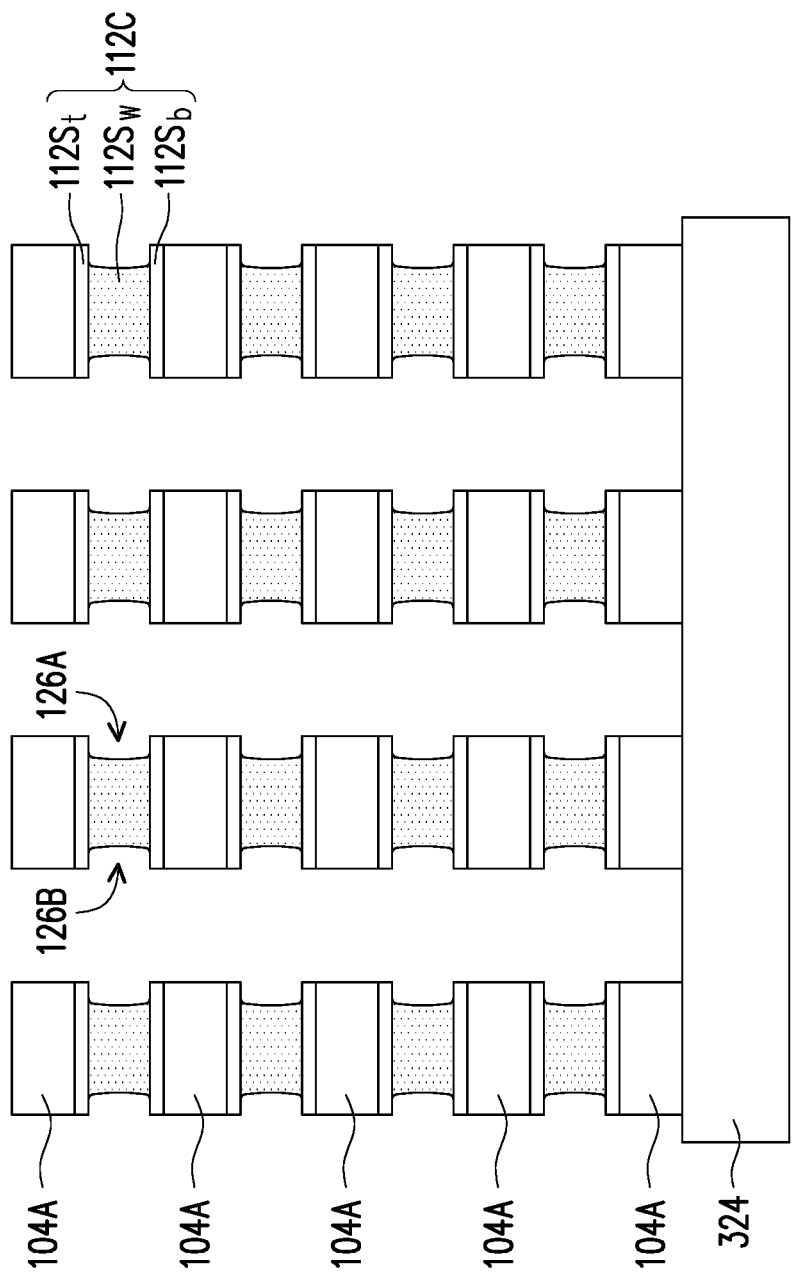

FIGS. 23A-24B illustrate end portions of the first metal layers 112W are replaced with a plurality of second metal layers first part 112R 1 and a second part $112R_2$, and TFT film stacks are formed in the first trenches 106 and the second trenches 120. In FIG. 23A-23B, end portions of the first meal layer 112WA are removed to form sidewall grooves 126A and 126B, using similar techniques as those discussed above. In FIGS. 24A-24B, second metal layers 112R 1 and $112R_2$ are formed in the sidewall grooves 126A and 126B and to fill and/or overfill the first trenches 106 and second trenches 120, thus completing a process for replacing the end portions of the first metal layer 112W. The first part 112R 1 and the second part 112R$_2$ each includes a metal that has the absolute value of the Gibbs energy of metal oxide formation lower than the absolute value of the Gibbs energy of metal oxide formation of the first metal layer 112W. In some embodiments where the first metal layer 112W formed of a metal, such as tungsten, cobalt, aluminum, nickel, copper, silver, gold, molybdenum, molybdenum nitride, alloys thereof, or the like, the first part 112R 1 and the second part 112R$_2$ each is formed of a metal, such as ruthenium. The first part 112R 1 and the second part 112R$_2$ may be formed, using similar techniques as the second metal layers 112R discussed above.

The sidewalls SW$_1$ and SW$_2$ of the first part 112R$_1$, and the sidewalls SW$_3$ and SW$_4$ of the second part 112R$_2$ may have straight shapes, concave shapes or convex shapes, or combinations thereof. In some embodiments, the sidewalls SW$_1$ of the first part 112R$_1$ and the sidewalls SW$_3$ of the second part 112R$_2$ have convex shapes, and the sidewalls SW$_2$ of first part 112R$_1$, and the sidewalls SW$_4$ of the second part 112R$_2$ have substantially straight shapes. In some embodiments, the sidewalls SW$_2$ of the first part 112R$_1$ and the sidewalls SW$_4$ of the second part 112R$_2$ are substantially flush with the sidewalls of the dielectric layer layers 104A. In alternative embodiments, the sidewalls SW$_2$ of the first part 112R$_1$ and the sidewalls SW$_4$ of the second part 112R$_2$ are concave or convex with respect to the sidewalls of the dielectric layer layers 104A.

The first metal layers 112W and the first part 112R$_1$ and the second part 112R$_2$ of the second metal layers 112R are collectively referred to as bulk layers 112M. The bulk layers 112M and the glue layers 112S$_t$ and 112S$_b$ are collectively referred to as conductive features 112C. The conductive features 112C is to serve as word lines 112.

In FIGS. 25A-25B, TFT film stacks are formed in the first trenches 106 and the second trenches 120. Specifically, two ferroelectric strips 114, a semiconductor strip 116, and a dielectric layer 118 are formed in each of the first trenches 106 and the second trenches 120, using similar techniques as those discussed above.

By utilizing the above described processes in order to form the word lines, the word lines each may be formed with a first metal layer and a second metal layer. The second metal layer is sandwich between the first metal layer and the ferroelectric material. The second metal layer has a lower absolute value of the Gibbs energy of metal oxide formation. Therefore, the second metal layer is not easily oxidized during the process of depositing the ferroelectric material. The second metal layer may reduce unwanted interfacial reaction. As a result, no dielectric interface layer is formed between the ferroelectric material and the second metal layer, so that the endurance and reliability of the memory device may be improved.

In addition, the word lines may be formed with a reduced possibility of wiggling or even collapse. In particular, by using two separate etching processes and then filling the trenches between the etching processes, the widths of the remaining structures at any point in the process remain wide enough to provide sufficient structural support to help prevent wiggling and collapse. Additionally, this reduction may be achieved with a low cost and no extra masks.

In accordance with an embodiment, a memory cell comprises a channel material contacting a source line and a bit line; a ferroelectric (FE) material contacting the channel material; and a word line, wherein the FE material is disposed between the channel material and the word line, and the word line comprises a bulk layer, and the bulk layer comprises: a first metal layer; and a second metal layer, wherein the second metal layer is sandwiched between the first metal layer and the FE material.

In accordance with another embodiment, a semiconductor device comprises a substrate; a first memory cell over the substrate and a second memory cell over the first memory cell. The first memory cell comprises a first thin film transistor. The first thin film transistor comprises: a first word line, wherein the first word line comprises a first bulk layer, and the first bulk layer comprises: a first metal layer; and a second metal layer on a sidewall of the first metal layer; and a first portion of a ferroelectric material, contacting a sidewall of the second metal layer of the first word line, wherein the first metal layer is separated from the first portion of FE material by the second metal layer; and a first portion of channel material on sidewalls of the first portion the ferroelectric material, a source line and a bit line, wherein the FE material is disposed between the channel material and the second metal layer of the word line.

In accordance with yet another embodiments, a method of manufacturing a semiconductor device comprises: providing a first multilayer stack, the first multilayer stack comprising alternating dielectric layers and conductive layers, and the first multilayer stack has a first trench and a second trench therein; removing portions of the conductive layers and thereby forming sidewall recesses at ends of the conductive layers; and forming anti-oxidation layers in the sidewall grooves, wherein the anti-oxidation layers and the conductive layers form a plurality of word lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a memory cell, the method comprising:
   forming a channel material contacting a source line and a bit line;
   forming a ferroelectric (FE) material contacting the channel material; and
   forming a word line, wherein the FE material is disposed between the channel material and the word line, and the word line comprises a bulk layer, and the bulk layer comprises:
   a first metal layer; and
   a second metal layer, wherein the second metal layer is sandwiched between the first metal layer and the FE material.

2. The method of claim 1, wherein the second metal layer has an absolute value of the Gibbs energy of metal oxide formation lower than an absolute value of the Gibbs energy of metal oxide formation of the first metal layer.

3. The method of claim 1, wherein the first metal layer has a resistance value lower than a resistance value of the second metal layer.

4. The method of claim 1, wherein the second metal layer has a width is equal to or less than a width of the first metal layer.

5. The method of claim 1, wherein the second metal layer comprises:
   a first part on a first sidewall of the first metal layer, wherein the first metal layer is separated from FE material by the first part; and
   a second part on a second sidewall of the first metal layer.

6. The method of claim 5, wherein the word line further comprises:
   a first glue layer on a top surface of the first metal layer and top surfaces of the first part and second part of the second metal layer; and
   a second glue layer on a bottom surface of the first metal layer and bottoms of the first part and second part of the second metal layer.

7. The method of claim 1, wherein the word line comprises: a first conductive feature and a second conductive feature, wherein the first conductive feature and the second conductive feature each comprises the bulk layer, and the bulk layer comprises the first metal layer and the second metal layer.

8. The method of claim 7, wherein the first conductive feature and the second conductive feature each further comprises a glue layer on top and bottom surfaces of the first metal layer, on top and bottom surfaces of the second metal layer, and a sidewall the first metal layer which is away from the second metal layer.

9. A method of manufacturing a semiconductor device, the method comprising:
   providing a substrate;
   forming a first memory cell over the substrate, the forming the first memory cell comprising forming a first thin film transistor, wherein the forming the first thin film transistor comprises:
      forming a first word line, wherein the first word line comprises a first bulk layer, and the first bulk layer comprises:
         a first metal layer; and
         a second metal layer on a sidewall of the first metal layer; and
      forming a ferroelectric (FE) material, wherein a first portion of the ferroelectric (FE) material contacts a sidewall of the second metal layer of the first word line, and the first metal layer is separated from the first portion of FE material by the second metal layer; and
      forming a channel material, wherein a first portion of the channel material is disposed on sidewalls of the first portion the ferroelectric material, a source line and a bit line, wherein the FE material is disposed between the channel material and the second metal layer of the word line; and
   forming a second memory cell over the first memory cell.

10. The method of claim 9, wherein the first metal layer comprises tungsten, cobalt, aluminum, nickel, copper, silver, gold, molybdenum, molybdenum nitride, or alloys thereof, and the second metal layer comprises ruthenium.

11. The method of claim 9, wherein the second metal layer has a width equal to or less than a width of the first metal layer.

12. The method of claim 11, wherein a ratio of the width of the second metal layer to the width of the first metal layer is in the range of 0.1 to 1.0.

13. The method of claim 9, wherein no dielectric interface layer is formed between first portion of the ferroelectric material and the second metal layer.

14. The method of claim 9, wherein the forming the second memory cell comprises forming a second thin film transistor, and the second thin film transistor comprises:
   a second word line separating from the first word line by a dielectric layer;
   a second portion of the ferroelectric material contacting the second word line; and
   a second portion of channel material contacting the second portion the ferroelectric material, the source line and the bit line, wherein the second word line comprises a second bulk layer, and the second bulk layer and the first bulk layer have same materials.

15. A method of manufacturing a semiconductor device, the method comprising:
   providing a first multilayer stack, the first multilayer stack comprising alternating dielectric layers and conductive layers, and the first multilayer stack has a first trench and a second trench therein;
   removing portions of the conductive layers and thereby forming sidewall grooves at ends of the conductive layers; and
   forming anti-oxidation layers in the sidewall grooves, wherein the anti-oxidation layers and the conductive layers form a plurality of word lines.

16. The method of claim 15, wherein the anti-oxidation layers comprise ruthenium, and the conductive layers comprise tungsten, cobalt, aluminum, nickel, copper, silver, gold, molybdenum, molybdenum nitride, or alloys thereof, and the second metal layer.

17. The method of claim 15, wherein the providing the first multilayer stack comprises:
   providing a second multilayer stack, the second multilayer stack comprising alternating the dielectric layers and sacrificial layers;
   patterning the second multilayer stack to form the first trench;
   removing first portions of the sacrificial layers exposed by the first trench to form first sidewall recesses;
   forming first conductive features in the first trench and the first sidewall recesses;
   patterning the second multilayer stack to form the second trench;
   removing second portions of the sacrificial layers exposed by the second trench to form second sidewall recesses;
   forming second conductive features in the second trench and the second sidewall recesses; and
   removing the first conductive features in the first trench and the second conductive features in the second trench.

18. The method of claim 15, wherein the providing the first multilayer stack comprises:
   providing a second multilayer stack, the second multilayer stack comprising alternating the dielectric layers and sacrificial layers;
   patterning the second multilayer stack to form the first trench and a second trench at a same time;
   removing the sacrificial layers exposed by the first trench and the second trench to form sidewall recesses;
   forming conductive features in the first trench, the second trench, and the sidewall recesses; and
   removing the conductive features in the first trench and the second trench.

19. The method of claim 15, further comprising:

forming ferroelectric strips in the first trench and the second trench, wherein the ferroelectric strips are in contact with the anti-oxidation layers;

forming channel strips contacting the ferroelectric strips; and forming source lines and bit lines contacting the channel strips.

20. The method of claim 15, further comprising:

filling the first trench and the second trench with insulating layers;

forming openings in the insulating layers;

forming ferroelectric strips on sidewalls of the openings in the insulating layers;

forming channel strips contacting the ferroelectric strips; and forming source lines and bit lines contacting the channel strips.

* * * * *